United States Patent
Hironaka et al.

(10) Patent No.: US 6,544,857 B1
(45) Date of Patent: Apr. 8, 2003

(54) DIELECTRIC CAPACITOR MANUFACTURING METHOD AND SEMICONDUCTOR STORAGE DEVICE MANUFACTURING METHOD

(75) Inventors: Katsuyuki Hironaka, Kanagawa (JP); Masataka Sugiyama, Kanagawa (JP); Chiharu Isobe, Tokyo (JP); Takaaki Ami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/262,329

(22) Filed: Mar. 4, 1999

(30) Foreign Application Priority Data

Feb. 12, 1999 (JP) .......................................... 11-034815

(51) Int. Cl.[7] .......................... H01L 21/20; H01G 4/06; H01H 47/00; G11C 11/22; G11C 11/24
(52) U.S. Cl. ..................... 438/396; 438/397; 365/145; 365/149; 361/321.4
(58) Field of Search ................. 438/396, 397, 438/238, 239, 253; 361/321.4; 365/145, 149

(56) References Cited

U.S. PATENT DOCUMENTS

| 5,508,953 A | * | 4/1996 | Fukuda et al. | 365/145 |
| 5,519,566 A | * | 5/1996 | Perino et al. | 361/321.4 |
| 5,548,475 A | * | 8/1996 | Ushikubo et al. | 361/321.4 |
| 5,617,290 A | * | 4/1997 | Kulwicki et al. | 361/321.4 |
| 5,793,600 A | * | 8/1998 | Fukuda et al. | 361/321.4 |
| 5,831,299 A | * | 11/1998 | Yokoyama et al. | 257/295 |
| 5,907,470 A | * | 5/1999 | Kita et al. | 361/311 |
| 5,970,337 A | * | 10/1999 | Nishioka | 438/240 |
| 5,978,207 A | * | 11/1999 | Anderson et al. | 361/311 |
| 6,033,920 A | * | 3/2000 | Shimada et al. | 438/3 |
| 6,072,689 A | * | 6/2000 | Kirlin | 361/311 |
| 6,096,434 A | * | 8/2000 | Yano et al. | 428/446 |
| 6,255,122 B1 | * | 7/2001 | Duncombe et al. | 438/3 |

* cited by examiner

Primary Examiner—Olik Chaudhuri
Assistant Examiner—Shirinivas H. Rao
(74) Attorney, Agent, or Firm—Sonnenschein, Nath & Rosenthal

(57) ABSTRACT

In a process for manufacturing a dielectric capacitor, an $IrO_2$ film, an Ir film, an amorphous film, and a Pt film-are sequentially made on a Si substrate. The SBT film may comprise $Bi_xSr_yTa_{2.0}O_z$, where the atomic composition ratio maybe within the range of $0 \leq Sr/Ti \leq 1.0$, $0 \leq Ba/Ti \leq 1.0$. The Pt film, the amorphous film, the Ir film, and the $IrO_2$ film formed into a dielectric capacitor and the amorphous film is annealed to change its amorphous phase to a crystal phase of a perovskite type crystalline structure and thereby obtain the SBT film. The process may include a lower electrode made from an organic metal source material selected from a group consisting of $Bi(C_6H_5)_3$, $Bi(o-C_7H_7)_3$, $Bi(O-C_2H_5)_3$, $Bi(O-iC_3H_7)_3$, $Bi(O-tC_4H_9)_3$, $Bi(O-tC_5H_{11})_3$, $Sr(THD)_2$, $Sr(THD)_2$ tetraglyme, $Sr(Me_5C_5)_2 \cdot 2THF$, $Ti(i-OC_3H_7)_4$, $TiO(THD)_2$, $Ti(THD)_2(i-OC_3H_7)_2$, $Ta(i-OC_3H_7)_5$, $Ta(iOC_3H_7)_4THD$, $Nb(i-OC_3H_7)_5$, $Nb(i-OC_3H_7)_4THD$.

30 Claims, 29 Drawing Sheets

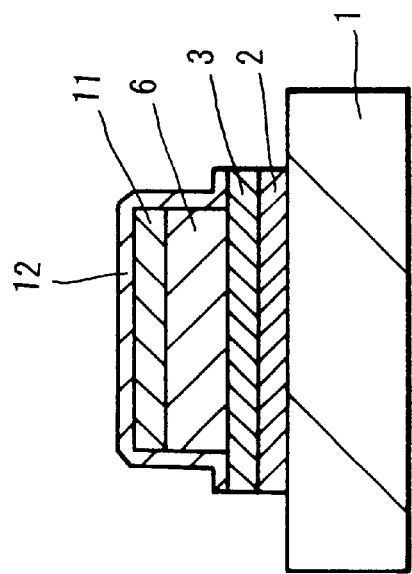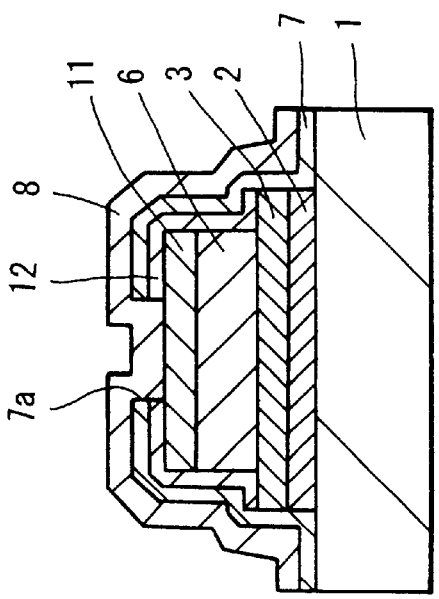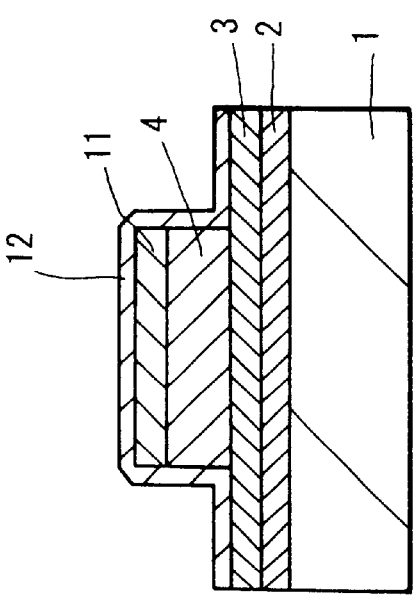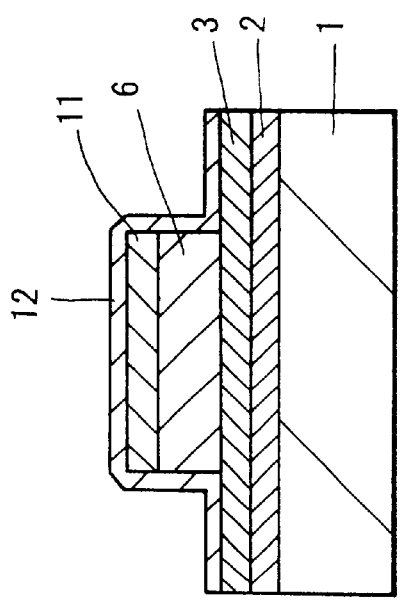

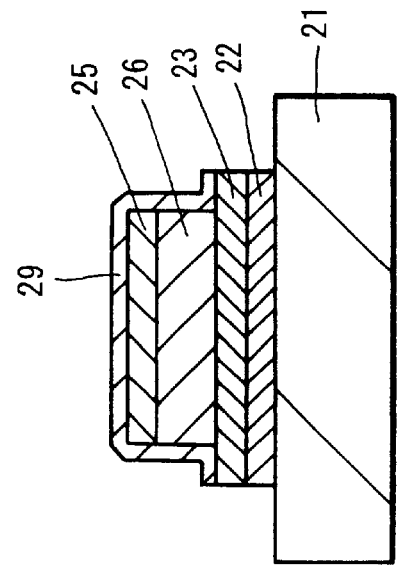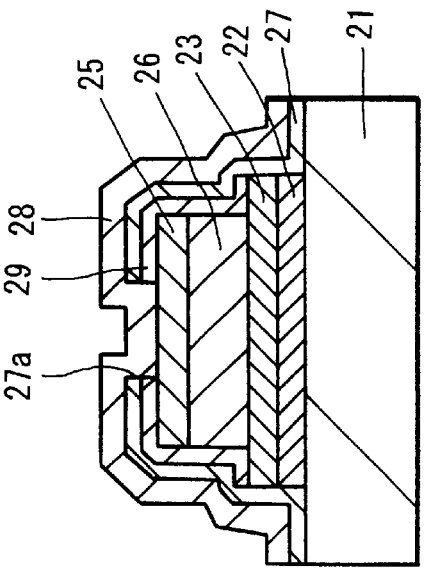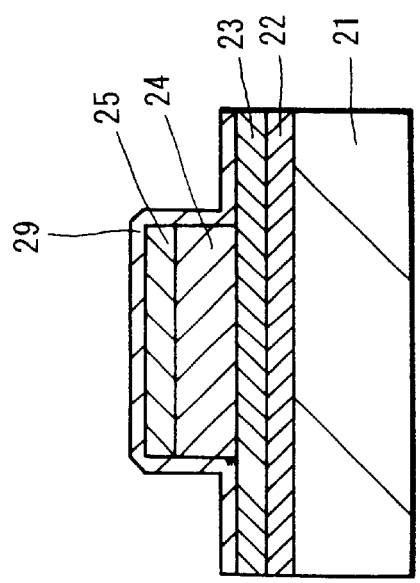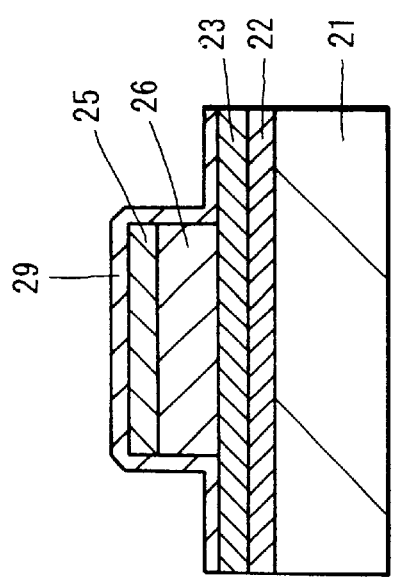

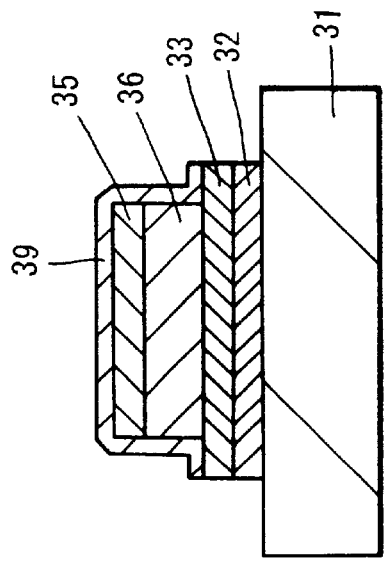
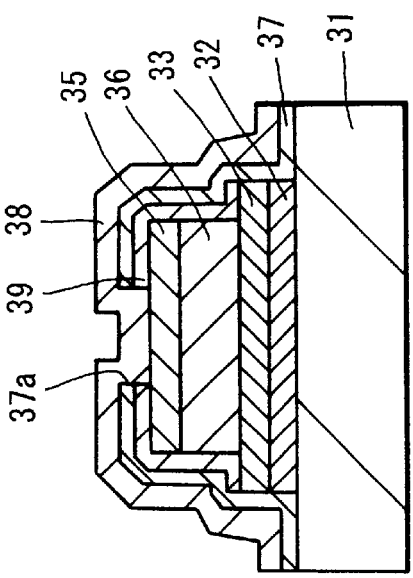
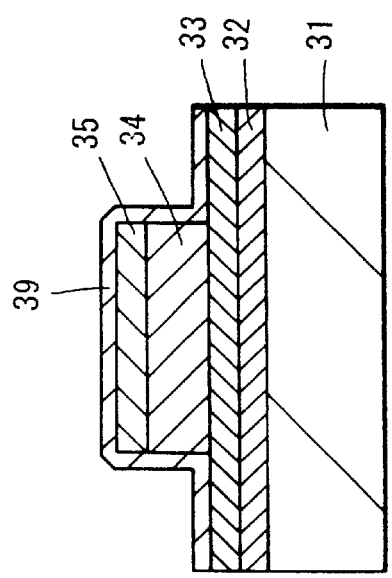
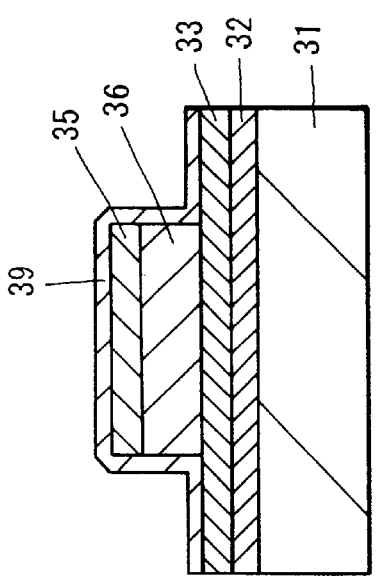

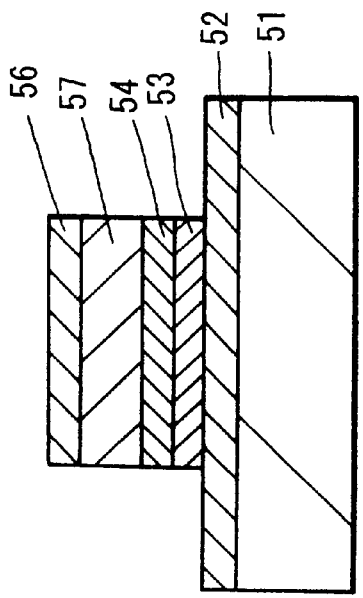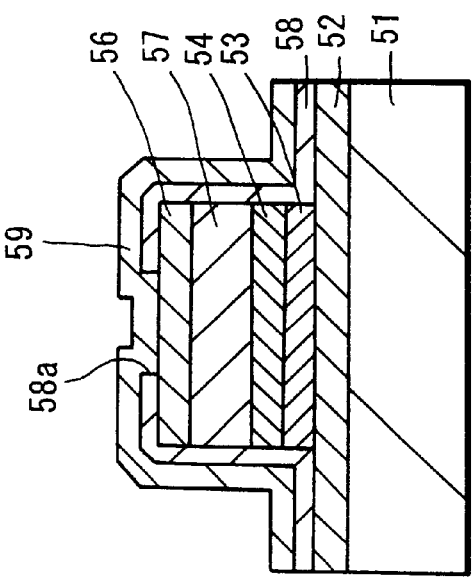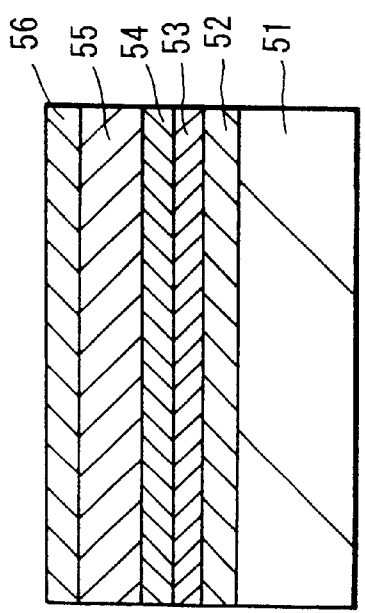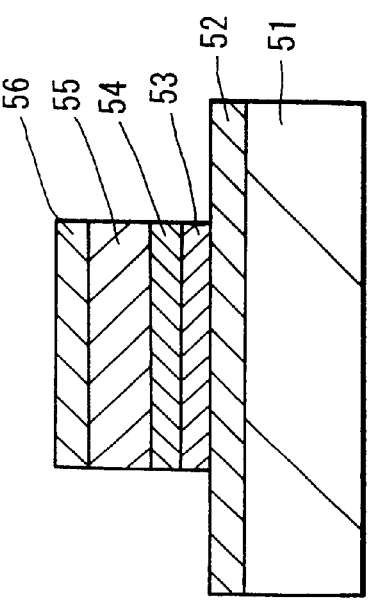

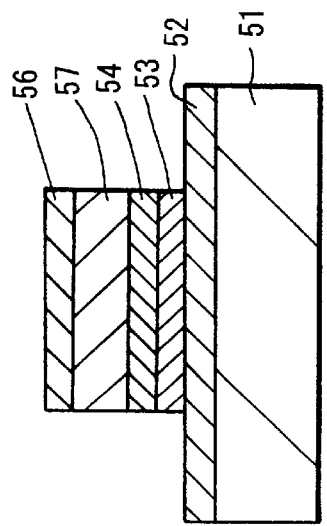
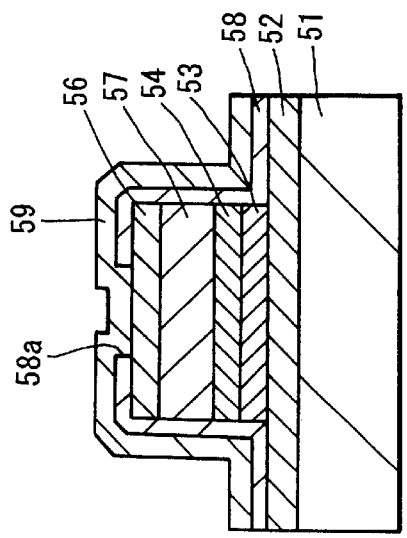
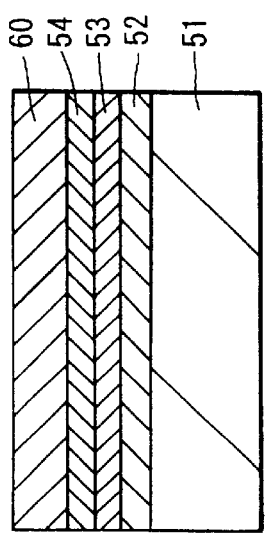
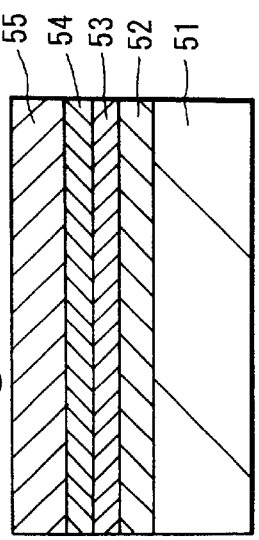
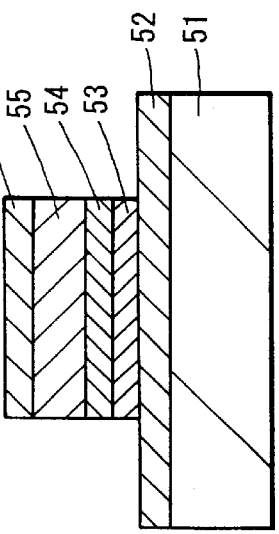

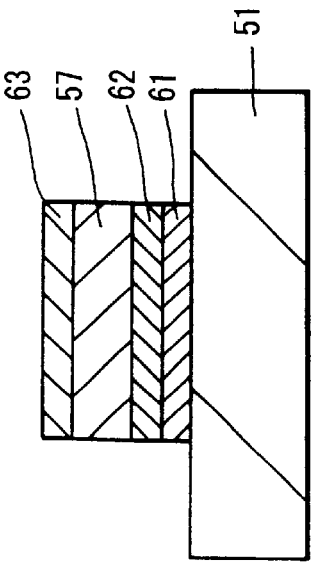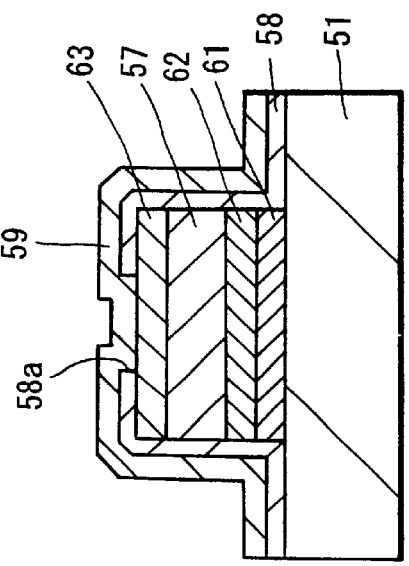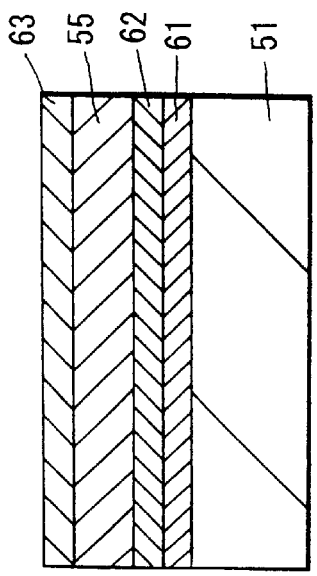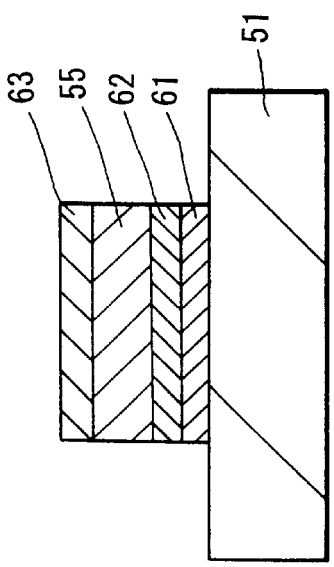

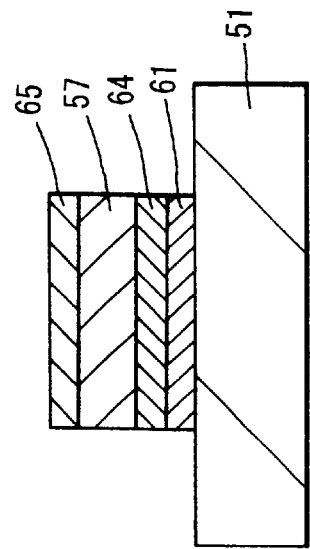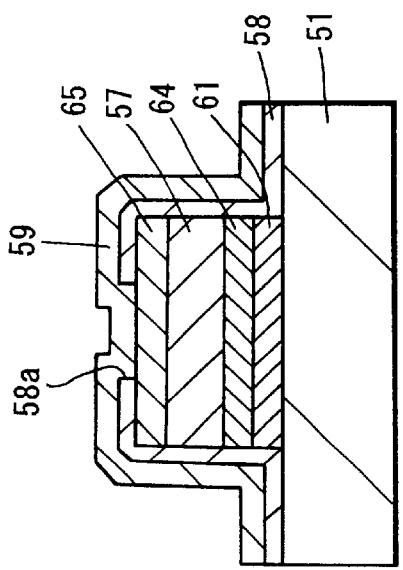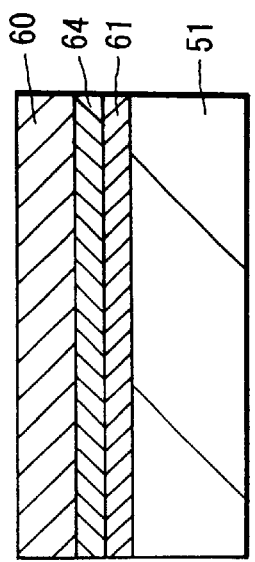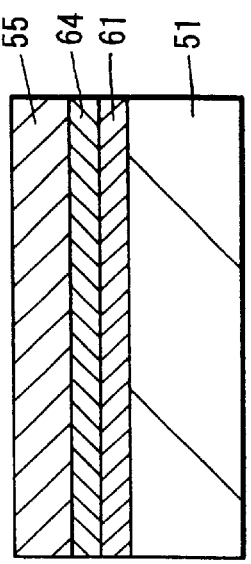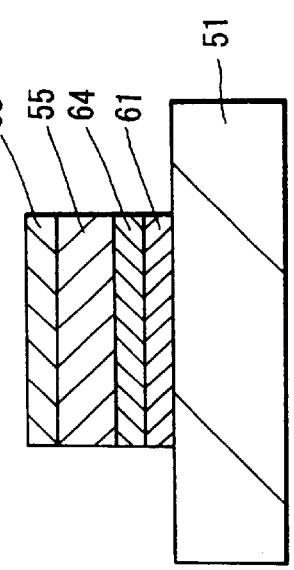

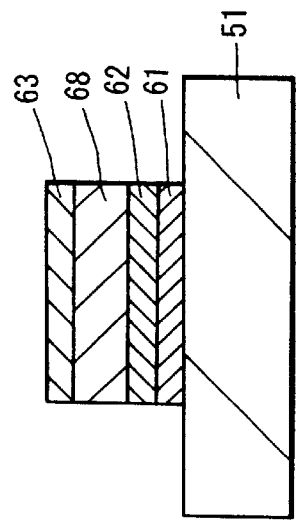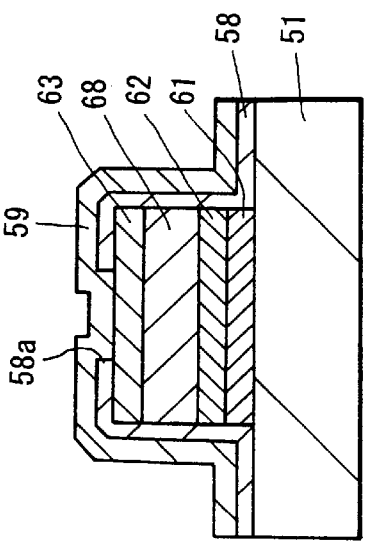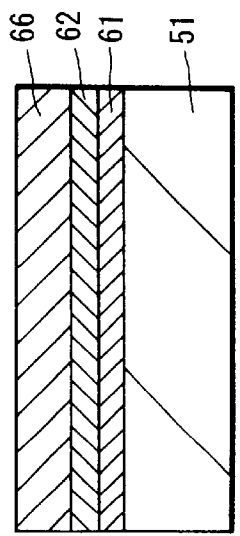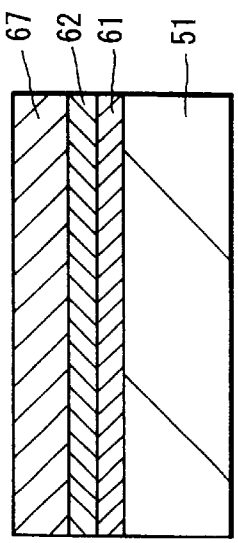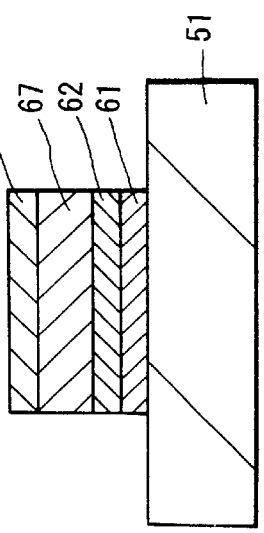

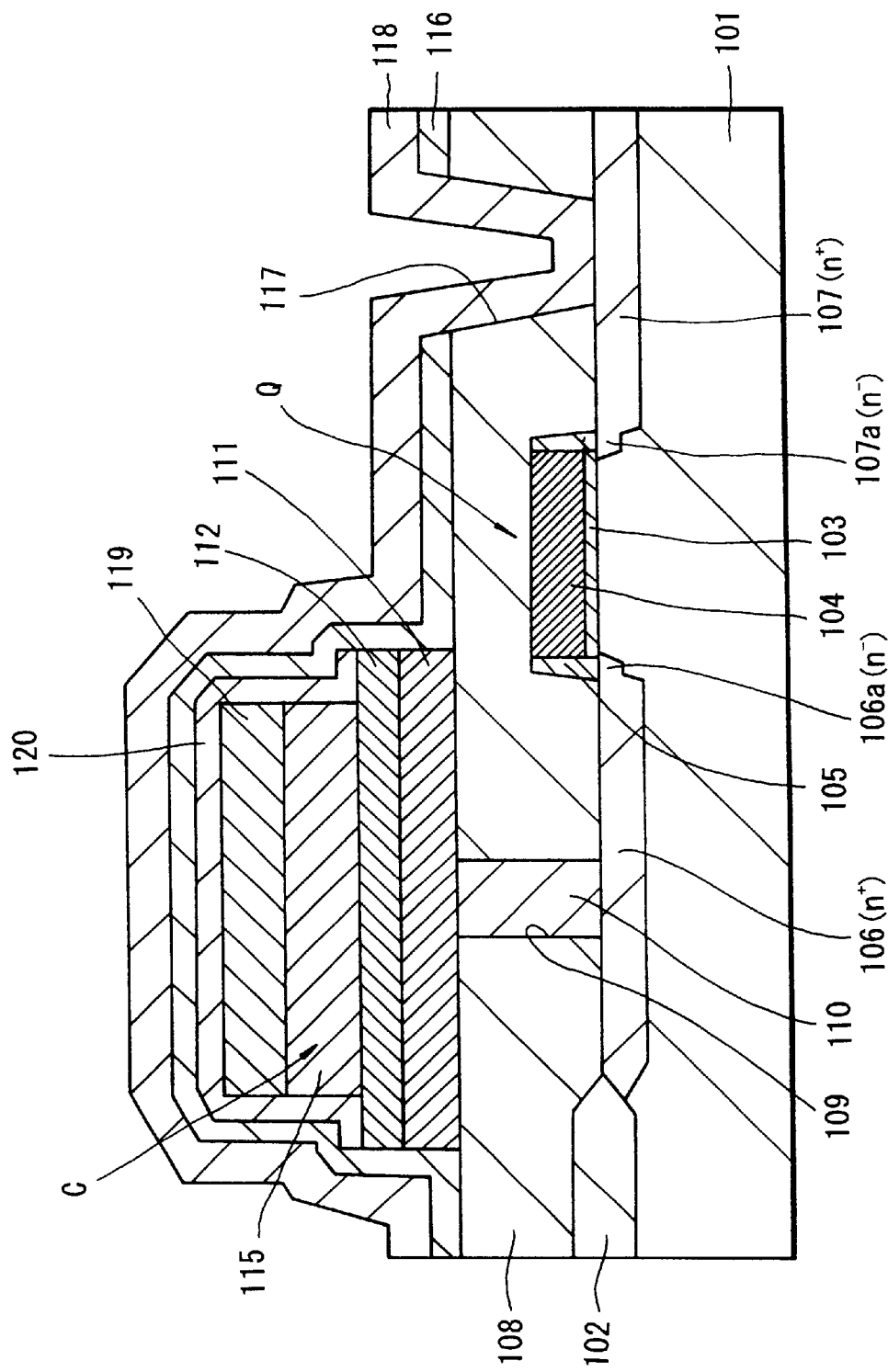

US 6,544,857 B1

DIELECTRIC CAPACITOR MANUFACTURING METHOD AND SEMICONDUCTOR STORAGE DEVICE MANUFACTURING METHOD

RELATED APPLICATION DATA

The present application claims priority to Japanese Application No. P11-034815 filed Feb. 12, 1999 which application is incorporated herein by reference to the extent permitted by law.

BACKGROUND OF THE INVENTION

1. Field of the Invention

This invention relates to a dielectric capacitor manufacturing method and a semiconductor storage device manufacturing method especially suitable for use in fabrication of a dielectric capacitor using a dielectric film made of a dielectric material with a perovskite type crystal structure and fabrication of a semiconductor storage device having such a dielectric capacitor.

2. Description of the Related Art

Recently, the area of a memory cell was rapidly reduced along with an increase in storage capacitance of semiconductor storage devices. Concurrently, in a capacitor forming a memory cell, efforts are made to ensure a required charge capacitance by employing a three-dimensional complex structure. Under these circumstances, in the attempt of improving the production yield and reducing the steps of the manufacturing process by simplification of the construction, researches are made toward employment of a dielectric capacitor simplified in construction by using a dielectric film with a high dielectric constant. Known as a dielectric film with a high capacitor is one having a perovskite type crystalline structure and made of a polycrystalline oxide with a grain size of 20 to 300 nm, approximately.

A conventional technique for making a dielectric capacitor using a dielectric film made of a dielectric material with a perovskite type crystalline structure was configured to first make a dielectric film on a lower electrode in form of a film on a substrate, then anneal the dielectric film to crystallize it, further make an upper electrode on the crystallized dielectric film, and pattern the upper electrode, dielectric film and lower electrode into the form of a dielectric capacitor by etching, using reactive ion etching (RIE) or ion milling.

However, in the case where a dielectric capacitor using a dielectric film made of a dielectric material with a perovskite type crystalline structure was made by the conventional technique, there was the problem that the characteristics of the dielectric capacitor after treatment deteriorated significantly due to etching of a certain element or shortage of oxygen along the treated surface of the dielectric film during etching by RIE or ion milling. Especially when the area of the dielectric capacitor was reduced below 10 $\mu m^2$, particularly, several $\mu m^2$, along with large-scaling of semiconductor memory, there was a tendency toward an increase of the area occupied by individual crystal grains in the dielectric film relative to the entire area of the capacitor, hence a relative increase of influences from damages of individual crystal grains belonging to side wall portions of the capacitor during etching process, an increase of deterioration of characteristics of the dielectric capacitor.

Moreover, in the case where a dielectric capacitor using a dielectric film made of a dielectric material with a perovskite type crystalline structure was made by the conventional technique, there was a tendency toward an increase of the leak current of the dielectric capacitor due to deposition of a certain metal or generation of a conductive oxide on side walls of the dielectric capacitor during the etching process or the subsequent annealing process especially in large-capacity semiconductor memory in which the area of the dielectric capacitor is reduced below 10 $\mu m^2$, particularly, several $\mu m^2$, and it was a serious reason adversely affecting the reliability.

OBJECTS AND SUMMARY OF THE INVENTION

It is therefore an object of the invention to provide a dielectric capacitor manufacturing method and a semiconductor storage device manufacturing method capable of realizing a dielectric capacitor exhibiting good characteristics even when the area of dielectric capacitor is reduced upon manufacturing the dielectric capacitor using a dielectric film with a perovskite type crystalline structure and a semiconductor storage device including the dielectric capacitor.

Another object of the invention is to provide a dielectric capacitor manufacturing method and a semiconductor storage device manufacturing method capable of realizing a dielectric capacitor having exhibiting good characteristics and improving the reliability even when the area of the dielectric capacitor is reduced upon manufacturing the dielectric capacitor using a dielectric film with a perovskite type crystalline structure and a semiconductor storage device including the dielectric capacitor.

According to the first aspect of the invention, there is provided a method for manufacturing a dielectric capacitor using a dielectric film made of a dielectric material with a perovskite type crystalline structure, comprising the steps of:

making a lower electrode;

making on the lower electrode a precursor film having as its major component an amorphous phase or a fluorite phase of components elements of the dielectric material;

making an upper electrode on the precursor patterning at least the upper electrode and the precursor film into the form of the dielectric capacitor by etching; and annealing the precursor film patterned into the form of the dielectric capacitor to change the amorphous phase or the fluorite phase to a crystal phase of a perovskite type crystalline structure and obtain the dielectric film.

According to the second aspect of the invention, there is provided a method for manufacturing a dielectric capacitor using a dielectric film made of a dielectric material with a perovskite type crystalline structure, comprising the steps of:

making a lower electrode;

making on the lower electrode a precursor film having as its major component an amorphous phase or a fluorite phase of components elements of the dielectric material;

making an upper electrode on the precursor film;

patterning the upper electrode and the precursor film into the form of the dielectric capacitor by etching;

making a protective coat which covers side walls of the upper electrode and the precursor film patterned into the form of the dielectric capacitor; and annealing the precursor film patterned into the form of the dielectric capacitor and having the protective coat on the side walls to change the amorphous phase or the fluorite phase to a crystal phase of a perovskite type crystalline structure and obtain the dielectric film.

According to the third aspect of the invention, there is provided a method for manufacturing a semiconductor storage device having a dielectric capacitor using a dielectric film made of a dielectric material with a perovskite type crystalline structure, comprising the steps of:

making a lower electrode of the dielectric capacitor;

making on the lower electrode a precursor film having as its major component an amorphous phase or a fluorite phase of components elements of the dielectric material;

making an upper electrode on the precursor film;

patterning at least the upper electrode and the precursor film into the form of the dielectric capacitor by etching; and annealing the precursor film patterned into the form of the dielectric capacitor to change the amorphous phase or the fluorite phase to a crystal phase of a perovskite type crystalline structure and obtain the dielectric film.

According to the fourth aspect of the invention, there is provided a method for manufacturing a semiconductor storage device having a dielectric capacitor using a dielectric film made of a dielectric material with a perovskite type crystalline structure, comprising the steps of:

making a lower electrode of the dielectric capacitor;

making on the lower electrode a precursor film having as its major component an amorphous phase or a fluorite phase of components elements of the dielectric material;

making an upper electrode on the precursor film;

patterning the upper electrode and the precursor film into the form of the dielectric capacitor by etching;

making a protective coat which covers side walls of the upper electrode and the precursor film patterned into the form of the dielectric capacitor; and annealing the precursor film patterned into the form of the dielectric capacitor and having the protective coat on the side walls to change the amorphous phase or the fluorite phase to a crystal phase of a perovskite type crystalline structure and obtain the dielectric film.

In the present invention, typically used as the precursor film is a film having as its major component an amorphous phase or a fluorite phase of Bi, Sr, Ta, Nb and O (its atomic composition ratio being in the range of $2.0 \leq 2Bi/(Ta+Nb) \leq 2.6$ and $0.6 \leq 2Sr/(Ta+Nb) \leq 1.2$). In this case, by annealing the precursor film, there is obtained a dielectric film (SBT film) of a ferroelectric material with a Bi layered structured perovskite type crystalline structure having the composition formula $Bi_xSr_y(Ta_zNb_{1-z})_{2.0}O_w$ (where $2.0 \leq x \leq 2.6$, $0.6 \leq y \leq 1.2$, $0 \leq z \leq 1.0$, $w=9 \pm d$, $0 \leq d \leq 1.0$). Alternatively, the precursor film of SBT may be made by first making on the lower electrode a film having as its major component an amorphous phase of Bi, Sr, Ta, Nb and O (its atomic composition ratio being in the range of $2.0 \leq 2Bi/(Ta+Nb) \leq 2.6$ and $0.6 \leq 2Sr/(Ta+Nb) \leq 1.2$), and then annealing it to change the amorphous phase to a fluorite phase. In this case, annealing is preferably conducted prior to making the upper electrode.

In the present invention, also usable as the precursor film is a film having as its major component an amorphous phase or a fluorite phase of Bi, Sr, Ta, Nb, Ti and O (its atomic composition ratio being in the range of $0.6 \leq 2Sr/(Ta+Nb) \leq 1.2$, $1.7 \leq 2Bi/(Ta+Nb) \leq 2.5$, and $0 < 2Ti/(Ta+Nb) \leq 1.0$).

The atomic composition ratio of the precursor film having as its major component the amorphous phase of the fluorite phase of Bi, Sr, Ta, Nb, Ti and O is preferably in the range of $0.7 \leq 2Sr/(Ta+Nb) \leq 1.0$, $2.0 \leq 2Bi/(Ta+Nb) \leq 2.4$, and $0.01 \leq 2Ti/(Ta+Nb) \leq 1.0$)

As to $2Ti/(Ta+Nb)$, it more preferably satisfies $0.1 \leq 2Ti/(Ta+Nb) \leq 1.0$. In this case, by annealing the precursor film, there is obtained a dielectric film (SBTT film) of a ferroelectric material with a Bi layered structured perovskite type crystalline structure having the composition formula $Sr_xBi_y(Ta, Nb)_{2.0}Ti_zO_w$ (where $0.6 \leq x \leq 1.2$, $1.7 \leq y \leq 2.5$, $0 < z \leq 1.0$, $w=9 \div d$, $0 \leq d \leq 1.0$, preferably $0.7 \leq x \leq 1.0$, $2.0 \leq y \leq 2.4$, $0.01 \leq z \leq 1.0$, $w=9 \pm d$, $0 \leq d \leq 1.0$, more preferably $0.7 \leq x \leq 1.0$, $2.0 \leq y \leq 2.4$, $0.1 \leq z \leq 1.0$, $w=9 \pm d$, $0 \leq d \leq 1.0$). Alternatively, the precursor film of SBTT may be made by first making on the lower electrode a film having as its major component an amorphous phase of Bi, Sr, Ta, Nb, Ti and O (in which the atomic composition ratio on the lower electrode (its atomic composition ratio being in the range of $0.6 \leq 2Sr/(Ta+Nb) \leq 1.2$, $1.7 \leq 2Bi/(Ta+Nb) \leq 2.5$, and $0 \leq 2Ti/(Ta+Nb) \leq 1.0$), and then annealing it to change the amorphous phase to a fluorite phase. In this case, annealing is preferably conducted prior to making the upper electrode.

In the present invention, also usable as the precursor film is a film having as its major component an amorphous phase of Pb, Zr, Ti and O (its atomic composition ratio being in the range of $0.1 \leq Zr/Pb \leq 0.6$ and $0.4 \leq Ti/Pb \leq 0.9$) or a film containing as its major component an amorphous phase of Pb, Zr, Ti, Nb and O (its atomic composition ratio being in the range of $0.1 \leq Zr/Pb \leq 0.6$, $0.4 \leq Ti/Pb \leq 0.9$ and $0.03 \leq Nb/Pb \leq 0.30$). In the former case, by annealing the precursor film, there is obtained a dielectric film (PZT) film of a ferroelectric material having a perovskite type crystalline structure expressed by the composition formula $Pb_{1.0}(Zr_xTi_{1-x})_{1.0}O_3$ (where $0.1 \leq x \leq 0.6$). In the latter case, by annealing the precursor film, there is obtained a dielectric film (PNZT film) of a ferroelectric film having a perovskite type crystalline structure expressed by the composition formula $Pb_{1.0-y}Nb_y(Zr_xTi_{1-x})_{1.0}O_3$ (where $0.1 \leq x \leq 0.6$, $0.03 \leq y \leq 0.30$).

Ferroelectric materials indicated above are suitable for use as the material of a ferroelectric film of ferroelectric memory.

In the present invention, also usable as the precursor film is a film having as its major component an amorphous phase of Ba, Sr, Ti and O (its atomic composition ratio being in the range of $0 \leq Sr/Ti \leq 1.0$ and $0 \leq Ba/Ti \leq 1.0$). In this case, by annealing the precursor film, there is obtained a dielectric film (BST film) of a high-dielectric material expressed by the composition formula $(Ba_xSr_{1-x})_{1.0}Ti_{1.0}O_3$ (where $0 \leq x \leq 1.0$). The high-dielectric material is suitable for use as the material of a dielectric film of a capacitor in DRAM, for example.

In the present invention, the precursor film is made by, for example, chemical vapor deposition, such as metal organic chemical vapor deposition, or spin-coating.

In the present invention, if the finally obtained dielectric film is a SBTT film, the precursor film is preferably made by forming a film having as its major component a fluorite phase by metal organic chemical vapor deposition or other chemical vapor deposition. In this case, the film having the fluorite phase as its major component is made under a growth temperature (substrate temperature) between 400° C. and 650° C., for example, under a reaction gas pressure of 1 to 10 Torr, for example. Used as the reaction gas is a mixed gas made by mixing an oxidizable gas with a mixed gas containing predetermined composition ratios of, for example, at least one organic metal source material selected from a first group consisting of $Bi(C_6H_5)_3$, $Bi(o-C_7H_7)_3$, $Bi(O-C_2H_5)_3$, $Bi(O-iC_3H_7)_3$, $Bi(O-tC_4H_9)_3$ and $Bi(O-tC_5H_{11})_3$, at least one organic metal source material selected from a second group consisting of $Sr(THD)_2$, $Sr(THD)_2$ tetraglyme (THD:2,2,6,6-tetramethyl-3,5-heptandion, $C_{11}H_{19}O_2$) and $Sr(Me_5C_5)_2 \cdot 2THF$(Me:$CH_3$, THF: tetrahydrofuran, at least one organic metal source material selected from a third group consisting of $Ti(i-OC_3H_7)_4$, $TiO(THD)_2$ and $Ti(THD)_2(i-OC_3H_7)_2$, and at least one organic metal source material selected from a fourth group consisting of $Ta(i-OC_3H_7)_5$, $Ta(i-OC_3H_7)_4THD$, $Nb(i-OC_3H_7)_5$ and $Nb(i-OC_3H_7)_4THD$.

When the finally obtained dielectric film is a SBTT film, the precursor film may be made by first making a film having an amorphous phase as its major component on the lower electrode and then changing the amorphous phase into a fluorite phase by annealing. More specifically, the precursor film is preferably made by first forming the film having the amorphous phase as its major component by metal organic or other chemical vapor deposition and then annealing it in an oxidizable gas atmosphere. In this case, the film having the amorphous phase as its major component is made at a temperature (substrate temperature) between 300° C. and 500° C., for example, and a reaction gas pressure of 1 to 10 Torr, for example. The annealing made here is conducted at a temperature between 600° C. and 850° C., for example, for 30 seconds to 120 minutes, for example. Used here as the reaction gas is: a mixed gas made by mixing an oxidizable gas with a mixed gas containing predetermined composition ratios of, for example, at least one organic metal source material selected from a first group consisting of $Bi(C_6H_5)_3$, $Bi(o-C_7H_7)_3$, $Bi(O-C_2H_5)_3$, $Bi(o-iC_3H_7)_3$, $Bi(O-tC_4H_9)_3$ and $Bi(O-tC_5H_{11})_3$, at least one organic metal source material selected from a second group consisting of $Sr(THD)_2$, $Sr(THD)_2$ tetraglyme and $Sr(Me_5C_5)_2 \cdot 2THF$, at least one organic metal source material selected from a third group consisting of $Ti(i-OC_3H_7)_4$, $TiO(THD)_2$ and $Ti(THD)_2(i-OC_3H_7)_2$, and at least one organic metal source material selected from a fourth group consisting of $Ta(i-OC_3H_7)_5$, $Ta(i-OC_3H_7)_4THD$, $Nb(i-OC_3H_7)_5$ and $Nb(i-OC_3H_7)_4THD$; or a mixed gas made by mixing predetermined composition ratios of, for example, at least one organic metal source material selected from a first group consisting of $Bi(C_6H_5)_3$, $Bi(o-C_7H_7)_3$, $Bi(O-C_2H_5)_3$, $Bi(O-iC_3H_7)_3$, $Bi(O-tC_4H_9)_3$ and $Bi(O-tC_5H_{11})_3$, at least one organic metal source material selected from a second group consisting of $SrTa_2(OC_2H_5)_{12}$ and $SrNb_2(OC_2H_5)_{12}$ (bimetallic alcoxide), and at least one organic metal source material selected from a third group consisting of $Ti(i-OC_3H_7)_4$, $TiO(THD)_2$ and $Ti(THD)_2(i-OC_3H_7)_2$.

In the present invention, for obtaining a dielectric film, the precursor film patterned into the form of a dielectric capacitor is typically annealed in an oxidizable gas atmosphere, and the annealing in the oxidizable gas atmosphere is conducted at a temperature preferably between 500° C. and 900° C., or more preferably between 650° C. and 800° C. Alternatively, for obtaining the dielectric film, the precursor film patterned into the form of the dielectric capacitor may be first annealed in a nitrogen gas atmosphere at a temperature between 500° C. and 900° C. and then annealed in an oxidizable gas atmosphere at a temperature between 500° C. and 900° C.; or may be first annealed in a nitrogen gas atmosphere at a temperature between 500° C. and 900° C. and then annealed in an oxidizable gas atmosphere containing 0.5% or more of ozone at a temperature between 300° C. and 600° C.; or may be first annealed in a reduced pressure atmosphere of 100 Torr or less at a temperature between 500° C. and 800° C. and then annealed in an oxidizable gas atmosphere containing 0.5% or more of ozone at a temperature between 300° C. and 600° C.

In the present invention, the thickness of the dielectric film is selected between, for example, 20 nm and 200 nm. From the viewpoint of realizing better characteristics, the thickness of the dielectric film is preferably selected between 20 nm and 100 nm. From the viewpoint of realizing low-voltage performance of a semiconductor device using the dielectric capacitor, the thickness of the dielectric film is more preferably selected between 30 nm and 80 nm.

In the first and third aspects of the invention, the step of patterning at least the upper electrode and the precursor film into the form of the dielectric capacitor by etching is typically performed by reactive ion etching or ion milling, for example. Similarly, in the second and fourth aspects of the invention, the step of patterning the upper electrode and the precursor film into the form of the dielectric capacitor by etching is typically performed by reactive ion etching or ion milling.

In the second and fourth aspects of the invention, the protective coat is typically an insulating film. combination of the material of the protective coat and the material of the dielectric film, i.e., combination of the material of the protective coat and the material of the precursor film, is preferably chosen so that any component element in one off the materials does not react on any component element of the other material or, if they reacts, they make a stable insulating film. From this viewpoint, used as the material of the protective coat is, for example, $SrTa_2O_6$, $Ta_2O_5$, $Nb_2O_5$, $ZrO_2$, $CeO_2$, $Y_2O_3$ or $HfO_2$ depending upon component elements of the dielectric film.

According to the first or third aspect of the invention having the above-explained construction, when a dielectric capacitor using as a dielectric film a dielectric material with a perovskite type crystalline structure is made, a lower electrode, a precursor film having as its major component an amorphous phase of fluorite phase of component elements of the dielectric material and an upper electrode are formed sequentially, and at least the upper electrode and the precursor film are patterned into the form of the dielectric capacitor by etching. Thereafter, the precursor film patterned into the form of the dielectric capacitor is annealed to change the amorphous phase or the fluorite phase into a crystal phase with the perovskite type crystalline structure and to thereby obtain the dielectric film. Therefore, crystal grains in the finally obtained dielectric film are not damaged by etching, and the dielectric capacitor can be prevented from deterioration in characteristics by etching.

According to the second or fourth aspect of the invention having the above-explained construction, when fabricating a dielectric capacitor using a dielectric material with a perovskite type crystalline structure as its dielectric film, a lower electrode, a precursor film having an amorphous phase of fluorite phase of component elements of the dielectric material as its major component and an upper electrode are formed sequentially, and the upper electrode and the precursor film are patterned into the form of the dielectric capacitor by etching. Thereafter, a protective coat is made to cover side walls of the upper electrode and the precursor film. Therefore, it is prevented that a certain metal deposits on side walls of the dielectric capacitor or a conductive oxide is generated upon etching of the lower electrode or subsequent annealing, and the dielectric capacitor is therefore prevented from deterioration in leak current characteristics. Additionally, according to the second and fourth aspects of the invention, since the dielectric film is obtained by annealing the precursor film patterned into the form of the dielectric capacitor like the first and third aspects of the invention, the dielectric capacitor is prevented from deterioration in characteristics by etching.

BRIEF DESCRIPTION OF THE DRAWINGS

FIGS. 4A through 4D are cross-sectional views for explaining a dielectric capacitor manufacturing method according to the third embodiment of the invention;

FIGS. 7A through 7D are cross-sectional views for explaining a dielectric capacitor manufacturing method according to the sixth embodiment of the invention;

FIGS. 9A through 9D are cross-sectional views for explaining a dielectric capacitor manufacturing method according to the eighth embodiment of the invention;

FIGS. 12A through 12D are cross-sectional views for explaining a dielectric capacitor manufacturing method according to the eleventh embodiment of the invention;

FIGS. 16A through 16E are cross-sectional views for explaining a dielectric capacitor manufacturing method according to the twelfth embodiment of the invention;

FIGS. 17A through 17D are cross-sectional views for explaining a dielectric capacitor manufacturing method according to the thirteenth embodiment of the invention;

FIGS. 19A through 19E are cross-sectional views for explaining a dielectric capacitor manufacturing method according to the fifteenth embodiment of the invention;

FIGS. 20A through 20E are cross-sectional views for explaining a dielectric capacitor manufacturing method according to the sixteenth embodiment of the invention;

FIG. 29 is a cross-sectional view for explaining a manufacturing method of ferroelectric nonvolatile memory according to the nineteenth embodiment of the invention.

DETAILED DESCRIPTION OF THE PREFERRED EMBODIMENTS

Figure 1A:
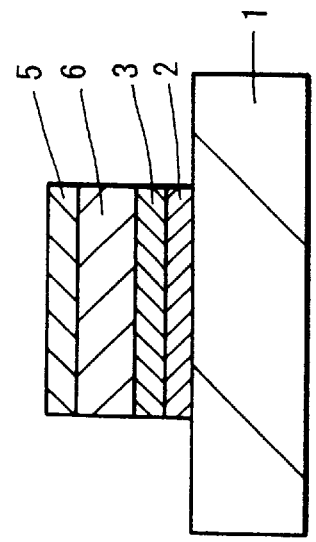
FIGS. 1A through 1D are cross-sectional views for explaining a dielectric capacitor manufacturing method according to the first embodiment of the invention.

Embodiments of the invention are explained below with reference to the drawings. First explained are first to fourth embodiments of the invention which each employ a dielectric capacitor manufacturing method according to the invention for manufacturing a dielectric capacitor using a SBT film as its dielectric film. In all of the drawings illustrating the first to fourth embodiments, identical or equivalent elements are labeled with common reference numerals.

FIGS. 1A through 1D are cross-sectional views for explaining a dielectric capacitor manufacturing method according to the first embodiment of the invention.

In the dielectric capacitor manufacturing method according to the first embodiment, first made on a conductive Si substrate 1 are an $IrO_2$ film 2 and an Ir film 3 as a lower electrode by sputtering, for example, under ordinary conditions as shown in FIG. 1A. The thickness of the $IrO_2$ film 2 is 100 nm, for example, and the thickness of the Ir film 3 is 200 nm, for example.

Next made on the Ir film 3 is an amorphous film 4 as a precursor film of SBT, which is made up of component elements of the finally obtained SBT film, namely, Sr, Bi, Ta and O, by MOCVD, for example. More specifically, the Si substrate 1 having formed films up to the Ir film 3 is set on a susceptor in a reaction chamber (film-making chamber) of a MOCVD apparatus, not shown, and heated to and held at a substrate temperature between 400° C. and 650° C. Meanwhile, a mixture containing predetermined ratios of organic metal source materials, $Bi(C_6H_5)_3$, $Sr(DPM)_2$ tetraglyme (DPM: di-pivaloyl methanate) and $Ta(i-OC_3H_7)_4$ DPM, is vaporized. Then, a resulting gas is mixed with an argon carrier gas and, while their total flow amount is held in 1000 SCCM, they are mixed with oxygen gas in the flow amount of 1000 SCCM immediately before the reaction chamber. Thereafter, the mixed gas is introduced as a source material gas into the reaction chamber to make the film under a reaction gas pressure of 0.1 to 50 Torr. As a result, the amorphous film 4 is made as the precursor film of SBT. The thickness of the amorphous film 4 is 150 nm, for example, and the atomic composition ratio is chosen to satisfy, for example, $2.0 \leq 2Bi/Ta \leq 2.6$ and $0.6 \leq 2Sr/Ta \leq 1.2$.

After that, made on the amorphous film 4 is a Pt film 5 as an upper electrode by sputtering, for example, under ordinary conditions. The thickness of the Pt film 5 is 100 nm, for example.

Figure 1C:
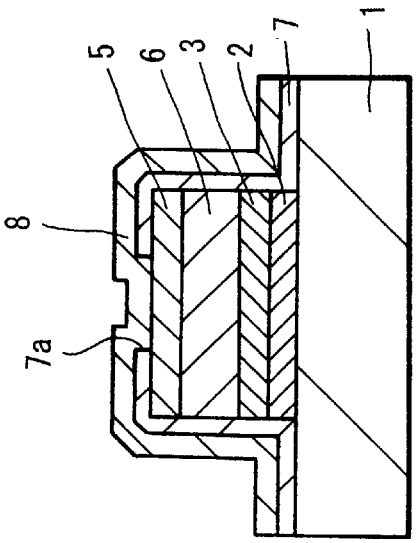
Figure 1B:
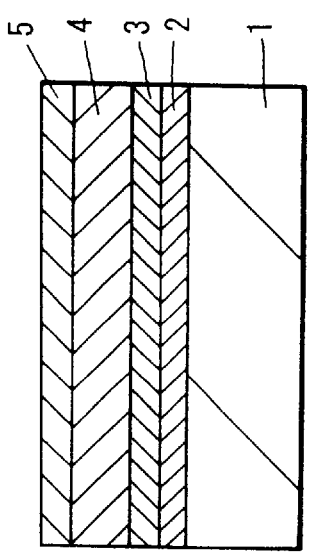

Next as shown in FIG. 1B, the Pt film 5, amorphous film 4, Ir film 3 and $IrO_2$ film 2 are patterned by RIE, for example, into the form of a dielectric film as large as $2 \mu m \times 2 \mu m$.

Next, the amorphous film 4 patterned into the form of dielectric capacitor is annealed in an oxygen atmosphere held in a normal pressure, for example, at 750° C., for example, for one hour, thereby to change the amorphous phase in the amorphous film 4 to a crystal phase of a Bi-layered structured perovskite type crystalline structure so as to crystallize the amorphous film 4. As a result, as shown in FIG. 1C, a SBT film 6 is obtained between the Ir film 3 and the Pt film 5. The SBT film 6 is made up of a ferroelectric material of a Bi-layered structured perovskite type crystalline structure expressed by the composition formula $Bi_xSr_yTa_{2.0}O_z$ (where $2.0 \leq x \leq 2.6$, $0.6 \leq y \leq 1.2$, $z=9 \pm d$, $0 \leq d \leq 1.0$).

Figure 1D:
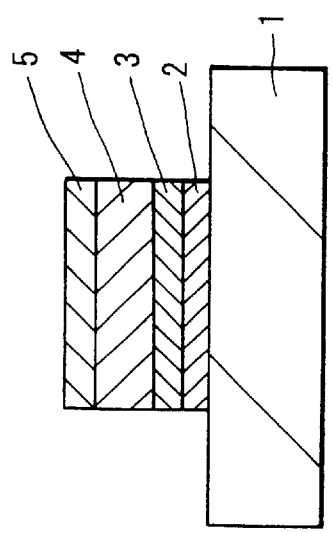

Next as shown in FIG. 1D, an inter-layer insulating film 7 is made on the entire surface. Then, a predetermined portion of the inter-layer insulating film 7 above the Pt film 5 is removed by etching to make a contact hole 7a. Subsequently, after an Al alloy film is made on the entire surface by sputtering, for example, it is patterned into a predetermined shape by etching to make a lead-out electrode 8.

Thus, the intended dielectric capacitor using the SBT film as its dielectric film is completed.

Using a dielectric capacitor actually made by the above-explained process, a voltage was applied between the Si substrate 1 and the lead-out electrode 8, and its polarization (P) to voltage (V) hysteresis was measured. As a result, the value of $2Pr=10 \sim 25 \mu C/cm^2$ was obtained as the dielectric polarization value (residual polarization value) 2Pr. This value of 2Pr is a satisfactory value for a dielectric capacitor using a SBT film, and it was obtained by measurement through the Si substrate 1. In contrast, as to a dielectric capacitor as large as $2 \mu m \times 2 \mu m$ actually prepared in the same manner as the conventional technique by first annealing and crystallizing the amorphous film 4 to obtain the SBT film 6, then making the Pt film 5 on the SBT film 6, and thereafter patterning the Pt film 5, SBT film 6, Ir film 3 and $IrO_2$ film 2 by etching into the form of the dielectric capacitor, its residual polarization value 2Pr was $10 \mu C/cm^2$ or less. These facts show that the residual polarization value 2Pr is remarkably improved in a dielectric capacitor using a SBT film by employing the dielectric capacitor manufacturing method according to the invention.

Figure 2:
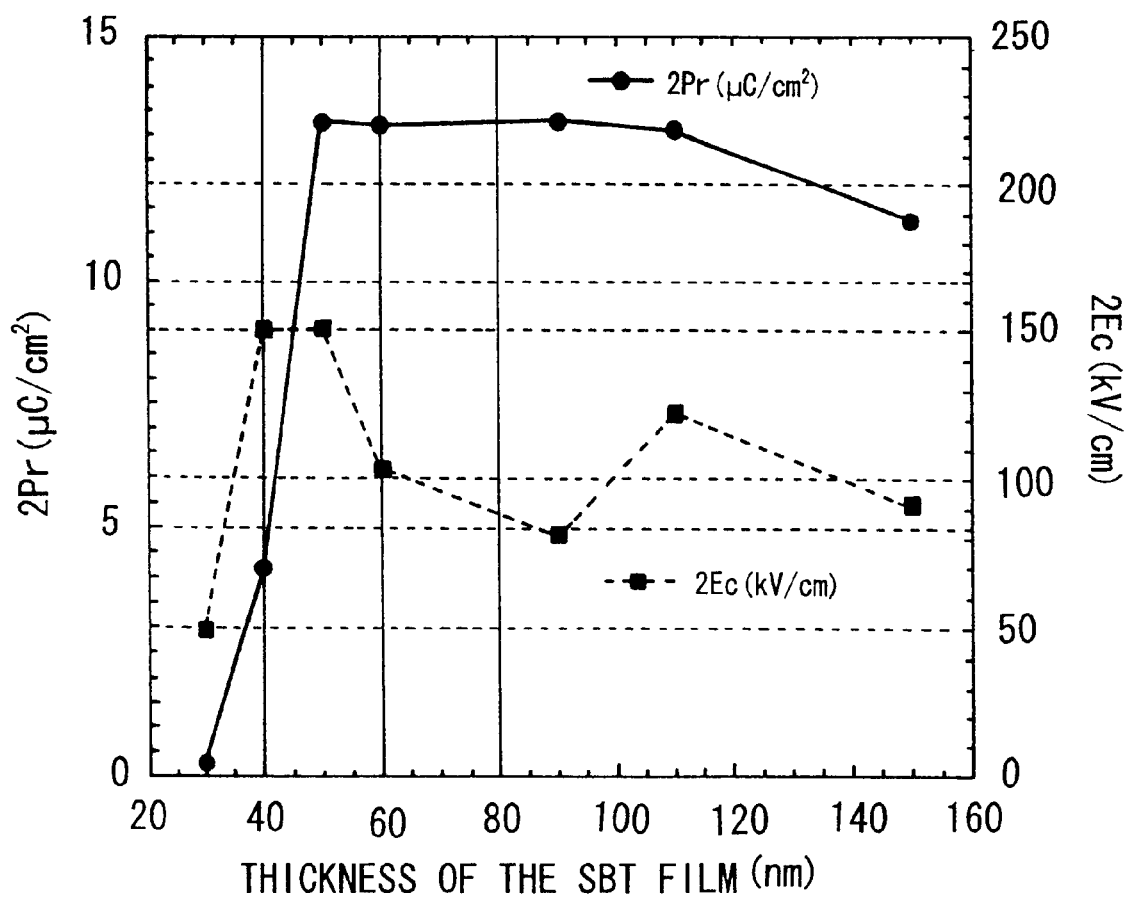
FIG. 2 is a schematic diagram showing dependency of the residual polarization value and the coercive force upon the thickness of a SBT film in a dielectric capacitor using the SBT film.

Consideration is made here on dependency of characteristics of the dielectric capacitor on the thickness of the SBT film 6. FIG. 2 shows the relation between the thickness of the SBT film 6 and the residual polarization value 2Pr and the relation between the thickness of the SBT film 6 and the coercive force 2Ec when the amorphous film 4 as the precursor film of SBT is made by sol-gel spin coating. It is understood from FIG. 2 that a residual polarization value 2Pr as high as $13 \sim 14 \mu C/cm^2$, approximately, and a coercive force 2Ec as small as 100 kV/cm, approximately, are obtained when the thickness of the SBT film 6 is between 50 nm and 110 nm. This is the case where the precursor film of SBT is made by spin coating. If the precursor film of SBT is made by MOCVD as in the first embodiment, then a good residual polarization value 2Pr and a good coercive force 2Ec are expected even when the thickness of the SBT film 6 is 40 nm or less. Therefore, in the dielectric capacitor, the thickness of the SBT film 6 is typically selected between 20 nm and 200 nm, but it would be preferable to choose the thickness between 20 nm and 100 nm from the viewpoint of ensuring better characteristics. Taking it into consideration that semiconductor devices go on toward a decrease in operating voltage along with a continuous progress of miniaturization of elements and devices, it would be more preferable to choose the thickness of the SBT film 6 between 30 nm and 80 nm.

As explained above, according to the first embodiment, when the dielectric capacitor using a SBT film as its dielectric film is manufactured, a lower electrode made up of the $IrO_2$ film 2 and the Ir film 3, the amorphous film 4 as the precursor film of SBT and the Pt film 5 as the upper electrode are formed sequentially, and they are patterned into the form of the dielectric capacitor by etching. Thereafter, the amorphous film 4 patterned into the form of the dielectric capacitor is annealed to change the amorphous phase in the amorphous film 4 into a crystal phase with the perovskite type crystalline structure and to thereby obtain the SBT film 6 as the dielectric film. Therefore, crystal grains in the finally obtained SBT film 6 are not damaged by etching, and the dielectric capacitor is effectively prevented from deterioration in residual polarization value 2Pr by etching. Thus, the invention has the advantage that the residual polarization value 2Pr is significantly improved as compared with the conventional technique. As a result, a dielectric capacitor having good characteristics is realized even when the area of the dielectric capacitor is reduced to $10 \mu m^2$ or less (in this example, $2 \mu m \times 2 \mu m$).

FIGS. 3A through 3E are cross-sectional views for explaining a dielectric capacitor manufacturing method according to the second embodiment of the invention.

Figure 3A:
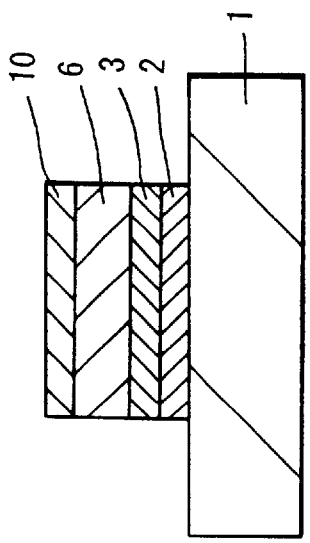
FIGS. 3A through 3E are cross-sectional views for explaining a dielectric capacitor manufacturing method according to the second embodiment of the invention.

In the dielectric capacitor manufacturing method according to the second embodiment, the $IrO_2$ film, Ir film 3 and amorphous film 4 are sequentially stacked on the Si substrate 1 as shown in FIG. 3A through the same steps as those of the first embodiment.

Subsequently, the amorphous film 4 is annealed at 700° C. to 800° C. for 30 seconds by RTA (rapid thermal annealing), for example, to change the amorphous phase in the amorphous film 4 to a fluorite phase. As a result, as shown in FIG. 3, a fluorite film 9 made of Sr, Bi, Ta and O is made as the precursor film of SBT on the Ir film 3. The thickness of the fluorite film 9 is 150 nm, for example, and the atomic composition ratio is chosen to satisfy $2.0 \leq 2Bi/ta \leq 2.6$ and $0.6 \leq 2Sr/Ta \leq 1.2$ Referring to FIG. 3C, next made on the fluorite film 9 is an Ir film 10 as the upper electrode by sputtering, for example, under ordinary conditions. The thickness of the Ir film 10 is 100 nm, for example. After that, the Ir film 10, fluorite film 9, Ir film 3 and IrO$_2$ film 2 are patterned into the form of the dielectric capacitor whose size is 2 μm×2 μm, for example.

Figure 3D:
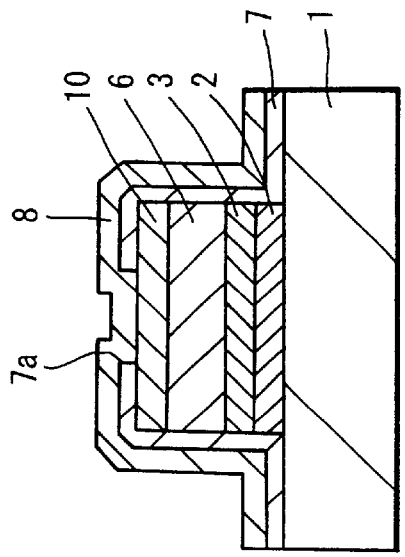
Figure 3B:
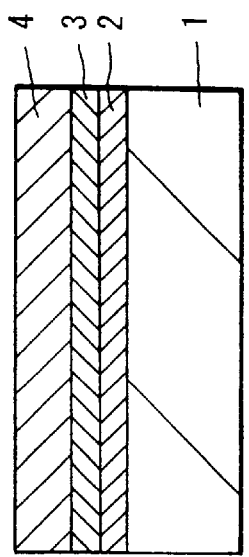
Figure 3C:
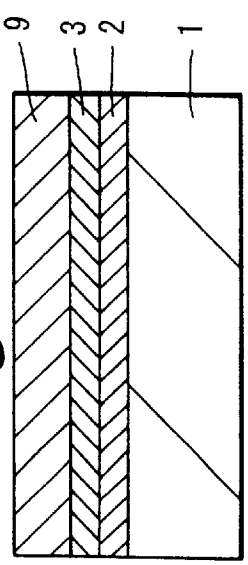

Thereafter, the fluorite film 9 patterned into the form of the dielectric capacitor is annealed in an oxygen atmosphere held in a normal pressure, for example, at 750° C., for example, for one hour, such that the fluorite phase in the fluorite film 9 be changed to a crystal phase of a Bi-layered structured perovskite type crystalline structure to crystallize the fluorite film 9. As a result, as shown in FIG. 3D, the SBT film 6 is obtained between the Ir film 3 and the Ir film 10. The SBT film 6 is made up of a ferroelectric material of a Bi-layered structured perovskite type crystalline structure having the composition formula, $Bi_xSr_yTa_{2.0}O_z$ (where $2.0 \leq x \leq 2.6$, $0.6 \leq y \leq 1.2$, $z=9 \pm d$, $0 \leq d \leq 1.0$).

Figure 3E:
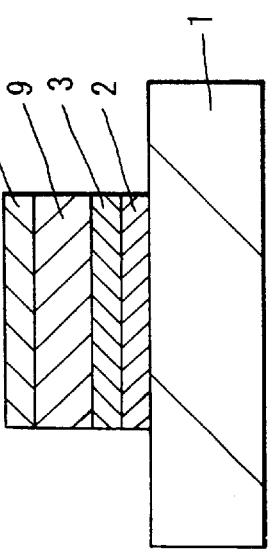

Next as shown in FIG. 3E, the inter-layer insulating film 7, contact hole 7a and lead-out electrode 8 are made through the same steps as those of the first embodiment, and the intended dielectric capacitor using the SBT film as its dielectric film is completed.

Using a dielectric capacitor actually made by the above-explained method, its P-V hysteresis was measured in the same manner as the first embodiment. It resulted in obtaining the value, 2Pr=10~25 μC/cm$^2$ as the residual polarization value 2Pr. This value of 2Pr is a favorable value for a dielectric capacitor using a SBT film, and this was obtained by measurement through the Si substrate 1. In contrast, as to a dielectric capacitor as large as 2 μm×2 μm actually prepared in the same manner as the conventional technique by first annealing and crystallizing the fluorite film 9 to obtain the SBT film 6, then making the Ir film 10 on the SBT film 6, and thereafter patterning the Ir film 10, SBT film 6, Ir film 3 and IrO$_2$ film 2 by etching into the form of the dielectric capacitor, its residual polarization value 2Pr was 10 μC/cm$^2$ or less. These facts show that the residual polarization value 2Pr is remarkably improved in a dielectric capacitor using a SBT film by employing the dielectric capacitor manufacturing method according to the invention.

As explained above, according to the second embodiment, when the dielectric capacitor using a SBT film as its dielectric film is manufactured, the IrO$_2$ film 2, the Ir film 3, both as the lower electrode, the fluorite film 9 as the precursor film of SBT and the Ir film 10 as the upper electrode are formed sequentially, and they are patterned into the form of the dielectric capacitor by etching. Thereafter, the patterned fluorite film 9 is annealed to change the fluorite phase in the fluorite film 9 into a crystal phase with the perovskite type crystalline structure and to thereby obtain the SBT film 6 as the dielectric film. Therefore, the same advantages as those of the first embodiment are obtained.

FIGS. 4A through 4D are cross-sectional views for explaining a dielectric capacitor manufacturing method according to the third embodiment of the invention.

In the dielectric capacitor manufacturing method according to the third embodiment, the lower electrode made up of the IrO$_2$ film 2 and the Ir film 3, and the amorphous film 4 as the precursor film of SBT are sequentially stacked on the Si substrate 1 as shown in FIG. 4A through the same steps as those of the first embodiment. After that, made on the amorphous film 4 is a 100 nm thick Ru film 11 as the upper electrode by CVD, for example, and the Ru film 11 and the amorphous film 4 are patterned into the form of the dielectric capacitor as large as 2 μm×2 μm, for example, by RIE, for example. Next made on the entire surface is a Ta$_2$O$_5$ film 12 as a protective coat by MOCVD, for example, so as to cover side walls of the Ru film 11 and the amorphous film 4 patterned into the form of the dielectric capacitor. The thickness of the Ta$_2$O$_5$ film 12 is 30 nm, for example.

The amorphous film 4 patterned into the form of the dielectric capacitor, with its side walls being coated by the Ta$_2$O$_5$ film 12, is next annealed in an oxygen atmosphere held in a normal pressure, for example, at 750° C., for example, for one hour, such that the amorphous phase in the amorphous film 4 be changed into a crystal phase of a perovskite type crystalline structure to crystallize the amorphous film 4. As a result, as shown in FIG. 4B, the SBT film 6 is obtained between the Ir film 3 and the Ru film 11. The SBT film 6 is made up of a ferroelectric material of a Bi-layered structured perovskite type crystalline structure having the composition formula $Bi_xSr_yTa_{2.0}O_z$ (where $2.0 \leq x \leq 2.6$, $0.6 \leq y \leq 1.2$, $z=9 \pm d$, $0 \leq d \leq 1.0$).

Next as shown in FIG. 4C, the Ta$_2$O$_5$ film 12, Ir film 3 and IrO$_2$ film 2 are patterned into a predetermined shape by etching to leave the Ta$_2$O$_5$ film 12 on side walls of the Ru film 11 and the SBT film 6.

Next as shown in FIG. 4D, an inter-layer insulating film 7 is made on the entire surface. After that, the inter-layer insulating film 7 and the Ta$_2$O$_5$ film 12 are selectively removed by etching to make a contact hole 7a in a predetermined location above the Ru film 11. Then, an Al alloy film is made on the entire surface by sputtering, for example, and it is patterned into a predetermined shape by etching to form a lead-out electrode 8.

Through these steps, the intended dielectric capacitor using the SBT film as its dielectric film is completed.

Using a dielectric capacitor actually made by the above-explained method, the leak current was measured by applying a voltage across the Si substrate 1 and the lead-out electrode 8. The measured value was $1 \times 10^{-8}$ A/cm$^2$ when the applied electric field was 300 kV/cm. This is a favorable value for a dielectric capacitor using a SBT film. In contrast, as to a dielectric capacitor in which the SBT film 6 was made by annealing the amorphous film 4 without making the Ta$_2$O$_5$ film 12, the leak current was $5 \times 10^{-7}$ A/cm$^2$ when the applied electric field was 300 kV/cm. These values show that the leak current characteristics of the dielectric capacitor using the SBT film are remarkably improved by employing the dielectric capacitor manufacturing method according to the invention.

As explained above, according to the third embodiment, when the dielectric capacitor using a SBT film as its dielectric film is manufactured, the lower electrode made up of the IrO$_2$ film 2 and the Ir film 3, the amorphous film 4 as the precursor film of SBT and the Ru film 11 as the upper electrode are formed sequentially, and the Ru film 11 and the amorphous film 4 are patterned into the form of the dielectric capacitor by etching. Thereafter, the Ta$_2$O$_5$ film 12 is made as a protective coat to cover side walls of the Ru film 11 and the amorphous film 4. Therefore, it is prevented that a certain metal deposits on side walls of the dielectric capacitor or a conductive oxide is produced by etching of the lower electrode made up of the IrO$_2$ film 2 and the Ir film 3 or by subsequent annealing, and the dielectric capacitor is therefore prevented from deterioration in leak current characteristics. Thus the invention has the advantage in effectively preventing the dielectric capacitor from deterioration in leak current characteristics, and in remarkably improving the leak current characteristics as compared with the conventional technique.

Moreover, according to the third embodiment, after the amorphous film 4 as the precursor film of SBT is patterned into the form of the dielectric capacitor, it is annealed and crystallized to obtain the SBT film 6. Therefore, it is also advantageous in improving the residual polarization value 2Pr similarly to the first embodiment.

Consequently, according to the third embodiment a dielectric capacitor excellent in characteristics can be realized, and its reliability can be improved, even when the area of the dielectric capacitor is as small as 10 $\mu m^2$ or less.

FIGS. 5A through 5D are cross-sectional views for explaining a dielectric capacitor manufacturing method according to the fourth embodiment of the invention.

Figure 5A:
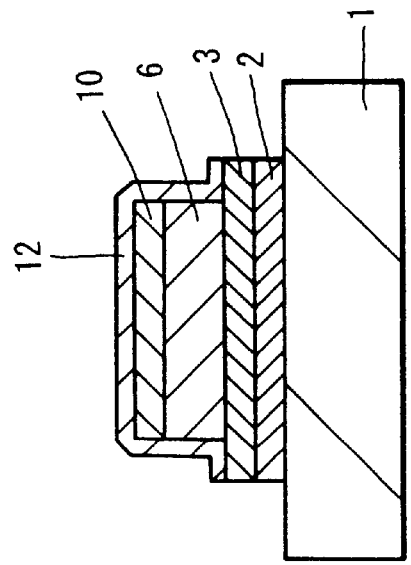
FIGS. 5A through 5D are cross-sectional views for explaining a dielectric capacitor manufacturing method according to the fourth embodiment of the invention.

In the dielectric capacitor manufacturing method according to the fourth embodiment, the $IrO_2$ film 2 and the Ir film 3 as the lower electrode, and the amorphous film 4 are sequentially stacked on the Si substrate 1 through the same steps as those of the second embodiment. After that, the amorphous film 4 is annealed to change the amorphous phase to the fluorite phase and obtain the fluorite film 9 as the precursor film of SBT. Then, the Ir film 10 as the upper electrode is made on the fluorite film 9 through the same steps as those of the second embodiment. Thereafter, as shown in FIG. 5A, the Ir film 10 and the fluorite film 9 are patterned by RIE, for example, into the form of the dielectric capacitor whose size may be 2 $\mu$m×2 $\mu$m, for example. Next made on the entire surface is the $Ta_2O_5$ film 12 as a protective coat by MOCVD, for example, so as to cover side walls of the Ru film 11 and the amorphous film 4 patterned into the form of the dielectric capacitor. The thickness of the $Ta_2O_5$ film 12 is 30 nm, for example.

After that, in the same manner as the third embodiment, the fluorite film 9 patterned into the form of the dielectric capacitor, with its side walls being coated by the $Ta_2O_5$ film 12, is annealed in an oxygen atmosphere held in a normal pressure, for example, at 750° C., for example, for one hour, such that the fluorite phase in the fluorite film 9 be changed into a crystal phase of a perovskite type crystalline structure to crystallize the fluorite film 9. As a result, as shown in FIG. 5B, the SBT film 6 is obtained between the Ir film 3 and the Ir film 10. The SBT film 6 is made up of a ferroelectric material of a Bi-layered structured perovskite type crystalline structure having the composition formula $Bi_xSr_yTa_{2.0}O_z$ (where $2.0 \leq x \leq 2.6$, $0.6 \leq y \leq 1.2$, $z=9\pm d$, $0 \leq d \leq 1.0$).

Figure 5C:
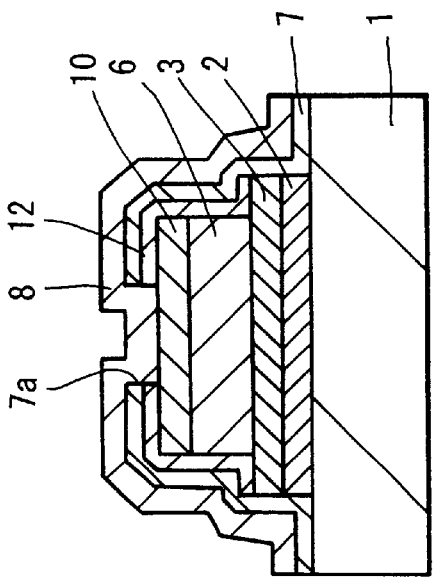
Figure 5B:
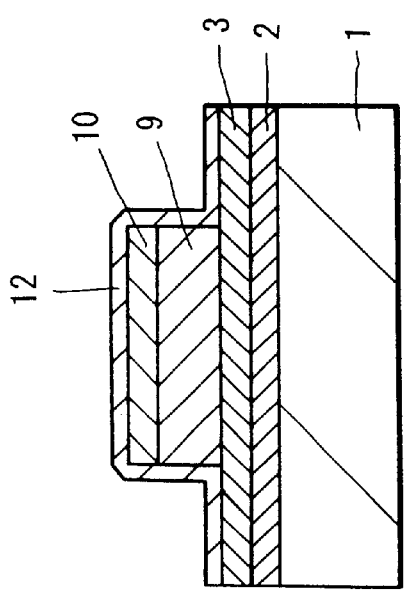

Thereafter, as shown in FIG. 5C, the $Ta_2O_5$ film 12, Ir film 3 and $IrO_2$ film 2 are patterned into a predetermined shape by etching to leave the $Ta_2O_5$ film 12 on side walls of the Ir film 10 and the fluorite film 9.

Figure 5D:
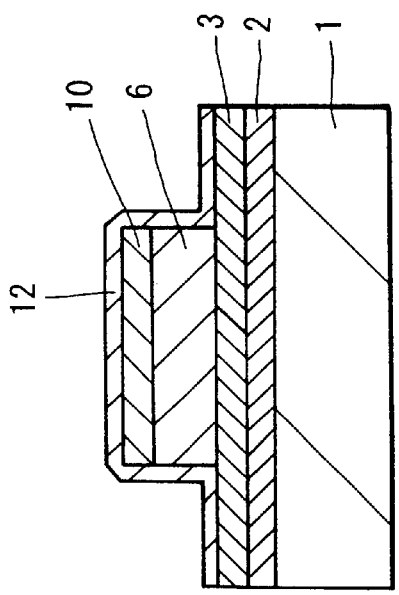

Next as shown in FIG. 5D, the inter-layer insulating film 7, contact hole 7a and lead-out electrode 8 are made through the same steps as those of the third embodiment, and the intended dielectric capacitor using the SBT film as its dielectric film is completed.

Using a dielectric capacitor actually made by the above-explained method, the leak current was measured in the same manner as the third embodiment. The measured value was $1 \times 10^{-8}$ A/cm$^2$ when the applied electric field was 300 kV/cm. In contrast, as to a dielectric capacitor in which the SBT film 6 was made by annealing the fluorite film 9 without making the $Ta_2O_5$ film 12, the leak current was $5 \times 10^{-7}$ A/cm$^2$ when the applied electric field was 300 kV/cm. These values show that the leak current characteristics of the dielectric capacitor using the SBT film are remarkably improved by employing the dielectric capacitor manufacturing method according to the invention.

According to the fourth embodiment, the same effects as those of the third embodiments are obtained upon making the SBT film by changing the phase from the fluorite phase to a Bi-layered structured perovskite type crystalline structure in a process for manufacturing a dielectric capacitor using the SBT film as its dielectric film.

Next explained are the fifth and sixth embodiments of the invention which apply a dielectric capacitor manufacturing method according to the invention to fabrication of a dielectric capacitor using a PZT film as its dielectric film. In all of the drawings illustrating the fifth and sixth embodiments, identical or equivalent elements or parts are labeled with common reference numerals.

FIGS. 6A through 6D are cross-sectional views for explaining a dielectric capacitor manufacturing method according to the fifth embodiment of the invention.

Figure 6C:
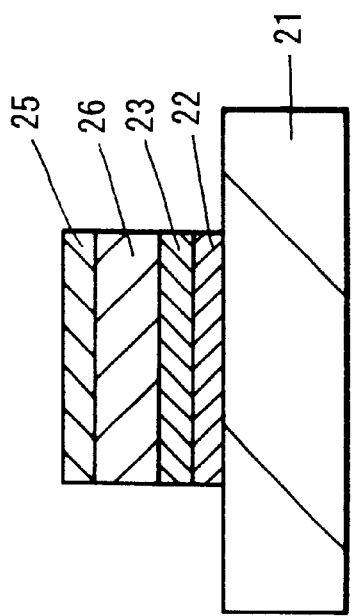
FIGS. 6A through 6D are cross-sectional views for explaining a dielectric capacitor manufacturing method according to the fifth embodiment of the invention.
Figure 6D:
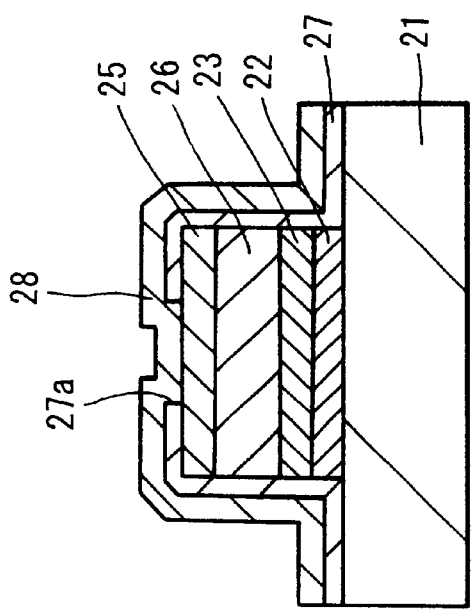
Figure 6A:
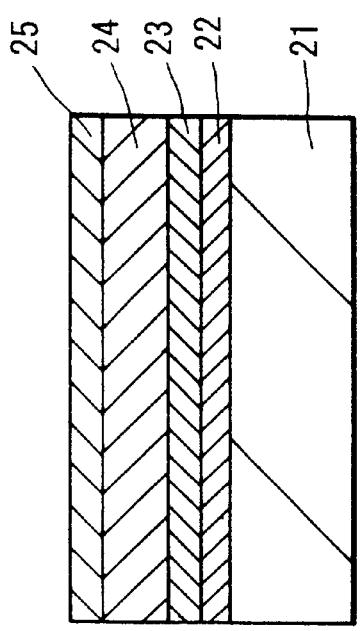

In the dielectric capacitor manufacturing method according to the fifth embodiment, first made on a conductive Si substrate 21 are an $IrO_2$ film 22 and an Ir film 23 as a lower electrode by sputtering, for example, under ordinary conditions as shown in FIG. 6A. The thickness of the $IrO_2$ film 22 is 100 nm, for example, and the thickness of the Ir film 23 is 100 nm, for example.

Next made on the Ir film 23 is an amorphous film 24 as a precursor film of PZT, which is made up of component elements of the finally obtained PZT film, namely, Pb, Zr, Ti and O, by MOCVD, for example. More specifically, the Si substrate 21 having formed films up to the Ir film 23 is set on a susceptor in a reaction chamber (film-making chamber) of a MOCVD apparatus, not shown, and heated to and held at a substrate temperature between 400° C. and 650° C. Meanwhile, a mixture containing predetermined ratios of organic metal source materials, $Pb(DPM)_2$, $Zr(DPM)_2$ and $Ti(i-OC_3H_7)_2(DPM)_2$, is vaporized. Then, a resulting gas is mixed with an argon carrier gas and, while their total flow amount is held in 1000 SCCM, they are mixed with oxygen gas in the flow amount of 1000 SCCM immediately before the reaction chamber. Thereafter, the mixed gas is introduced as a source material gas into the reaction chamber to make the film under a reaction gas pressure of 0.1 to 50 Torr. As a result, the amorphous film 24 is made as the precursor film of PZT. The thickness of the amorphous film 24 is 150 nm, for example, and the atomic composition ratio is chosen to satisfy, for example, $0.1 \leq Zr/Pb \leq 0.6$ and $0.4 \leq 2Ti/Pb \leq 0.9$.

After that, made on the amorphous film 24 is an Ir film 25 as the upper electrode by sputtering, for example, under ordinary conditions. The thickness of the Ir film 25 is 100 nm, for example.

Figure 6B:
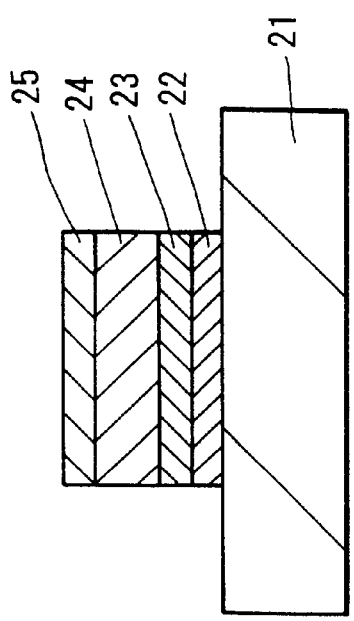

Next as shown in FIG. 6B, the Ir film 25, amorphous film 24, Ir film 23 and $IrO_2$ film 22 are patterned by RIE, for example, into the form of a dielectric film as large as 2 $\mu$m×2 $\mu$m.

Next, the amorphous film 24 patterned into the form of dielectric capacitor is annealed in an oxygen atmosphere held in a normal pressure, for example, at 650° C., for example, for 30 minutes, thereby to change the amorphous phase in the amorphous film 24 to a crystal phase of a perovskite type crystalline structure so as to crystallize the amorphous film 24. As a result, as shown in FIG. 6C, a PZT film 26 is obtained between the Ir film 23 and the Ir film 25. The PZT film 26 is made up of a ferroelectric material of a perovskite type crystalline structure expressed by the composition formula $Pb_{1.0}(Zr_xTi_{1-x})_{1.0}O_3$ (where $0.1 \leq x \leq 0.6$).

Next as shown in FIG. 6D, an inter-layer insulating film 27 is made on the entire surface. Then, a predetermined portion of the inter-layer insulating film 27 above the Ir film 25 is removed by etching to make a contact hole 27a. Subsequently, after an Al alloy film is made on the entire surface by sputtering, for example, it is patterned into a predetermined shape by etching to make a lead-out electrode 28.

Thus, the intended dielectric capacitor using the PZT film as its dielectric film is completed.

Using a dielectric capacitor actually made by the above-explained process, a voltage was applied between the Si substrate 21 and the lead-out electrode 28, and its P-V hysteresis was measured. As a result, the value of 2Pr= 20~60 $\mu C/cm^2$ was obtained as the residual polarization value 2Pr. This value of 2Pr is a satisfactory value for a dielectric capacitor using a PZT film, and it was obtained by measurement through the Si substrate 21. In contrast, as to a dielectric capacitor as large as 2 $\mu m \times 2$ $\mu m$ actually prepared in the same manner as the conventional technique by first annealing and crystallizing the amorphous film 24 to obtain the PZT film 26, then making the Ir film 25 on the PZT film 26, and thereafter patterning the Ir film 25, PZT film 26, Ir film 23 and $IrO_2$ film 22 by etching into the form of the dielectric capacitor, its residual polarization value 2Pr was 10 $\mu C/cm^2$ or less. These facts show that the residual polarization value 2Pr is remarkably improved in a dielectric capacitor using a PZT film by employing the dielectric capacitor manufacturing method according to the invention.

According to the fifth embodiment, the same effects as those of the first embodiment are obtained when a dielectric capacitor using a PZT film as its dielectric film is manufactured.

FIGS. 7A through 7D are cross-sectional views for explaining a dielectric capacitor manufacturing method according to the sixth embodiment of the invention.

In the dielectric capacitor manufacturing method according to the sixth embodiment, the $IrO_2$ film 22 and the Ir film 23 which make up the lower electrode, the amorphous film 24 as the precursor film of PZT, and the Ir film 25 as the upper electrode are sequentially stacked on the Si substrate 21 through the same steps as those of the fifth embodiment. After that, as shown in FIG. 7A, the Ir film 25 and the amorphous film 24 are patterned into the form of the dielectric capacitor as large as 2 $\mu m \times 2$ $\mu m$, for example, by RIE, for example. Next made on the entire surface is a $Y_2O_3$ film 29 as a protective coat by MOCVD, for example, so as to cover side walls of the Ir film 25 and the amorphous film 24 patterned into the form of the dielectric capacitor. The thickness of the $Y_2O_3$ film 29 is 30 nm, for example.

The amorphous film 24 patterned into the form of the dielectric capacitor, with its side walls being coated by the $Y_2O_3$ film 29, is next annealed in an oxygen atmosphere held in a normal pressure, for example, at 750° C., for example, for one hour, such that the amorphous phase in the amorphous film 24 be changed into a crystal phase of a perovskite type crystalline structure to crystallize the amorphous film 24. As a result, as shown in FIG. 7B, the PZT film 26 is obtained between the Ir film 23 and the Ir film 25. The PZT film 26 is made up of a ferroelectric material of a perovskite type crystalline structure having the composition formula $Pb_{1.0}(Zr_xTi_{1-x})_{1.0}O_3$ (where $0.1 \leq x \leq 0.6$)

Next as shown in FIG. 7C, the $Y_2O_3$ film 29, Ir film 23 and $IrO_2$ film 22 are patterned into a predetermined shape by etching to leave the $Y_2O_3$ film 29 on side walls of the Ir film 25 and the PZT film 26.

Next as shown in FIG. 7D, an inter-layer insulating film 27 is made on the entire surface. After that, the inter-layer insulating film 27 and the $Y_2O_3$ film 29 are selectively removed by etching to make a contact hole 27a in a predetermined location above the Ir film 25. Then, an Al alloy film is made on the entire surface by sputtering, for example, and it is patterned into a predetermined shape by etching to form a lead-out electrode 28.

Through these steps, the intended dielectric capacitor using the PZT film as its dielectric film is completed.

Using a dielectric capacitor actually made by the above-explained method, the leak current was measured by applying a voltage across the Si substrate 21 and the lead-out electrode 28. The measured value was $1 \times 1 \times 10^{-8}$ $A/cm^2$ when the applied electric field was 300 kV/cm. This is a favorable value for a dielectric capacitor using a PZT film. In contrast, as to a dielectric capacitor in which the PZT film 26 was made by annealing the amorphous film 24 without making the $Y_2O_3$ film 29, the leak current was $5 \times 10^{-7} A/cm^2$ when the applied electric field was 300 kV/cm. These values show that the leak current characteristics of the dielectric capacitor using the PZT film are remarkably improved by employing the dielectric capacitor manufacturing method according to the invention.

According to the sixth embodiment, the same effects as those of the third embodiment are obtained when manufacturing a dielectric capacitor using a PZT film as its dielectric film.

Next explained are the seventh and eighth embodiments of the invention which apply a dielectric capacitor manufacturing method according to the invention to fabrication of a dielectric capacitor using a PNZT film as its dielectric film. In all of the drawings illustrating the seventh and eighth embodiments, identical or equivalent elements or parts are labeled with common reference numerals.

FIGS. 8A through 8D are cross-sectional views for explaining a dielectric capacitor manufacturing method according to the seventh embodiment of the invention.

Figure 8A:
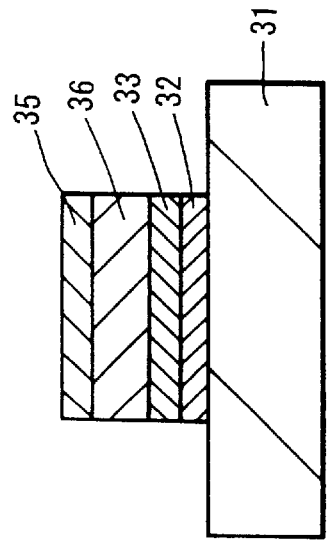
FIGS. 8A through 8D are cross-sectional views for explaining a dielectric capacitor manufacturing method according to the seventh embodiment of the invention.

In the dielectric capacitor manufacturing method according to the seventh embodiment, first made on a conductive Si substrate 31 are an $IrO_2$ film 32 and an Ir film 33 as a lower electrode by sputtering, for example, under ordinary conditions as shown in FIG. 8A. The thickness of the $IrO_2$ film 32 is 100 nm, for example, and the thickness of the Ir film 33 is 200 nm, for example.

Next made on the Ir film 33 is an amorphous film 34 as a precursor film of PNZT, which is made up of component elements of the finally obtained PNZT film, namely, Pb, Zr, Ti, Nb and O by sol-gel spin coating. The thickness of the amorphous film 34 is 150 nm, for example, and the atomic composition ratio is chosen to satisfy, for example, $0.1 \leq Zr/Pb \leq 0.6$, $0.4 \leq 2Ti/Pb \leq 0.9$, and $0.03 \leq Nb/Pb \leq 0.3$.

After that, made on the amorphous film 34 is an Ir film 35 as the upper electrode by sputtering, for example, under ordinary conditions. The thickness of the Ir film 35 is 100 nm, for example.

Figure 8C:
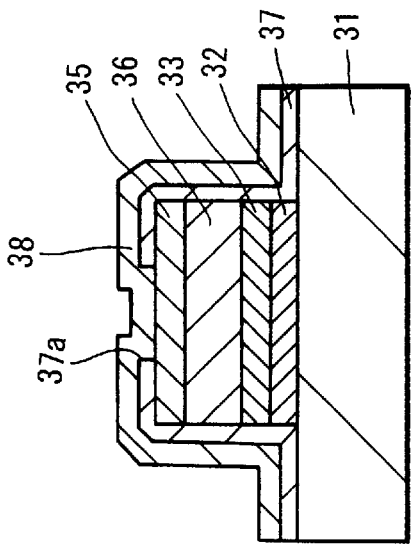
Figure 8B:
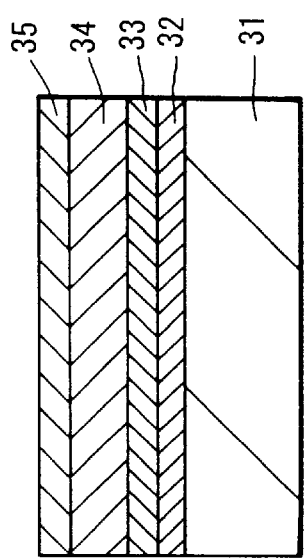

Next as shown in FIG. 8B, the Ir film 35, amorphous film 34, Ir film 33 and $IrO_2$ film 32 are patterned by RIE, for example, into the form of a dielectric film as large as 2 $\mu m \times 2$ $\mu m$.

Next, the amorphous film 34 patterned into the form of dielectric capacitor is annealed in an oxygen atmosphere held in a normal pressure, for example, at 650° C., for example, for 30 minutes, thereby to change the amorphous phase in the amorphous film 34 to a crystal phase of a perovskite type crystalline structure so as to crystallize the amorphous film 34. As a result, as shown in FIG. 8C, a PNZT film 36 is obtained between the Ir film 33 and the Ir film 35. The PNZT film 36 is made up of a ferroelectric material of a perovskite type crystalline structure expressed by the composition formula $Pb_{1.0-y}Nb_y(Zr_xTi_{1-x})_{1.0}O_3$ (where $0.1 \leq x \leq 0.6$, $0.03 \leq y \leq 0.30$).

Figure 8D:
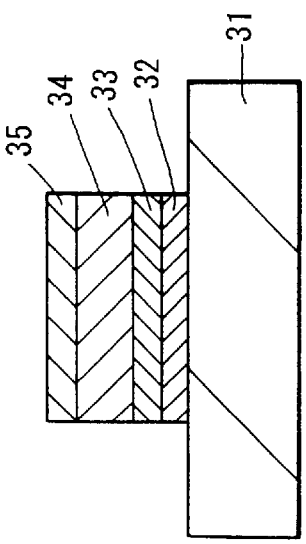

Next as shown in FIG. 8D, an inter-layer insulating film 37 is made on the entire surface. Then, a predetermined portion of the inter-layer insulating film 37 above the Ir film 25 is removed by etching to make a contact hole 37a. Subsequently, after an Al alloy film is made on the entire surface by sputtering, for example, it is patterned into a predetermined shape by etching to make a lead-out electrode 38.

Thus, the intended dielectric capacitor using the PNZT film as its dielectric film is completed.

Using a dielectric capacitor actually made by the above-explained process, a voltage was applied between the Si substrate 31 and the lead-out electrode 38, and its P-V hysteresis was measured. As a result, the value of 2Pr= 10~50 $\mu C/cm^2$ was obtained as the residual polarization value 2Pr. This value of 2Pr is a satisfactory value for a dielectric capacitor using a PNZT film, and it was obtained by measurement through the Si substrate 31. In contrast, as to a dielectric capacitor as large as 2 $\mu$m×2 $\mu$m actually prepared in the same manner as the conventional technique by first annealing and crystallizing the amorphous film 34 to obtain the PNZT film 36, then making the Ir film 35 on the PNZT film 36, and thereafter patterning the Ir film 35, PNZT film 36, Ir film 33 and $IrO_2$ film 32 by etching into the form of the dielectric capacitor, its residual polarization value 2Pr was 10 $\mu C/cm^2$ or less. These facts show that the residual polarization value 2Pr is remarkably improved in a dielectric capacitor using a PNZT film by employing the dielectric capacitor manufacturing method according to the invention.

According to the seventh embodiment, the same effects as those of the first embodiment are obtained when a dielectric capacitor using a PNZT film as its dielectric film is manufactured.

FIGS. 9A through 9D are cross-sectional views for explaining a dielectric capacitor manufacturing method according to the eighth embodiment of the invention.

In the dielectric capacitor manufacturing method according to the eighth embodiment, the $IrO_2$ film 32 and the Ir film 33 which make up the lower electrode, the amorphous film 34 as the precursor film of PNZT, and the Ir film 35 as the upper electrode are sequentially stacked on the Si substrate 31 as shown in FIG. 9A through the same steps as those of the seventh embodiment. After that, the Ir film 35 and the amorphous film 34 are patterned into the form of the dielectric capacitor as large as 2 $\mu$m×2 $\mu$m, for example, by RIE, for example. Next made on the entire surface is a $Y_2O_3$ film 39 as a protective coat by MOCVD, for example, so as to cover side walls of the Ir film 35 and the amorphous film 34 patterned into the form of the dielectric capacitor. The thickness of the $Y_2O_3$ film 39 is 30 nm, for example.

The amorphous film 34 patterned into the form of the dielectric capacitor, with its side walls being coated by the $Y_2O_3$ film 39, is next annealed in an oxygen atmosphere held in a normal pressure, for example, at 650° C., for example, for 30 minutes, such that the amorphous phase in the amorphous film 34 be changed into a crystal phase of a perovskite type crystalline structure to crystallize the amorphous film 34. As a result, as shown in FIG. 9B, the PNZT film 36 is obtained between the Ir film 33 and the Ir film 35. The PNZT film 36 is made up of a ferroelectric material of a perovskite type crystalline structure having the composition formula $Pb_{1.0-y}Nb_y(Zr_xTi_{1-x})_{1.0}O_3$ (where $0.1 \leq x \leq 0.6$, $0.03 \leq y \leq 0.30$).

Next as shown in FIG. 9C, the $Y_2O_3$ film 39, Ir film 33 and $IrO_2$ film 32 are patterned into a predetermined shape by etching to leave the $Y_2O_3$ film 39 on side walls of the Ir film 35 and the PNZT film 36.

Next as shown in FIG. 9D, an inter-layer insulating film 37 is made on the entire surface. After that, the inter-layer insulating film 37 and the $Y_2O_3$ film 39 are selectively removed by etching to make a contact hole 37a in a predetermined location above the Ir film 35. Then, an Al alloy film is made on the entire surface by sputtering, for example, and it is patterned into a predetermined shape by etching to form a lead-out electrode 38.

Through these steps, the intended dielectric capacitor using the PNZT film as its dielectric film is completed.

Using a dielectric capacitor actually made by the above-explained method, the leak current was measured by applying a voltage across the Si substrate 31 and the lead-out electrode 38. The measured value was $1 \times 10^{-8}$ $A/cm^2$ when the applied electric field was 300 kV/cm. This is a favorable value for a dielectric capacitor using a PNZT film. In contrast, as to a dielectric capacitor in which the PZT film 36 was made by annealing the amorphous film 34 without making the $Y_2O_3$ film 39, the leak current was $1 \times 10^{-6}$ $A/cm^2$ when the applied electric field was 300 kV/cm. These values show that the leak current characteristics of the dielectric capacitor using the PNZT film are remarkably improved by employing the dielectric capacitor manufacturing method according to the invention.

According to the eighth embodiment, the same effects as those of the third embodiment are obtained when manufacturing a dielectric capacitor using a PNZT film as its dielectric film.

Next explained are the ninth and tenth embodiments of the invention which apply a dielectric capacitor manufacturing method according to the invention to fabrication of a dielectric capacitor using a BST film as its dielectric film. In all of the drawings illustrating the ninth and tenth embodiments, identical or equivalent elements or parts are labeled with common reference numerals.

FIGS. 10A through 10D are cross-sectional views for explaining a dielectric capacitor manufacturing method according to the ninth embodiment of the invention.

Figure 10C:
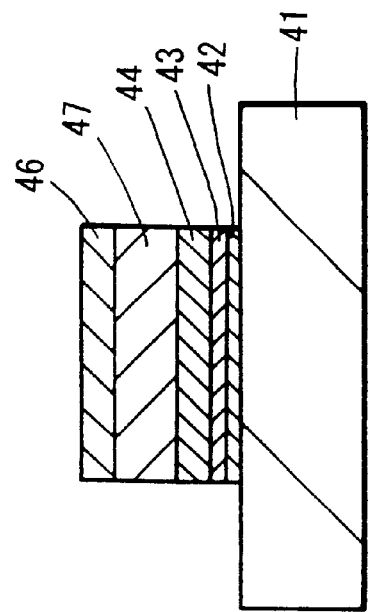
FIGS. 10A through 10D are cross-sectional views for explaining a dielectric capacitor manufacturing method according to the ninth embodiment of the invention.
Figure 10D:
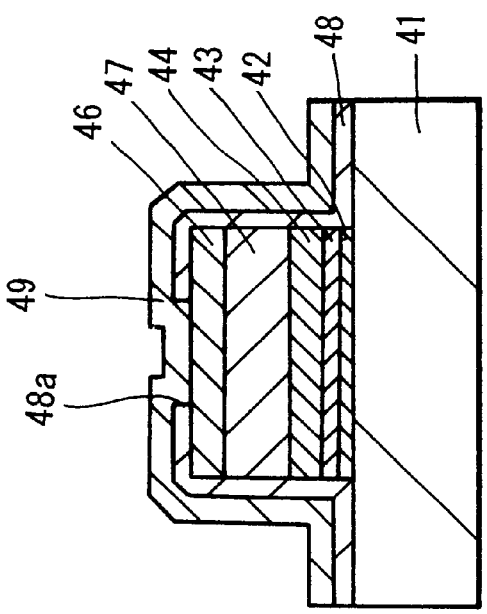
Figure 10A:
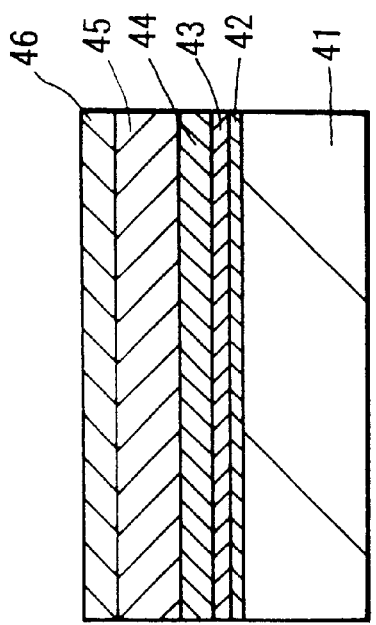

In the dielectric capacitor manufacturing method according to the ninth embodiment, first made on a conductive Si substrate 41 are a Ti film 42, TiN film 43 and $RuO_2$ film 44 as a lower electrode by sputtering, for example, under ordinary conditions as shown in FIG. 10A. The thickness of the Ti film 42 is 30 nm, for example, the thickness of the TiN film 44 is 50 nm, for example and the thickness of the $RuO_2$ film 44 is 100 nm, for example.

Next made on the $RuO_2$ film 44 is an amorphous film 45 as a precursor film of BST, which is made up of component elements of the finally obtained BST film, namely, Ba, Sr, Ti and O, by MOCVD, for example. More specifically, the Si substrate 41 having formed films up to the $RuO_2$ film 44 is set on a susceptor in a reaction chamber (film-making chamber) of a MOCVD apparatus, not shown, and heated to and held at a substrate temperature between 300° C. and 500° C. Meanwhile, a mixture containing predetermined ratios of organic metal source materials, $Ba(DMP)_2$, $Sr(DPM)_2$ and $Ti(i-OC_3H_7)_2(DPM)_2$ is vaporized. Then, a resulting gas is mixed with an argon carrier gas and, while their total flow amount is held in 1000 SCCM, they are mixed with oxygen gas in the flow amount of 1000 SCCM immediately before the reaction chamber. Thereafter, the mixed gas is introduced as a source material gas into the reaction chamber to make the film under a reaction gas pressure of 0.1 to 50 Torr. As a result, the amorphous film 45 is made as the precursor film of BST. The thickness of the amorphous film 45 is 50 nm, for example, and the atomic composition ratio is chosen to satisfy, for example, $0.1 \leq Sr/Ti \leq 1.0$ and $0 \leq Ba/Ti \leq 1.0$.

After that, made on the amorphous film 45 is a Ru film 46 as the upper electrode by sputtering, for example, under ordinary conditions. The thickness of the Ru film 46 is 50 nm, for example.

Figure 10B:
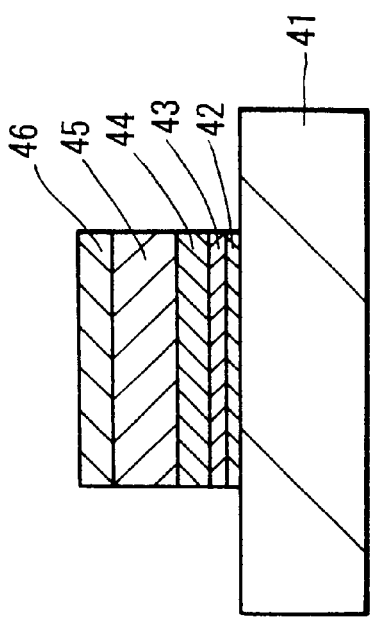

Next as shown in FIG. 10B, the Ti film 42, TiN film 43, RuO$_2$ film 44, amorphous film 45 and Ru film 46 are patterned by RIE, for example, into the form of a dielectric film as large as 1 µm×1 µm, for example.

Next, the amorphous film 45 patterned into the form of dielectric capacitor is annealed by RTA, for example, in an oxygen atmosphere held in a normal pressure, for example, at 700° C., for example, for 30 minutes, thereby to change the amorphous phase in the amorphous film 45 to a crystal phase of a perovskite type crystalline structure so as to crystallize the amorphous film 45. As a result, as shown in FIG. 10C, a BST film 47 is obtained between the RuO$_2$ film 44 and the Ru film 46. The BST film 47 is made up of a high-dielectric material of a perovskite type crystalline structure expressed by the composition formula $(Ba_xSr_{1-x})_{1.0}Ti_{1.0}O_3$ (where $0 \leq x \leq 1.0$)

Next as shown in FIG. 10D, an inter-layer insulating film 48 is made on the entire surface. Then, a predetermined portion of the inter-layer insulating film 48 above the Ru film 46 is removed by etching to make a contact hole 48a. Subsequently, after an Al alloy film is made on the entire surface by sputtering, for example, it is patterned into a predetermined shape by etching to make a lead-out electrode 49.

Thus, the intended dielectric capacitor using the BST film as its dielectric film is completed.

Using a dielectric capacitor actually made by the above-explained process, its dielectric constant ε was measured, and the value of ε=80~180 was obtained. This value of ε is a satisfactory value for a dielectric capacitor using a BST film. In contrast, as to a dielectric capacitor as large as 1 µm×1 µm actually prepared in the same manner as the conventional technique by first annealing and crystallizing the amorphous film 45 to obtain the BST film 47, then making the Ru film 46 on the BST film 47, and thereafter patterning the Ru film 46, BST film 47, RuO$_2$ film 44, TiN film 43 and Ti film 42 by etching into the form of the dielectric capacitor, its dielectric constant ε was 50 or less. These facts show that the dielectric constant ε is remarkably improved in a dielectric capacitor using a BST film by employing the dielectric capacitor manufacturing method according to the invention.

According to the ninth embodiment, the same effects as those of the first embodiment are obtained when a dielectric capacitor using a BST film as its dielectric film is manufactured.

FIGS. 11A through 11D are cross-sectional views for explaining a dielectric capacitor manufacturing method according to the tenth embodiment of the invention.

Figure 11A:
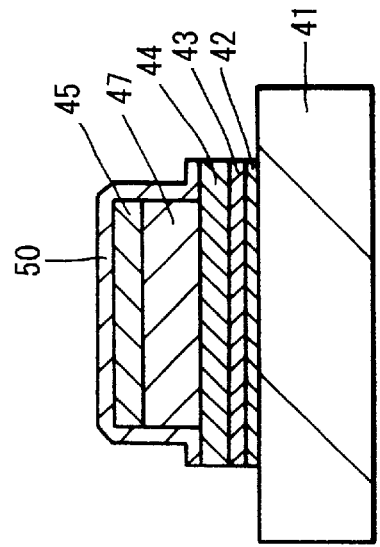
FIGS. 11A through 11D are cross-sectional views for explaining a dielectric capacitor manufacturing method according to the tenth embodiment of the invention.

In the dielectric capacitor manufacturing method according to the tenth embodiment, the Ti film 42, TiN film 43 and RuO$_2$ film 44, which all make up the lower electrode, the amorphous film 45 as the precursor film of BST, and the Ru film 46 as the upper electrode are sequentially stacked on the Si substrate 41 as shown in FIG. 11A through the same steps as those of the ninth embodiment. After that, the Ru film 46 and the amorphous film 45 are patterned into the form of the dielectric capacitor as large as 1 µm×1 µm, for example, by RIE, for example. In this case, the thickness of the amorphous film 45 is 100 nm, for example, and the thickness of the Ru film 46 is 100 nm, for example. Next made on the entire surface is a Y$_2$O$_3$ film 50 as a protective coat by MOCVD, for example, so as to cover side walls of the Ru film 46 and the amorphous film 45 patterned into the form of the dielectric capacitor. The thickness of the Y$_2$O$_3$ film 50 is 30 nm, for example.

The amorphous film 45 patterned into the form of the dielectric capacitor, with its side walls being coated by the Y$_2$O$_3$ film 50, is next annealed in an oxygen atmosphere held in a normal pressure, for example, by RTA, for example, at 750° C., for example, for 30 minutes, and again in an oxygen atmosphere held in a normal pressure at 600° C., for example, for 30 minutes, such that the amorphous phase in the amorphous film 45 be changed into a crystal phase of a perovskite type crystalline structure to crystallize the amorphous film 45. As a result, as shown in FIG. 11B, the BST film 47 is obtained between the RuO$_2$ film 44 and the Ru film 46. The BST film 47 is made up of a high-dielectric material of a perovskite type crystalline structure having the composition formula $(Ba_xSr_{1-x})_{1.0}Ti_{1.0}O_3$ (where $0 \leq x \leq 1.0$)

Figure 11C:
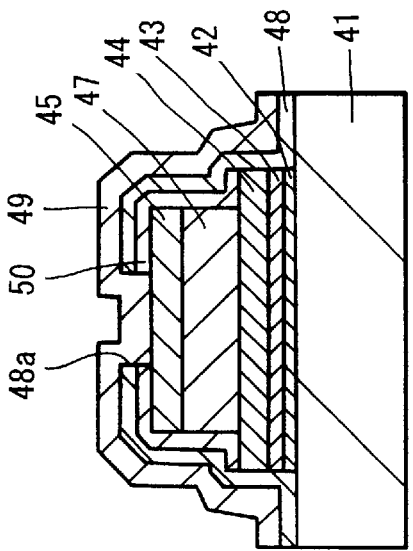
Figure 11B:
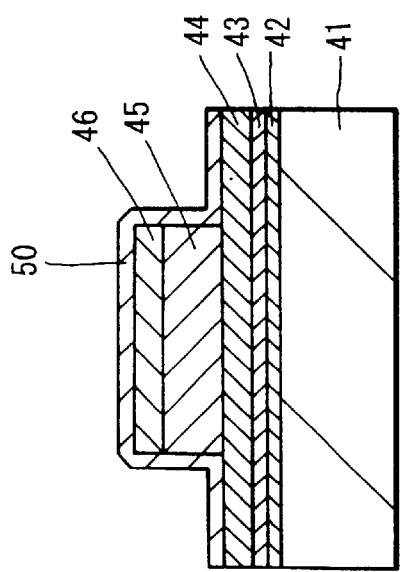

Next as shown in FIG. 11C, the Y$_2$O$_3$ film 50, RuO$_2$ film 44, TiN film 43 and Ti film 42 are patterned into a predetermined shape by etching to leave the Y$_2$O$_3$ film 50 on side walls of the Ru film 46 and the BST film 45.

Figure 11D:
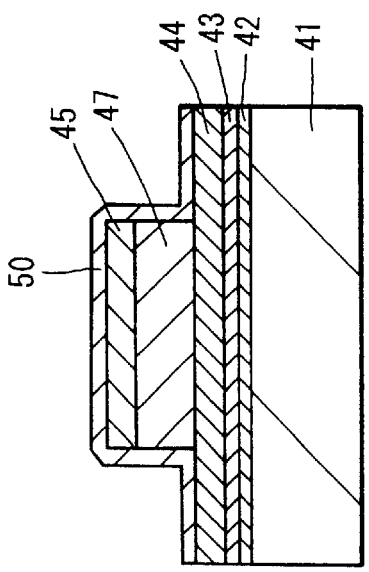

Next as shown in FIG. 11D, an inter-layer insulating film 48 is made on the entire surface. After that, the inter-layer insulating film 48 and the Y$_2$O$_3$ film 50 are selectively removed by etching to make a contact hole 48a in a predetermined location above the Ru film 46. Then, an Al alloy film is made on the entire surface by sputtering, for example, and it is patterned into a predetermined shape by etching to form a lead-out electrode 49.

Through these steps, the intended dielectric capacitor using the BST film as its dielectric film is completed.

Using a dielectric capacitor actually made by the above-explained method, the leak current was measured by applying a voltage across the Si substrate 41 and the lead-out electrode 49. The measured value was $5 \times 10^{-9}$ A/cm$^2$ when the applied electric field was 300 kV/cm. This is a favorable value for a dielectric capacitor using a BST film. In contrast, as to a dielectric capacitor in which the BST film 47 was made by annealing the amorphous film 45 without making the Y$_2$O$_3$ film 50, the leak current was $1 \times 10^{-7}$ A/cm$^2$ when the applied electric field was 300 kV/cm. These values show that the leak current characteristics of the dielectric capacitor using the BST film are remarkably improved by employing the dielectric capacitor manufacturing method according to the invention.

According to the tenth embodiment, the same effects as those of the third embodiment are obtained when manufacturing a dielectric capacitor using a BST film as its dielectric film.

Next explained are the eleventh to seventeenth embodiments of the invention which apply a dielectric capacitor manufacturing method according to the invention to fabrication of a dielectric capacitor using a SBTT film as its dielectric film. In all of the drawings illustrating the eleventh to seventeenth embodiments, identical or equivalent elements or components are labeled with common reference numerals.

FIGS. 12A through 12D are cross-sectional views for explaining a dielectric capacitor manufacturing method according to the eleventh embodiment of the invention.

In the dielectric capacitor manufacturing method according to the eleventh embodiment, as shown in FIG. 12A, first made on a conductive Si substrate 51 is a 300 nm thick SiO$_2$ film 52 by thermal oxidization, for example, and subsequently made thereon are a Ti film 53 and a Pt film 54 as the lower electrode sequentially by sputtering, for example, under ordinary conditions. The thickness of the Ti film 53 is 30 nm, for example, and the thickness of the Pt film 54 is 200 nm, for example.

Next made on the Pt film 54 is a fluorite film 55 as a precursor film of SBTT, which is made up of component elements of the finally obtained SBTT film, namely, Bi, Sr, Ta, Ti and O, by MOCVD, for example. More specifically, the Si substrate 51 having formed films up to the Pt film 54 is set on a susceptor in a reaction chamber (film-making chamber) of a MOCVD apparatus, not shown, and heated to and held at a substrate temperature between 400° C. and 650° C. Meanwhile, predetermined ratios of organic metal source materials, $Bi(o-C_7H_7)_3$, $Sr(THD)_2$, $Ta(i-OC_3H_7)5$, and $Ti(i-OC_3H_7)_4$, are mixed with argon carrier gas whose flow amount is set as 200 SCCM, 220 SCCM, 50 SCCM and 30 SCCM, respectively, and they are again mixed with oxygen gas, whose flow amount is 500 SCCM, immediately before the reaction chamber. Thereafter, the mixed gas is introduced as a source material gas into the reaction chamber to make the film under a reaction gas pressure of 1 to 10 Torr. As a result, the fluorite film 55 is made as the precursor film of SBTT. The thickness of the fluorite film 55 is 200 nm, for example, and the atomic composition ratio is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to 2Ti/Ta, the ratio is more preferably chosen to satisfy $0.1 \leq 2Ti/Ta \leq 1.0$.

After that, made on the fluorite film 55 is a Pt film 56 as an upper electrode by sputtering, for example, under ordinary conditions. The thickness of the Pt film 56 is 100 nm, for example.

Next as shown in FIG. 12B, the Pt film 56, fluorite film 55, Pt film 54 and Ti film 53 are patterned by RIE, for example, into the form of a dielectric film as large as $2 \mu m \times 2 \mu m$, for example.

Next, the fluorite film 55 patterned into the form of dielectric capacitor is annealed in an oxygen atmosphere held in a normal pressure, for example, at 750° C., for example, for one hour, thereby to change the fluorite phase in the fluorite film 55 to a crystal phase of a perovskite type crystalline structure so as to crystallize the fluorite film 55. As a result, as shown in FIG. 12C, a SBTT film 57 is obtained between the Pt film 54 and the Pt film 56. The SBTT film 57 is made up of a ferroelectric material of a Bi-layered structured perovskite type crystalline structure expressed by the composition formula $Sr_xBi_yTa_{2.0}Ti_zO_w$ (where $0.6 \leq x \leq 1.2$, $1.7 \leq y \leq 2.5$, $0 < z \leq 1.0$, $w = 9 \pm d$, $0 \leq d \leq 1.0$; preferably, $0.7 \leq x \leq 1.0$, $2.0 \leq y \leq 2.4$, $0.01 \leq 0.6 \leq z \leq 1.0$, $w = 9 \pm d$, $0 \leq d \leq 1.0$; and more preferably, $0.7 \leq x \leq 1.0$, $2.0 \leq y \leq 2.4$, $0.1 \leq z \leq 1.0$, $w = 9 \pm d$, $0 \leq d \leq 1$).

Next as shown in FIG. 12D, an inter-layer insulating film 58 is made on the entire surface. Then, a predetermined portion of the inter-layer insulating film 58 above the Pt film 56 is removed by etching to make a contact hole 58a. Subsequently, after an Al alloy film is made on the entire surface by sputtering, for example, it is patterned into a predetermined shape by etching to make a lead-out electrode 59.

Thus, the intended dielectric capacitor using the SBTT film as its dielectric film is completed.

Using a dielectric capacitor actually made by the above-explained process, a voltage was applied between the Si substrate 51 and the lead-out electrode 59, and its P-V hysteresis was measured. As a result, the value of $2Pr = 10 \sim 20 \mu C/cm^2$ was obtained as the residual polarization value 2Pr, and the value of $2Ec = 100 \sim 150$ kV/cm was obtained as the coercive force 2Ec. These values, 2Pr and 2Ec, are satisfactory values for a dielectric capacitor using a SBTT film, and they were obtained by measurement through the Si substrate 51. In contrast, as to a dielectric capacitor as large as $2 \mu m \times 2 \mu m$ actually prepared in the same manner as the conventional technique by first annealing and crystallizing the fluorite film 55 to obtain the SBTT film 57, then making the Pt film 56 on the SBTT film 57, and thereafter patterning the Pt film 56, SBTT film 57, Pt film 54 and Ti film 53 by etching into the form of the dielectric capacitor, its residual polarization value 2Pr was $10 \mu C/cm^2$ or less, and the coercive force 2Ec was 150 kV/cm. These facts show that the residual polarization value 2Pr and the coercive force 2Ec are remarkably improved in a dielectric capacitor using a SBTT film by employing the dielectric capacitor manufacturing method according to the invention.

Figure 13:
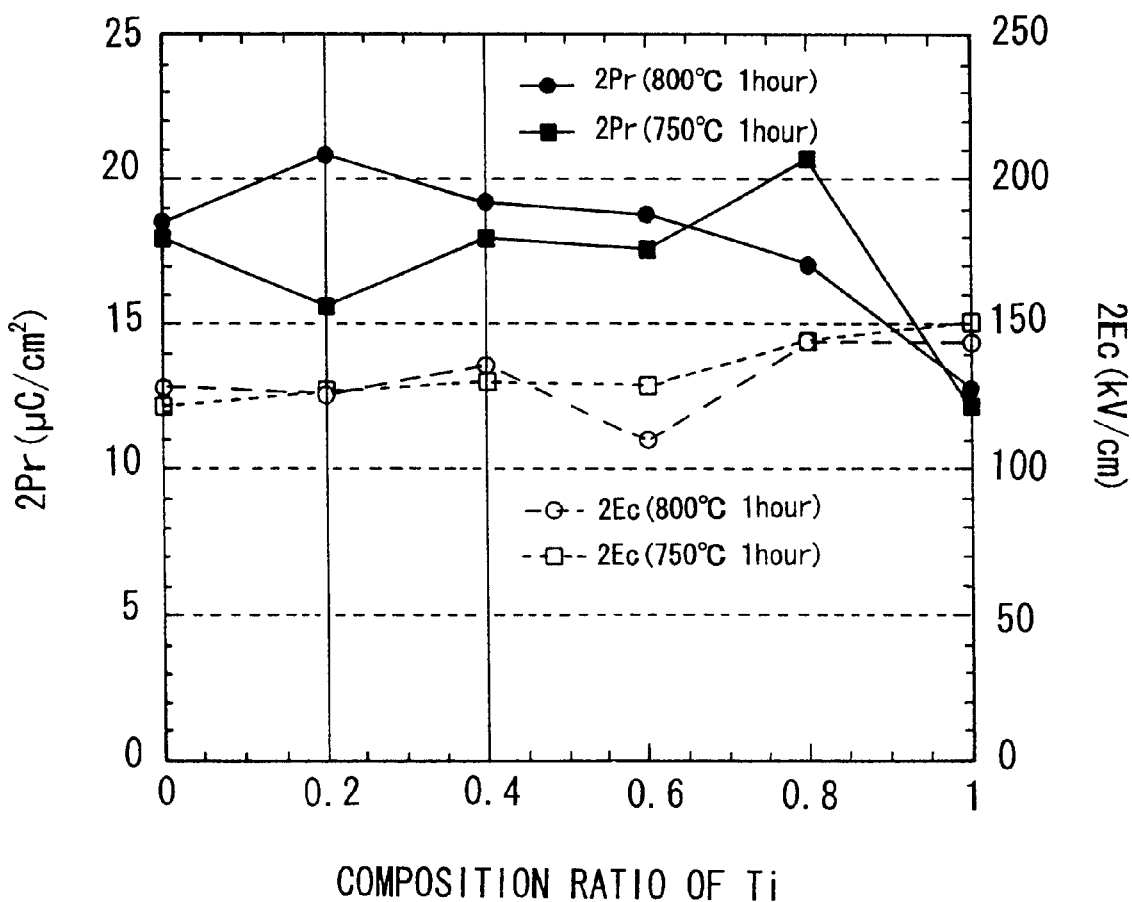
FIG. 13 is a schematic diagram showing dependency of the residual polarization value and the coercive force upon the added amount of Ti in a dielectric capacitor using the SBT film.

Additionally, the dielectric capacitor shown here is characterized in the use of the SBTT film forming its dielectric film, which contains Ti as one of its component elements. FIG. 13 shows dependency of the residual polarization value 2Pr and the coercive force 2Ec upon the added amount of Ti in a dielectric capacitor having the same construction as shown in FIG. 12D. In this case, however, the SBTT film (strictly, its precursor film) was made by sol-gel spin coating. In FIG. 13, the abscissa shows the composition ratio of Ti (expressed by its mole fraction in the source material solution) whereas the ordinate shows the residual polarization value 2Pr ($\mu C/cm^2$) and the coercive force 2Ec (kV/cm). When samples for the measurement was fabricated, the SBTT film was obtained by first making the precursor film of the SBTT film, then annealing it in an oxygen atmosphere held in a normal pressure at 750° C. or 800° C. for one hour prior to making the upper electrode, and again annealing it in an oxygen atmosphere at 750° C. or 800° C. for 10 minutes after making and patterning the upper electrode. Used as the SBTT film were those expressed by the composition formula $Sr_{0.8}Bi_{2.4}Ta_{2.0}Ti_zO_w$ (where $w = 9 \pm d$, $0 \leq d \leq 1.0$), changing the composition ratio z of Ti for every sample. Thicknesses were 150 nm of the $SiO_2$ film 52, 30 nm of the Ti film 53, 200 nm of the Pt film 54, 150 nm of the SBTT film 57, and 200 nm of the Pt film 56. It is understood from FIG. 13 that changes in mount of Ti in the SBTT film give almost no affection to the residual polarization value 2Pr and the coercive force 2Ec. In other words, it is known that, in a dielectric capacitor using a SBTT film, satisfactory values equivalent to those of a dielectric capacitor using a SBT film (z=o) are obtained as the residual polarization value 2Pr and the coercive force 2Ec, with any composition ratio z of Ti satisfying $0 \leq z \leq 1.0$.

Figure 14:
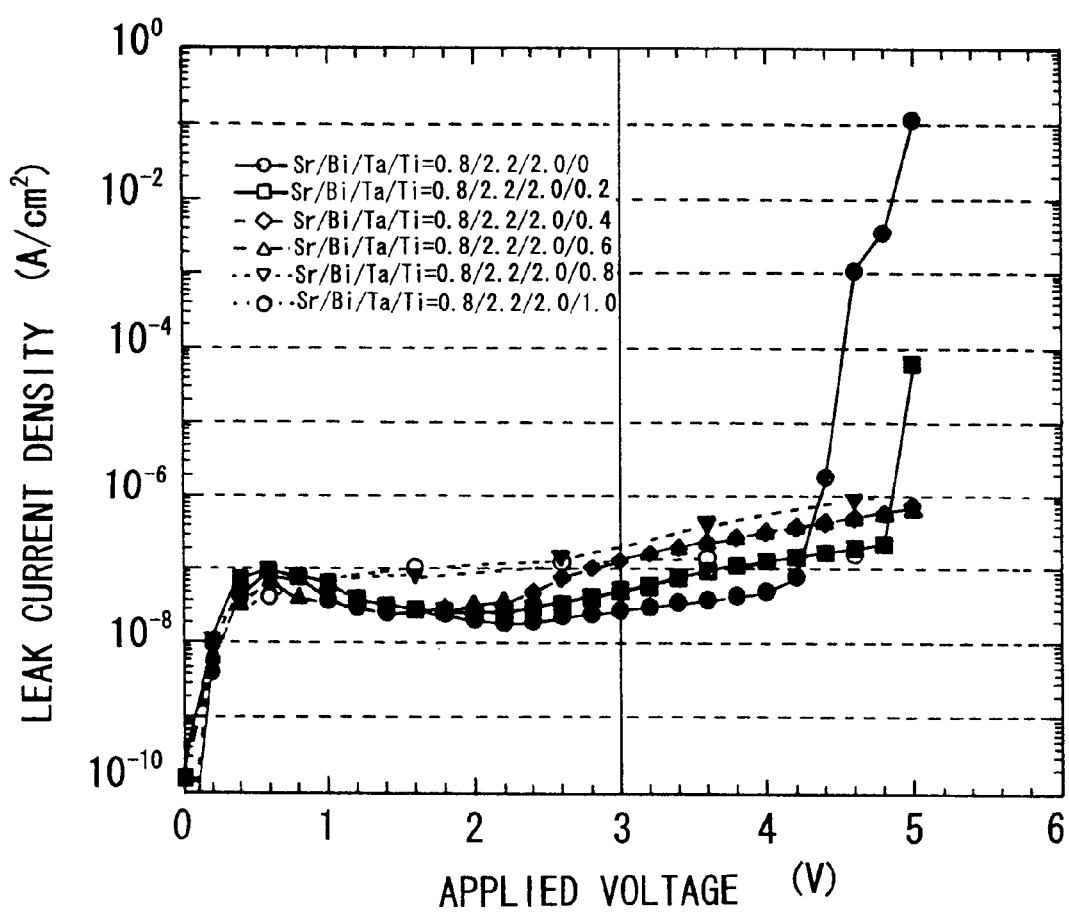
FIG. 14 is a schematic diagram showing dependency of the leak current density upon the added amount of Ti in a dielectric capacitor using the SBT film.

FIG. 14 shows a result of measurement of the leak current density obtained changing the amount of Ti in the SBTT film in a dielectric capacitor having the same construction as shown in FIG. 12D. In FIG. 14, the abscissa shows the applied voltage (V), and the ordinate shows the leak current density ($A/cm^2$). It is understood from FIG. 14 that the leak current density is reduced more in samples using as the dielectric film the SBTT film added with Ti than in samples using a SBT film without Ti (z=0), especially under high electric field. That is, it is understood that addition of Ti improves the leak current characteristics of a dielectric capacitor.

Figure 15:
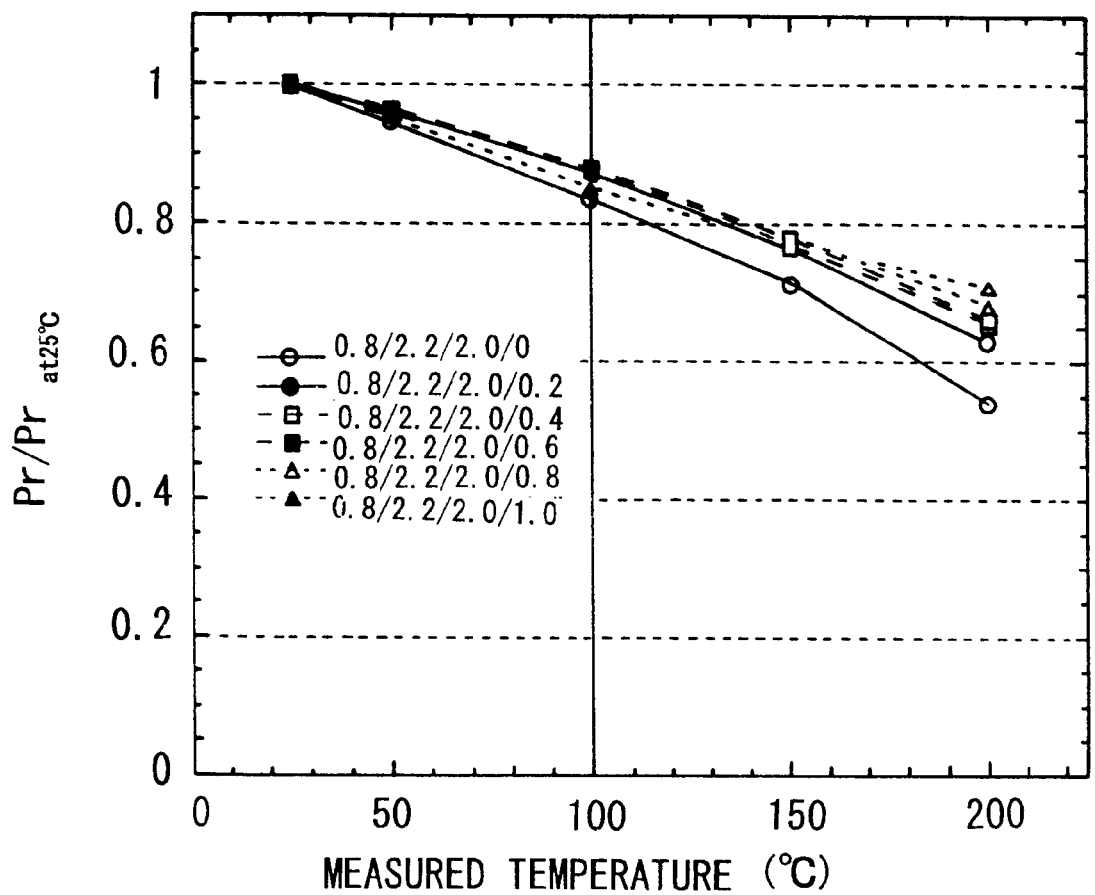
FIG. 15 is a schematic diagram showing dependency of temperature characteristics of the residual polarization value upon the added amount of Ti in a dielectric capacitor using the SBT film.

FIG. 15 shows dependency of temperature characteristics of the residual polarization value upon the amount of Ti in a dielectric capacitor having the same construction as shown in FIG. 12D. In FIG. 15, the abscissa shows the measured temperature (° C.), and the ordinate shows the Pr deceasing ratio (ratio of Pr at various temperatures relative to Pr at 25° C.). It is understood from FIG. 15 that the Pr decreasing ratio at high temperatures is smaller in samples using as the dielectric film the SBTT film added with Ti than in samples using a SBT film without Ti (z=0) and that addition of Ti improves the temperature characteristics of the residual polarization value of a dielectric capacitor.

Additionally, it has been confirmed through another experiment that the characteristics of the dielectric capacitor depend upon the thickness of the SBTT film 57. Therefore, although the thickness of the SBTT film 57 in the dielectric capacitor is typically chosen between 20 nm and 200 nm, it would be preferable to choose the thickness of the SBTT film between 20 nm and 100 nm from the viewpoint of obtaining better characteristics. When taking it into consideration that semiconductors go on toward a decrease in operating voltage along with a continuous progress of miniaturization of elements and devices, it would be more preferable to choose the thickness of the SBT film 6 between 30 nm and 80 nm.

As explained above, according to the eleventh embodiment, the same advantages as those of the first embodiment are obtained when a dielectric capacitor using a SBTT film as its dielectric film is manufactured. That is, when the dielectric capacitor is manufactured, using the SBTT film as its dielectric film, the lower electrode made up of the Ti film 53 and the Pt film 54, the fluorite film 55 as the precursor film of SBTT and the Pt film 56 as the upper electrode are formed sequentially, and they are patterned into the form of the dielectric capacitor by etching. Thereafter, the fluorite film 55 patterned into the form of the dielectric capacitor is annealed to change the fluorite phase in the fluorite film 55 into a crystal phase with the perovskite type crystalline structure and to thereby obtain the SBTT film 57 as the dielectric film. Therefore, crystal grains in the finally obtained SBTT film 57 are not damaged by etching, and the dielectric capacitor is effectively prevented from deterioration in residual polarization value 2Pr and coercive force 2Ec by etching. Thus, the invention has the advantage that the residual polarization value 2Pr and the coercive force 2Ec are significantly improved as compared with the conventional technique. As a result, a dielectric capacitor having good characteristics is realized even when the area of the dielectric capacitor is reduced to 10 $\mu m^2$ or less (in this example, 2 $\mu m \times 2$ $\mu m$).

Moreover, according to the eleventh embodiment, since the SBTT film containing Ti among its component elements is used as the dielectric film, the leak current characteristics and the temperature characteristics of he residual polarization value are improved as additional advantages of this embodiment.

FIGS. 16A through 16E are cross-sectional views for explaining a dielectric capacitor manufacturing method according to the twelfth embodiment of the invention.

In the dielectric capacitor manufacturing method according to the twelfth embodiment, the $SiO_2$ film 52 is made on the Si substrate 51, and the Ti film 53 and the Pt film 54 are stacked thereon as the lower electrode as shown in FIG. 16A through the same process as that of the eleventh embodiment.

Next made on the Pt film 54 is an amorphous film 60 as a precursor film of SBTT (strictly, a precursor film of the fluorite film 55), which is made up of component elements of the finally obtained SBTT film, namely, Bi, Sr, Ta, Ti and O, by MOCVD, for example. More specifically, the Si substrate 51 having formed films up to the Pt film 54 is set on a susceptor in a reaction chamber (film-making chamber) of a MOCVD apparatus, not shown, and heated to and held at a substrate temperature between 300° C. and 500° C. Meanwhile, a mixed solution is vaporized in a vaporizer held at 200° C., which mixed solution is made by mixing predetermined composition ratios of liquid sources dissolving predetermined concentrations of organic metal source materials, $Bi(C_6H_5)_3$, $Sr(THD)_2$, $Ta(i-OC_3H_7)_4THD$ and $Ti(i-OC_3H_7)_4$, into THF (tetrahydrofuran) solvent. Then, the resulting gas is mixed with argon carrier gas whose flow amount is 500 SCCM, and then mixed with oxygen gas in the flow amount of 50 SCCM just before the reaction chamber. Thereafter, the mixed gas is introduced as a source material gas into the reaction chamber to make the film under a reaction gas pressure of 1 to 10 Torr. As a result, the amorphous film 60 is made as the precursor film of SBTT. The thickness of the amorphous film 60 is 100 nm, for example, and the atomic composition ratio of the amorphous film 60 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to 2Ti/Ta, the ratio is more preferably chosen to satisfy $0.1 \leq 2Ti/Ta \leq 1.0$.

Next as shown in FIG. 16B, the amorphous film 60 is annealed in an oxygen atmosphere held in a normal pressure, for example, at 600° C., for example, for one hour to change the amorphous phase in the amorphous film 60 to the fluorite phase and thereby obtain the fluorite film 55 made up of Sr, Bi, Ta, Ti and O as the precursor film of SBTT. on the Pt film 54. The atomic composition ratio of the fluorite film 55 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to 2Ti/Ta, the ratio is more preferably chosen to satisfy $0.1 \leq 2Ti/Ta \leq 1.0$.

After that, as shown in FIG. 16C, made on the fluorite film 55 is a Pt film 56 as an upper electrode by sputtering, for example, under ordinary conditions. The thickness of the Pt film 56 is 100 nm, for example. Then, the Pt film 56, fluorite film 55, Pt film 54 and Ti film 53 are patterned by RIE, for example, into the form of a dielectric film as large as 2 $\mu m \times 2$ $\mu m$, for example.

Next, the fluorite film 55 patterned into the form of dielectric capacitor is annealed in an oxygen atmosphere held in a normal pressure, for example, at 750° C., for example, for ten minutes, thereby to change the fluorite phase in the fluorite film 55 to a crystal phase of a perovskite type crystalline structure so as to crystallize the fluorite film 55. As a result, as shown in FIG. 16D, the SBTT film 57 is obtained between the Pt film 54 and the Pt film 56. The SBTT film 57 is made up of a ferroelectric material of a Bi-layered structured perovskite type crystalline structure expressed by the composition formula $Sr_xBi_yTa_{2.0}Ti_zO_w$, (where $0.6 \leq x \leq 1.2$, $1.7 \leq y \leq 2.5$, $0 < z \leq 1.0$, $w = 9 \pm d$, $0 \leq d \leq 1.0$; preferably, $0.7 \leq x \leq 1.0$, $2.0 \leq y \leq 2.4$, $0.01 \leq z \leq 1.0$, $w = 9 \pm d$, $0 \leq d \leq 1.0$; and more preferably, $0.7 \leq x \leq 1.0$, $2.0 \leq y \leq 2.4$, $0.1 \leq z \leq 1.0$, $w = 9 \pm d$, $0 \leq d \leq 1$).

Next through the same steps as those of the eleventh embodiment, by making the inter-layer insulating film 58, contact hole 58a and lead-out electrode 59 as shown in FIG. 16E, the intended dielectric capacitor using the SBTT film as its dielectric film is completed.

Using a dielectric capacitor actually made by the above-explained process, its P-V hysteresis was measured in the same manner as the eleventh embodiment. As a result, the value of 2Pr=10~22 $\mu$C/cm$^2$ was obtained as the residual polarization value 2Pr, and the value of 2Ec=100~150 kV/cm was obtained as the coercive force 2Ec. These values, 2Pr and 2Ec, are satisfactory values for a dielectric capacitor using a SBTT film, and they were obtained by measurement through the Si substrate 51. In contrast, as to a dielectric capacitor as large as 2 $\mu$m×2 $\mu$m actually prepared in the same manner as the conventional technique by first annealing and crystallizing the fluorite film 55 to obtain the SBTT film 57, then making the Pt film 56 on the SBTT film 57, and thereafter patterning the Pt film 56, SBTT film 57, Pt film 54 and Ti film 53 by etching into the form of the dielectric capacitor, its residual polarization value 2Pr was 10 $\mu$C/cm$^2$ or less, and the coercive force 2Ec was 150 kV/cm. These facts show that the residual polarization value 2Pr and the coercive force 2Ec are remarkably improved in a dielectric capacitor using a SBTT film by employing the dielectric capacitor manufacturing method according to the invention.

As explained above, according to the twelfth embodiment, the same advantages as those of the eleventh embodiment are obtained.

FIGS. 17A through 17D are cross-sectional views for explaining a dielectric capacitor manufacturing method according to the thirteenth embodiment of the invention.

In the dielectric capacitor manufacturing method according to the thirteenth embodiment, as shown in FIG. 17A, first made on a conductive Si substrate 51 is a 300 nm thick SiO$_2$ film 52 by thermal oxidation, for example, and subsequently made thereon are an IrO$_2$ film 61 and an Ir film 62 as the lower electrode sequentially by sputtering, for example, under ordinary conditions. The thickness of the IrO$_2$ film 61 is 100 nm, for example, and the thickness of the Ir film 62 is 100 nm, for example.

Next made on the Ir film 62 is a fluorite film 55 as a precursor film of SBTT, which is made up of component elements of the finally obtained SBTT film, namely, Bi, Sr, Ta, Ti and O, by MOCVD, for example. More specifically, the Si substrate 51 having formed films up to the Ir film 62 is set on a susceptor in a reaction chamber (film-making chamber) of a MOCVD apparatus, not shown, and heated to and held at a substrate temperature between 400° C. and 650° C. Meanwhile, predetermined ratios of organic metal source materials, Bi(o-C$_7$H$_7$)$_3$, Sr(THD)$_2$, Ta(i-OC$_3$H$_7$)5, and Ti(i-OC$_3$H$_7$)$_4$, are mixed with argon carrier gas whose flow amount is set as 200 SCCM, 230 SCCM, 50 SCCM and 20 SCCM, respectively, and they are again mixed with oxygen gas, whose flow amount is 500 SCCM, immediately before the reaction chamber. Thereafter, the mixed gas is introduced as a source material gas into the reaction chamber to make the film under a reaction gas pressure of 1 to 10 Torr. As a result, the fluorite film 55 is made as the precursor film of SBTT. The thickness of the fluorite film 55 is 200 nm, for example, and the atomic composition ratio is chosen to satisfy, for example, 0.6≦2Sr/Ta≦1.2, 1.7≦2Bi/Ta≦2.5 and 0<2Ti/Ta≦1.0. Preferably, it is chosen to satisfy, for example, 0.7≦2Sr/Ta≦1.0, 2.0≦2Bi/Ta≦2.4 and 0.01≦2Ti/Ta≦1.0. As to 2Ti/Ta, the ratio is more preferably chosen to satisfy 0.1≦2Ti/Ta≦1.0.

After that, made on the fluorite film 55 is an Ir film 63 as an upper electrode by sputtering, for example, under ordinary conditions. The thickness of the Ir film 63 is 100 nm, for example.

Next as shown in FIG. 17B, the Ir film 63, fluorite film 55, Ir film 62 and IrO$_2$ film 61 are patterned by RIE, for example, into the form of a dielectric film as large as 2 $\mu$m×2 $\mu$m, for example.

Next, the fluorite film 55 patterned into the form of dielectric capacitor is annealed in an oxygen atmosphere held in a normal pressure, for example, at 700° C., for example, for 30 minutes, thereby to change the fluorite phase in the fluorite film 55 to a crystal phase of a perovskite type crystalline structure so as to crystallize the fluorite film 55. As a result, as shown in FIG. 17C, a SBTT film 57 is obtained between the Ir film 62 and the Ir film 63. The SBTT film 57 is made up of a ferroelectric material of a Bi-layered structured perovskite type crystalline structure expressed by the composition formula Sr$_x$Bi$_y$Ta$_{2.0}$Ti$_z$O$_w$ (where 0.6≦x≦1.2, 1.7≦y≦2.5, 0<z≦1.0, w=9±d, 0≦d≦1.0; preferably, 0.7≦x≦1.0, 2.0≦y≦2.4, 0.01≦z≦1.0, w=9±d, 0≦d≦1.0; and more preferably, 0.7≦x≦1.0, 2.0≦y≦2.4, 0.1≦z≦1.0, w=9±d, 0≦d≦1).

Next through the same steps as those of the eleventh embodiment, by making the inter-layer insulating film 58, contact hole 58a and lead-out electrode 59 as shown in FIG. 17D, the intended dielectric capacitor using the SBTT film as its dielectric film is completed.

Using a dielectric capacitor actually made by the above-explained process, its P-V hysteresis was measured in the same manner as the eleventh embodiment. As a result, the value of 2Pr=10~20 $\mu$C/cm$^2$ was obtained as the residual polarization value 2Pr, and the value of 2Ec=100~150 kV/cm was obtained as the coercive force 2Ec. These values, 2Pr and 2Ec, are satisfactory values for a dielectric capacitor using a SBTT film, and they were obtained by measurement through the Si substrate 51. In contrast, as to a dielectric capacitor as large as 2 $\mu$m×2 $\mu$m actually prepared in the same manner as the conventional technique by first annealing and crystallizing the fluorite film 55 to obtain the SBTT film 57, then making the Ir film 63 on the SBTT film 57, and thereafter patterning the Ir film 63, SBTT film 57, Ir film 62 and IrO$_2$ film 61 by etching into the form of the dielectric capacitor, its residual polarization value 2Pr was 10 $\mu$C/cm$^2$ or less, and the coercive force 2Ec was 150 kV/cm. These facts show that the residual polarization value 2Pr and the coercive force 2Ec are remarkably improved in a dielectric capacitor using a SBTT film by employing the dielectric capacitor manufacturing method according to the invention.

As explained above, according to the thirteenth embodiment, the same advantages as those of the eleventh embodiment are obtained.

FIGS. 18A through 18E are cross-sectional views for explaining a dielectric capacitor manufacturing method according to the fourteenth embodiment of the invention.

Figure 18D:
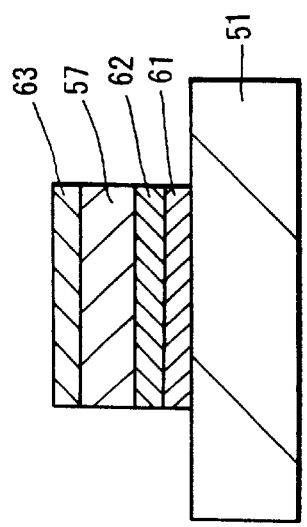
FIGS. 18A through 18E are cross-sectional views for explaining a dielectric capacitor manufacturing method according to the fourteenth embodiment of the invention.
Figure 18E:
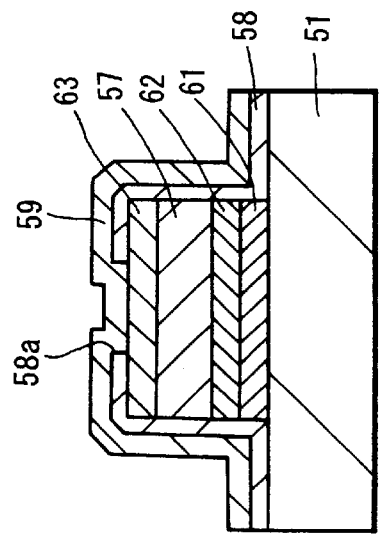
Figure 18A:
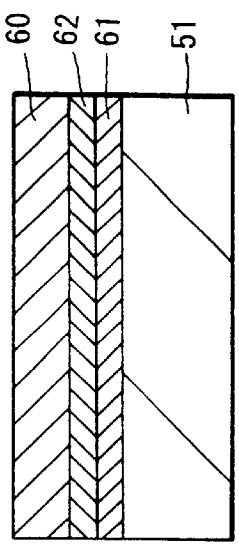

In the dielectric capacitor manufacturing method according to the fourteenth embodiment, the IrO$_2$ film 61 and the Ir film 62 are made on the Si substrate 51 as the lower electrode as shown in FIG. 18A through the same process as that of the thirteenth embodiment. Next made on the Ir film 62 is an amorphous film 60 as a precursor film of SBTT, which is made up of component elements of the finally obtained SBTT film, namely, Bi, Sr, Ta, Ti and O, by MOCVD, for example. More specifically, the Si substrate 51 having formed films up to the Ir film 62 is set on a susceptor in a reaction chamber (film-making chamber) of a MOCVD apparatus, not shown, and heated to and held at a substrate temperature between 300° C. and 500° C. Meanwhile, a mixed solution is vaporized in a vaporizer held at 200° C., which mixed solution is made by mixing predetermined composition ratios of liquid sources dissolving predetermined concentrations of organic metals source materials, Bi(C$_6$H$_5$)$_3$, Sr(THD)$_2$, Ta(i-OC$_3$H$_7$)$_4$THD and Ti(i-OC$_3$H$_7$)$_4$, into THF (tetrahydrofuran) solvent. Then, the resulting gas is mixed with argon carrier gas whose flow amount is 500 SCCM, and then mixed with oxygen gas in the flow amount of 50 SCCM just before the reaction chamber. Thereafter, the mixed gas is introduced as a source material gas into the reaction chamber to make the film under a reaction gas pressure of 1 to 10 Torr. As a result, the amorphous film 60 is made as the precursor film of SBTT. The thickness of the amorphous film 60 is 100 nm, for example, and the atomic composition ratio of the amorphous film 60 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to $2Ti/Ta$, the ratio is more preferably chosen to satisfy $0.1 \leq 2Ti/Ta \leq 1.0$.

Figure 18B:
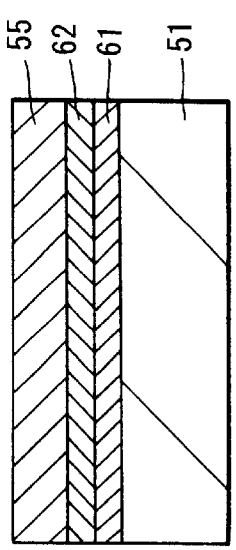

Next as shown in FIG. 18B, the amorphous film 60 is annealed in an oxygen atmosphere held in a normal pressure, for example, at 600° C., for example, for one hour to change the amorphous phase in the amorphous film 60 to the fluorite phase and thereby obtain the fluorite film 55 made up of Sr, Bi, Ta, Ti and O as the precursor film of SBTT on the Ir film 62. The atomic composition ratio of the fluorite film 55 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to $2Ti/Ta$, the ratio is more preferably chosen to satisfy $0.1 \leq 2Ti/Ta \leq 1.0$.

Figure 18C:
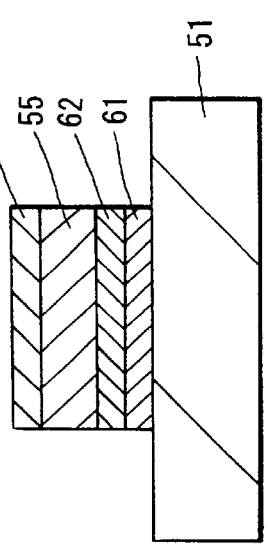

After that, as shown in FIG. 18C, made on the fluorite film 55 is a 100 nm thick Ir film 63 as an upper electrode by sputtering, for example, under ordinary conditions. Then, the Ir film 63, fluorite film 55, Ir film 62 and $IrO_2$ film 61 are patterned by RIE, for example, into the form of a dielectric film as large as 2 $\mu m \times 2$ $\mu m$, for example.

Next, the fluorite film 55 patterned into the form of dielectric capacitor is annealed in an oxygen atmosphere held in a normal pressure, for example, at 750° C., for example, for ten minutes, thereby to change the fluorite phase in the fluorite film 55 to a crystal phase of a perovskite type crystalline structure so as to crystallize the fluorite film 55. As a result, as shown in FIG. 18D, the SBTT film 57 is obtained between the $IrO_2$ film 62 and the Ir film 63. The SBTT film 57 is made up of a ferroelectric material of a Bi-layered structured perovskite type crystalline structure expressed by the composition formula $Sr_xBi_yTa_{2.0}Ti_zO_w$, (where $0.6 \leq x \leq 1.2$, $1.7 \leq y \leq 2.5$, $0 < z \leq 1.0$, $w = 9 \pm d$, $0 \leq d \leq 1.0$; preferably, $0.7 \leq x \leq 1.0$, $2.0 \leq y \leq 2.4$, $0.01 \leq z \leq 1.0$, $w = 9 \pm d$, $0 \leq d \leq 1.0$; and more preferably, $0.7 \leq x \leq 1.0$, $2.0 \leq y \leq 2.4$, $0.1 \leq z \leq 1.0$, $w = 9 \pm d$, $0 \leq d \leq 1$).

Next through the same steps as those of the eleventh embodiment, by making the inter-layer insulating film 58, contact hole 58a and lead-out electrode 59 as shown in FIG. 18E, the intended dielectric capacitor using the SBTT film as its dielectric film is completed.

Using a dielectric capacitor actually made by the above-explained process, its P-V hysteresis was measured in the same manner as the eleventh embodiment. As a result, the value of 2Pr=10~22 $\mu C/cm^2$ was obtained as the residual polarization value 2Pr, and the value of 2Ec=100~150 kV/cm was obtained as the coercive force 2Ec. These values, 2Pr and 2Ec, are satisfactory values for a dielectric capacitor using a SBTT film, and they were obtained by measurement through the Si substrate 51. In contrast, as to a dielectric capacitor as large as 2 $\mu m \times 2$ $\mu m$ actually prepared in the same manner as the conventional technique by first annealing and crystallizing the fluorite film 55 to obtain the SBTT film 57, then making the Ir film 63 on the SBTT film 57, and thereafter patterning the Ir film 63, SBTT film 57, Ir film 62 and $IrO_2$ film 61 by etching into the form of the dielectric capacitor, its residual polarization value 2Pr was 10 $\mu C/cm^2$ or less, and the coercive force 2Ec was 150 kV/cm. These facts show that the residual polarization value 2Pr and the coercive force 2Ec are remarkably improved in a dielectric capacitor using a SBTT film by employing the dielectric capacitor manufacturing method according to the invention.

As explained above, according to the fourteenth embodiment, the same advantages as those of the eleventh embodiment are obtained.

FIGS. 19A through 19E are cross-sectional views for explaining a dielectric capacitor manufacturing method according to the fifteenth embodiment of the invention.

In the dielectric capacitor manufacturing method according to the fifteenth embodiment, the $IrO_2$ film 61 and an $Ir_{0.7}Ru_{0.3}$ film 64 are made sequentially on the Si substrate 51 as sown in FIG. 19A by sputtering, for example, under ordinary conditions. The thickness of the $IrO_2$ film 61 is 100 nm, for example, and the thickness of the $IrO_{0.7}Ru_{0.3}$ film 64 is 100 nm, for example.

Next made on $IrO_{0.7}Ru_{0.3}$ film 64 is an amorphous film 60 as a precursor film of SBTT (strictly, a precursor film of the fluorite film 55), which is made up of component elements of the finally obtained SBTT film, namely, Bi, Sr, Ta, Ti and O, by MOCVD, for example. More specifically, the Si substrate 51 having formed films up to the $IrO_{0.7}Ru_{0.3}$ film 64 is set on a susceptor in a reaction chamber (film-making chamber) of a MOCVD apparatus, not shown, and heated to and held at a substrate temperature between 300° C. and 500° C. Meanwhile, a mixed solution is vaporized in a vaporizer held at 200° C., which mixed solution is made by mixing predetermined composition ratios of liquid sources dissolving predetermined concentrations of organic metal source materials, $Bi(C_6H_5)_3$, $Sr(THD)_2$, $Ta(i-OC_3H_7)_4THD$ and $Ti(i-OC_3H_7)_4$, into THF (tetrahydrofuran) solvent. Then, the resulting gas is mixed with argon carrier gas whose flow amount is 500 SCCM, and then mixed with oxygen gas in the flow amount of 50 SCCM just before the reaction chamber. Thereafter, the mixed gas is introduced as a source material gas into the reaction chamber, in which RF plasma of the power 100 W, for example, is discharged, to make the film under a reaction gas pressure of 0.5 to 10 Torr. As a result, the amorphous film 60 is made as the precursor film of SBTT. The thickness of the amorphous film 60 is 100 nm, for example, and the atomic composition ratio of the amorphous film 60 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to $2Ti/Ta$, the ratio is more preferably chosen to satisfy $0.1 \leq 2Ti/Ta \leq 1.0$.

Next as shown in FIG. 19B, the amorphous film 60 is annealed in an oxygen atmosphere held in a normal pressure, for example, at 600° C., for example, for one hour to change the amorphous phase in the amorphous film 60 to the fluorite phase and thereby obtain the fluorite film 55 made up of Sr, Bi, Ta, Ti and O as the precursor film of SBTT. on the Pt film 54. The atomic composition ratio of the fluorite film 55 is chosen to satisfy, for example, $0.6 \leq 2Sr/Ta \leq 1.2$, $1.7 \leq 2Bi/Ta \leq 2.5$ and $0 < 2Ti/Ta \leq 1.0$. Preferably, it is chosen to satisfy, for example, $0.7 \leq 2Sr/Ta \leq 1.0$, $2.0 \leq 2Bi/Ta \leq 2.4$ and $0.01 \leq 2Ti/Ta \leq 1.0$. As to $2Ti/Ta$, the ratio is more preferably chosen to satisfy $0.1 \leq 2Ti/Ta \leq 1.0$.

After that, as shown in FIG. 19C, made on the fluorite film 55 is a 100 nm thick $Ir_{0.7}Ru_{0.3}$ film 65 as an upper electrode by sputtering, for example, under ordinary conditions. Then, the IrO$_{0.7}$Ru$_{0.3}$ film 65, fluorite film 55, Ir$_{0.7}$Ru$_{0.3}$ film 64 and IrO$_2$ film 61 are patterned by RIE, for example, into the form of a dielectric film as large as 2 μm×2 μm, for example.

Next, the fluorite film 55 patterned into the form of dielectric capacitor is annealed in an oxygen atmosphere held in a normal pressure, for example, at 750° C., for example, for ten minutes, thereby to change the fluorite phase in the fluorite film 55 to a crystal phase of a perovskite type crystalline structure so as to crystallize the fluorite film 55. As a result, as shown in FIG. 19D, the SBTT film 57 is obtained between the IrO$_{0.7}$Ru$_{0.3}$ film 64 and the IrO$_{0.7}$Ru$_{0.3}$ film 65. The SBTT film 57 is made up of a ferroelectric material of a Bi-layered structured perovskite type crystalline structure expressed by the composition formula Sr$_x$Bi$_y$Ta$_{2.0}$Ti$_z$O$_w$ (where $0.6 \leq x \leq 1.2$, $1.7 \leq y \leq 2.5$, $0 < z \leq 1.0$, $w=9\pm d$, $0 \leq d \leq 1.0$; preferably, $0.7 \leq x \leq 1.0$, $2.0 \leq y \leq 2.4$, $0.01 \leq z \leq 1.0$, $w=9\pm d$, $0 \leq d \leq 1.0$; and more preferably, $0.7 \leq x \leq 1.0$, $2.0 \leq y \leq 2.4$, $0.1 \leq z \leq 1.0$, $w=9\pm d$, $0 \leq d \leq 1$).

Next through the same steps as those of the eleventh embodiment, by making the inter-layer insulating film 58, contact hole 58a and lead-out electrode 59 as shown in FIG. 19E, the intended dielectric capacitor using the SBTT film as its dielectric film is completed.

Using a dielectric capacitor actually made by the above-explained process, its P-V hysteresis was measured in the same manner as the eleventh embodiment. As a result, the value of 2Pr=5~18 μC/cm$^2$ was obtained as the residual polarization value 2Pr, and the value of 2Ec=100~20 kV/cm was obtained as the coercive force 2Ec. These values, 2Pr and 2Ec, are satisfactory values for a dielectric capacitor using a SBTT film made by MOCVD as explained above, and they were obtained by measurement through the Si substrate 51. In contrast, as to a dielectric capacitor as large as 2 μm×2 μm actually prepared in the same manner as the conventional technique by first annealing and crystallizing the fluorite film 55 to obtain the SBTT film 57, then making the IrO$_{0.7}$Ru$_{0.3}$ film 65 on the SBTT film 57, and thereafter patterning the IrO$_{0.7}$Ru$_{0.3}$ film 65, SBTT film 57, IrO$_{0.7}$Ru$_{0.3}$ film 64 and IrO$_2$ film 61 by etching into the form of the dielectric capacitor, its residual polarization value 2Pr was 5 μC/cm$^2$ or less, and the coercive force 2Ec was 200 kV/cm. These facts show that the residual polarization value 2Pr and the coercive force 2Ec are remarkably improved in a dielectric capacitor using a SBTT film by employing the dielectric capacitor manufacturing method according to the invention.

FIGS. 20A through 20E are cross-sectional views for explaining a dielectric capacitor manufacturing method according to the sixteenth embodiment of the invention.

In the dielectric capacitor manufacturing method according to the sixteenth embodiment, a 100 nm thick IrO$_2$ film 61 and a 20 nm thick Ir film 62 are made on the Si substrate 51 as the lower electrode as shown in FIG. 20A through the same process as that of the thirteenth embodiment.

Next made on the Ir film 62 is an amorphous film 66 as a precursor film of SBTT, which is made up of component elements of the finally obtained SBTT film, namely, Bi, Sr, Ta, Ti, Nb and O, by MOCVD, for example. More specifically, the Si substrate 51 having formed films up to the Ir film 62 is set on a susceptor in a reaction chamber (film-making chamber) of a MOCVD apparatus, not shown, and heated to and held at a substrate temperature between 300° C. and 500° C. Meanwhile, a mixed solution is vaporized in a vaporizer held at 200° C., which mixed solution is made by mixing predetermined composition ratios of liquid sources dissolving predetermined concentrations of organic metal source materials, Bi(C$_6$H$_5$)$_3$, Sr(THD)$_2$, Ta(i-OC$_3$H$_7$)$_4$THD, Nb(i-OC$_3$H$_7$)$_4$THD and Ti(i-OC$_3$H$_7$)$_4$THD, into THF (tetrahydrofuran) solvent. Then, the resulting gas is mixed with argon carrier gas whose flow amount is 500 SCCM, and then mixed with oxygen gas in the flow amount of 50 SCCM just before the reaction chamber. Thereafter, the mixed gas is introduced as a source material gas into the reaction chamber to make the film under a reaction gas pressure of 1 to 10 Torr. As a result, the amorphous film 66 is made as the precursor film of SBTT. The thickness of the amorphous film 66 is 100 nm, for example, and the atomic composition ratio of the amorphous film 66 is chosen to satisfy, for example, $0.6 \leq 2Sr/(Ta+Nb) \leq 1.2$, $1.7 \leq 2Bi/(Ta+Nb) \leq 2.5$ and $0 < 2Ti/(Ta+Nb) \leq 1.0$. Preferably, it is chosen to satisfy, for example, $0.7 \leq 2Sr/(Ta+Nb) \leq 1.0$, $2.0 \leq 2Bi/(Ta+Nb) \leq 2.4$ and $0.01 \leq 2Ti/(Ta+Nb) \leq 1.0$. As to $2Ti/(Ta+Nb)$, the ratio is more preferably chosen to satisfy $0.1 \leq 2Ti/(Ta+Nb) \leq 1.0$.

Next as shown in FIG. 20B, the amorphous film 66 is annealed in an oxygen atmosphere held in a normal pressure, for example, at 600° C., for example, for one hour to change the amorphous phase in the amorphous film 66 to the fluorite phase and thereby obtain a fluorite film 67 made up of Sr, Bi, Ta, Nb, Ti and O as the precursor film of SBTT on the Ir film 62. The atomic composition ratio of the fluorite film 67 is chosen to satisfy, for example, $0.6 \leq 2Sr/(Ta+Nb) \leq 1.2$, $1.7 \leq 2Bi/(Ta+Nb) \leq 2.5$ and $0 < 2Ti/(Ta+Nb) \leq 1.0$. Preferably, it is chosen to satisfy, for example, $0.7 \leq 2Sr/(Ta+Nb) \leq 1.0$, $2.0 \leq 2Bi/(Ta+Nb) \leq 2.4$ and $0.01 \leq 2Ti/(Ta+Nb) \leq 1.0$. As to $2Ti/(Ta+Nb)$, the ratio is more preferably chosen to satisfy $0.1 \leq 2Ti/(Ta+Nb) \leq 1.0$.

After that, as shown in FIG. 20C, made on the fluorite film 67 is a 100 nm thick Ir film 63 as an upper electrode by sputtering, for example, under ordinary conditions. Then, the Ir film 63, fluorite film 67, Ir film 62 and IrO$_2$ film 61 are patterned by RIE, for example, into the form of a dielectric film as large as 2 μm×2 μm, for example.

Next, the fluorite film 67 patterned into the form of dielectric capacitor is annealed in an oxygen atmosphere held in a normal pressure, for example, at 750° C., for example, for ten minutes, thereby to change the fluorite phase in the fluorite film 67 to a crystal phase of a perovskite type crystalline structure so as to crystallize the fluorite film 67. As a result, as shown in FIG. 20D, a SBTT film 68 is obtained between the IrO$_2$ film 62 and the Ir film 63. The SBTT film 68 is made up of a ferroelectric material of a Bi-layered structured perovskite type crystalline structure expressed by the composition formula Sr$_x$Bi$_y$(Ta,Nb)$_{2.0}$Ti$_z$O$_w$ (where $0.6 \leq x \leq 1.2$, $1.7 \leq y \leq 2.5$, $0 < z \leq 1.0$, $w=9\pm d$, $0 \leq d \leq 1.0$; preferably, $0.7 \leq x \leq 1.0$, $2.0 \leq y \leq 2.4$, $0.01 \leq z \leq 1.0$, $w=9\pm d$, $0 \leq d \leq 1.0$; and more preferably, $0.7 \leq x \leq 1.0$, $2.0 \leq y \leq 2.4$, $0.1 \leq z \leq 1.0$, $w=9\pm d$, $0 \leq d \leq 1$).

Next through the same steps as those of the eleventh embodiment, by making the inter-layer insulating film 58, contact hole 58a and lead-out electrode 59 as shown in FIG. 20E, the intended dielectric capacitor using the SBTT film as its dielectric film is completed.

Using a dielectric capacitor actually made by the above-explained process, its P-V hysteresis was measured in the same manner as the eleventh embodiment. As a result, the value of 2Pr=10~25 μC/cm$^2$ was obtained as the residual polarization value 2Pr, and the value of 2Ec=100~250 kV/cm was obtained as the coercive force 2Ec. These values, 2Pr and 2Ec, are satisfactory values for a dielectric capacitor using a SBTT film made up of Bi, Sr, Ta, Nb, Ti and O, and they were obtained by measurement through the Si substrate 51. In contrast, as to a dielectric capacitor as large as 2 μm×2 μm actually prepared in the same manner as the conventional technique by first annealing and crystallizing the fluorite film 67 to obtain the SBTT film 68, then making the Ir film 63 on the SBTT film 68, and thereafter patterning the Ir film 63, SBTT film 68, Ir film 62 and $IrO_2$ film 61 by etching into the form of the dielectric capacitor, its residual polarization value 2Pr was 10 μC/cm² or less, and the coercive force 2Ec was 250 kV/cm. These facts show that the residual polarization value 2Pr and the coercive force 2Ec are remarkably improved in a dielectric capacitor using a SBTT film by employing the dielectric capacitor manufacturing method according to the invention.

As explained above, according to the sixteenth embodiment, the same advantages as those of the eleventh embodiment are obtained.

FIGS. 21A through 21D are cross-sectional views for explaining a dielectric capacitor manufacturing method according to the seventeenth embodiment of the invention.

Figure 21A:
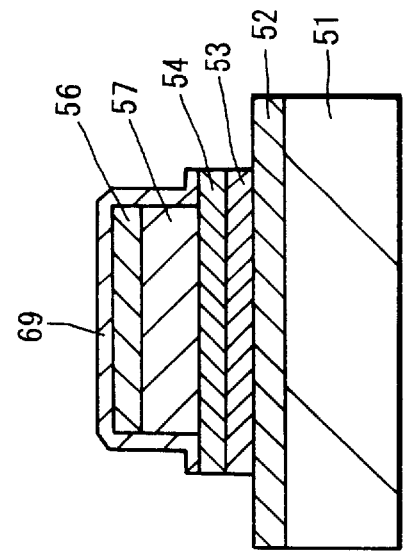
FIGS. 21A through 21D are cross-sectional views for explaining a dielectric capacitor manufacturing method according to the seventeenth embodiment of the invention.

In the dielectric capacitor manufacturing method according to the seventeenth embodiment, through the same steps as those of the eleventh embodiment, as shown in FIG. 21A, after a $SiO_2$ film 52 is made on the Si substrate 51, a Ti film 53 and a Pt film 54 as the lower electrode, a fluorite film 55 as the precursor film of SBTT, and a Pt film 56 as the upper electrode are sequentially stacked on the $SiO_2$ film 52. Then, the Pt film 56 and the fluorite film 55 are patterned into the form of the dielectric capacitor as large as 2 μm×2 μm, for example, by RIE, for example. Next made on the entire surface is a $Y_2O_3$ film 69 as a protective coat by MOCVD, for example, so as to cover side walls of the Pt film 56 and the fluorite film 55 patterned into the form of the dielectric capacitor. The thickness of the $Y_2O_3$ film 69 is 30 nm, for example.

The fluorite film 55 patterned into the form of the dielectric capacitor, with its side walls being coated by the $Y_2O_3$ film 69, is next annealed in an oxygen atmosphere held in a normal pressure, for example, at 750° C., for example, for one hour, such that the fluorite phase in the fluorite film be changed into a crystal phase of a perovskite type crystalline structure to crystallize the fluorite film 55. As a result, as shown in FIG. 21B, the SBTT film 57 is obtained between the Pt film 54 and Pt film 56. The SBTT film 57 is made up of a ferroelectric material of a Bi-layered structured perovskite type crystalline structure having the composition formula $Sr_xBi_yTa_{2.0}Ti_zO_w$ (where $1.7 \leq x \leq 2.5$, $0.6 \leq y \leq 1.2$, $0 < z \leq 1.0$, $w = 9 \pm d$, $0 \leq d \leq 1.0$; preferably $2.0 \leq x \leq 2.4$, $0.7 \leq y \leq 1.0$, $0 < z \leq 1.0$, $w = 9 \pm d$, $0 \leq d \leq 1.0$; and more preferably $2.0 \leq x \leq 2.4$, $0.7 \leq y \leq 1.0$, $0.1 \leq z \leq 1.0$, $w = 9 \pm d$, $0 \leq d \leq 1.0$).

Figure 21C:
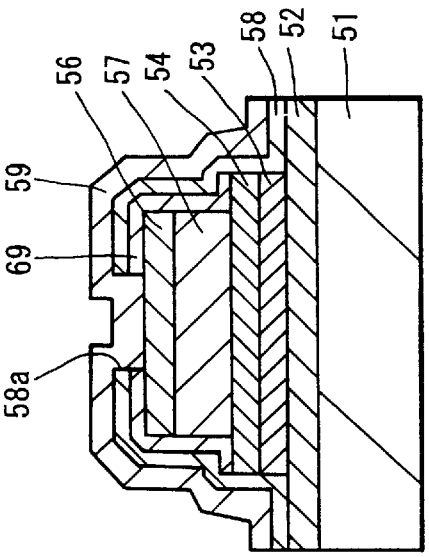
Figure 21B:
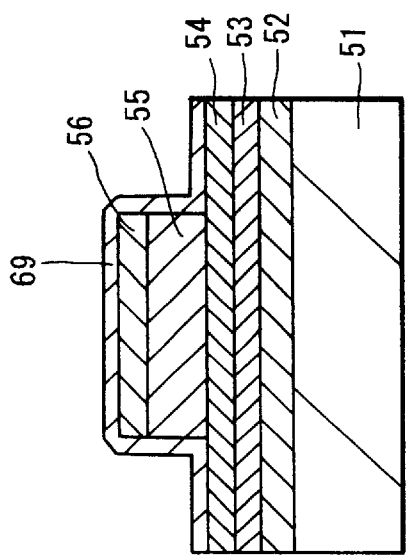

Next as shown in FIG. 21C, the $Y_2O_3$ film 69, Pt film 54 and Ti film 53 are patterned into a predetermined shape by etching to leave the $Y_2O_3$ film 69 on side walls of the Pt film 56 and the SBTT film 57.

Figure 21D:
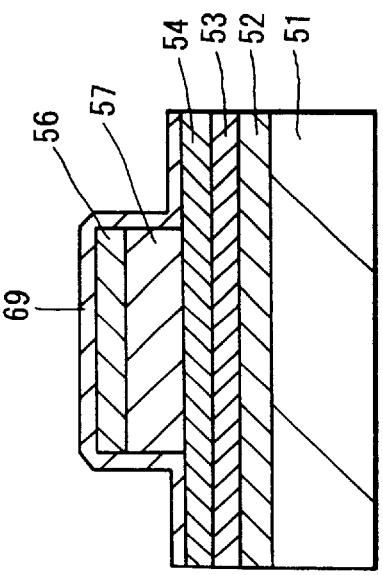

Next as shown in FIG. 21D, an inter-layer insulating film 58 is made on the entire surface. After that, the inter-layer insulating film 58 and the $Y_2O_3$ film 69 are selectively removed by etching to make a contact hole 58a in a predetermined location above the Pt film 56. Then, an Al alloy film is made on the entire surface by sputtering, for example, and it is patterned into a predetermined shape by etching to form a lead-out electrode 59.

Through these steps, the intended dielectric capacitor using the SBTT film as its dielectric film is completed.

Using a dielectric capacitor actually made by the above-explained method, the leak current was measured by applying a voltage across the Si substrate 51 and the lead-out electrode 59. The measured value was 1×1×10⁻⁸ A/cm² when the applied electric field was 300 kV/cm. This is a favorable value for a dielectric capacitor using a SBTT film. In contrast, as to a dielectric capacitor in which the SBTT film 57 was made by annealing the fluorite film 55 without making the $Y_2O_3$ film 69, the leak current was 1×10⁻⁶ A/cm² when the applied electric field was 300 kV/cm. These values show that the leak current characteristics of the dielectric capacitor using the SBTT film are remarkably improved by employing the dielectric capacitor manufacturing method according to the invention.

As explained above, according to the seventeenth embodiment, the same advantages as those of the third embodiment are obtained when the dielectric capacitor using a SBTT film as its dielectric film is manufactured. That is, when the dielectric capacitor is manufactured, using the SBTT film as its dielectric film, the lower electrode made up of the Ti film 53 and the Pt film 54, the fluorite film 55 as the precursor film of SBTT and the Pt film 56 as the upper electrode are formed sequentially, and the Pt film 56 and the fluorite film 55 are patterned into the form of the dielectric capacitor by etching. Thereafter, the $Y_2O_3$ film 69 is made as a protective coat to cover side walls of the Pt film 56 and the fluorite film 55. Therefore, it is prevented that a certain metal deposits on side walls of the dielectric capacitor or a conductive oxide is produced, upon etching of the lower electrode made up of the Ti film 53 and the Pt film 54 or during subsequent annealing, and the dielectric capacitor is therefore prevented from deterioration in leak current characteristics. Thus the invention has the advantage in remarkably improving leak current characteristics as compared with the conventional technique.

Moreover, according to the seventeenth embodiment, after the fluorite film 55 as the precursor film of SBTT is patterned into the form of the dielectric capacitor, it is annealed and crystallized to obtain the SBTT film 57. Therefore, it is also advantageous in improving the residual polarization value 2Pr and the coercive force 2Ec similarly to the eleventh embodiment.

Next explained are the eighteenth and nineteenth embodiments of the invention which apply a manufacturing method of a semiconductor storage device according to the invention to fabrication of ferroelectric nonvolatile memory having a dielectric capacitor using a SBT film as its dielectric film. In all of the drawings illustrating the eighteenth and nineteenth embodiments, identical or equivalent elements or components are labeled with common reference numerals.

FIGS. 22 through 25 are cross-sectional views for explaining a manufacturing method of ferroelectric nonvolatile memory according to the eighteenth embodiment of the invention. The ferroelectric nonvolatile memory uses a stack type dielectric capacitor as the dielectric capacitor forming a memory cell.

Figure 22:
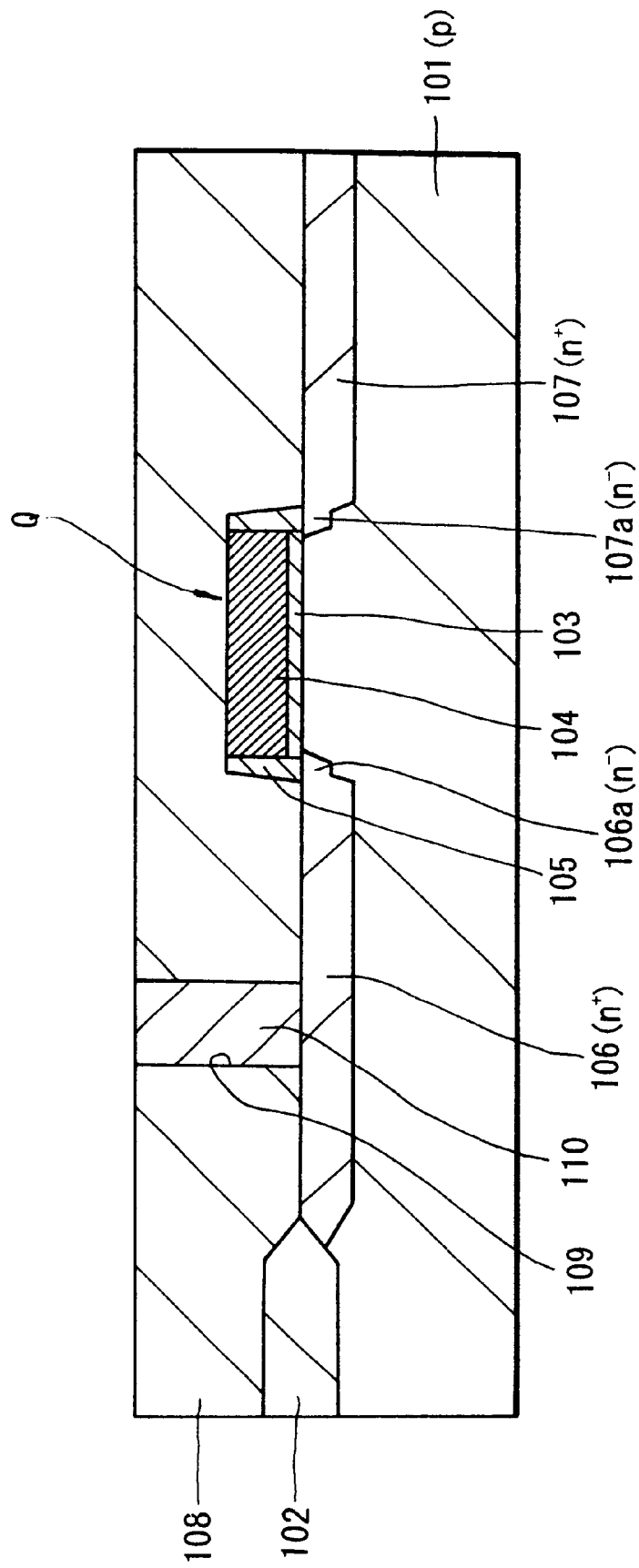
FIG. 22 is a cross-sectional view for explaining a manufacturing method of ferroelectric nonvolatile memory according to the eighteenth embodiment of the invention.

In the manufacturing method of ferroelectric nonvolatile memory according to the eighteenth embodiment, as shown in FIG. 22, first made in selective locations on a p-type Si substrate 101 is a field insulating film 102 like a silicon dioxide ($SiO_2$) film by LOCOS, for example, to separate devices. In this process, a p-type impurity such as boron (B), previously introduced into device separating regions of the p-type Si substrate 101 by ion implantation, or the like, diffuses and forms a p⁺-type channel stopper (not shown) under the field insulating film 102. Thereafter, a gate insulating film 103 made of a predetermined thickness of $SiO_2$ is formed by thermal oxidization, for example, on the surface of an active region encircled by the field insulating film 102.

After that, a polycrystalline Si film is made on the entire surface by chemical vapor deposition (CVD), for example. For the purpose of reducing the resistance value, an n-type impurity such as phosphorus (P) is next doped into the polycrystalline Si film to a high concentration. Then, the polycrystalline Si film is patterned to form a gate electrode 104 of polycrystalline Si on the gate insulating film 103.

Next using the gate electrode 104 as a mask, an n-type impurity such as P, for example, is doped into the active region surrounded by the field insulating film 102 by ion implantation, for example. As a result, an n-type region is made in the active region in self alignment with the gate electrode 104.

Subsequently, after a $SiO_2$ film of a predetermined thickness is made on the entire surface by CVD, for example, it is etched back vertically of the surface of the p-type Si substrate 101 by reactive ion etching (RIE). As a result, side wall spacers 105 are formed on side walls of the gate electrode 104.

Next using the side wall spacers 105 and the gate electrode 104 as a mask, an n-type impurity such as arsenic (As) is doped into the active region surrounded by he field insulating film 102 by ion implantation. If necessary, it is annealed thereafter for electrically activating the injected impurity. As a result, an $n^+$-type source region and an $n^+$-type drain region 107 are formed in self alignment with the side wall spacers 105. These source region 106 and drain region 107 have n-type low impurity concentration portions 106a and 107a below the side wall spacers 105. These low impurity concentration portions 106a and 107a are $n^-$-type regions made in self alignment with the gate electrode 104, respectively. Through the steps heretofore, an n-channel MOS transistor Q is formed.

After that, an inter-layer insulating film 108, such as boron phosphorus silicate glass (BPSG) of a predetermined thickness is made on the entire surface by CVD, for example. Then, it is annealed at a predetermined condition to smooth the surface by reflow of the inter-layer insulating film 108. Thereafter, a contact hole 109 is made in a predetermined location of the inter-layer insulating film 108 above the source region 106 by lithography or RIE, for example. Then, a polycrystalline Si film is made on the entire surface by CVD, for example, and it is etched back vertically of the p-type Si substrate 101 by RIE, for example, until exposing the surface of the inter-layer insulating film 108. As a result, a polycrystalline Si plug 110 is made to plug the contact hole 109.

Figure 23:
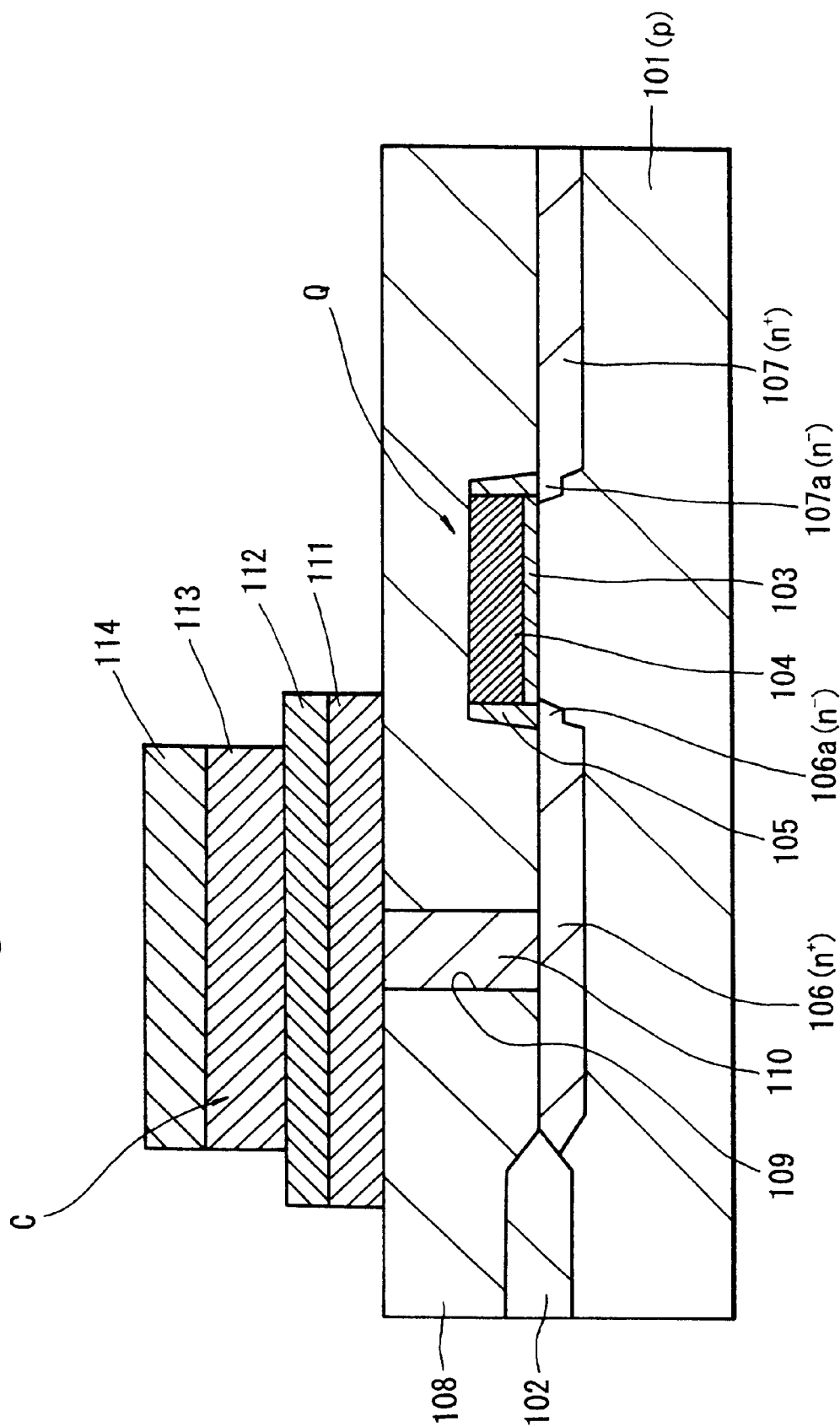
FIG. 23 is a cross-sectional view for explaining a manufacturing method of ferroelectric nonvolatile memory according to the eighteenth embodiment of the invention.

Next, through the same steps as those of the first embodiment, sequentially stacked on the inter-layer insulating film 108 are an $IrO_2$ film 111 and an Ir film 112, which make up the lower electrode, an amorphous film 113 as a precursor film of SBT, and a Pt film 114 as the upper electrode, as shown in FIG. 23. After that, the Pt film 114 and the amorphous film 113 are patterned into the form of a dielectric capacitor C as large as 2 $\mu m \times 2$ $\mu m$, for example, by RIE, for example. Then, the Ir film 112 and the $IrO_2$ film 111 are patterned into a predetermined shape so as to extend over the polycrystalline Si plug 110 and its surrounding zone of the inter-layer insulating film 108.

Figure 24:
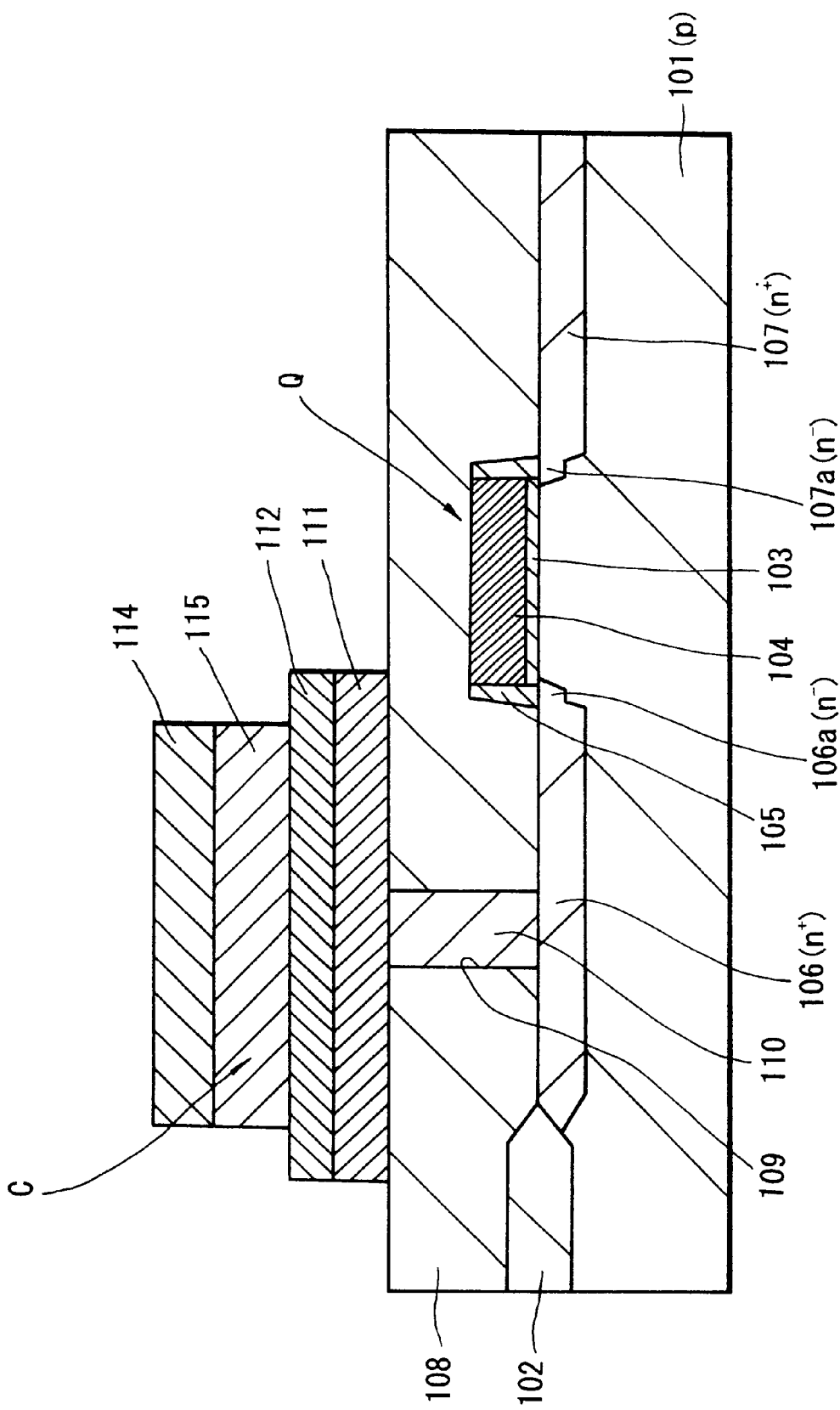
FIG. 24 is a cross-sectional view for explaining a manufacturing method of ferroelectric nonvolatile memory according to the eighteenth embodiment of the invention.

The amorphous film 113 patterned into the form of the dielectric capacitor C is next annealed in an oxygen atmosphere held in a normal pressure at 750° C., for example, for one hour to change amorphous phase in the amorphous film 113 into a crystal phase of a Bi-layered structured perovskite type crystalline structure and crystallize the amorphous film 113. As a result, as shown in FIG. 24, a SBT film 115 is obtained between the Ir film 112 and the Pt film 114. The SBT film 115 is made up of a Bi-layered structured perovskite type crystalline structure having the composition formula $Bi_xSr_y(Ta,Nb)_{2.0}O_z$ (where $2.0 \leq x \leq 2.6$, $0.6 \leq y \leq 1.2$, $z=9 \pm d$, $0 \leq d \leq 1.0$).

Figure 25:
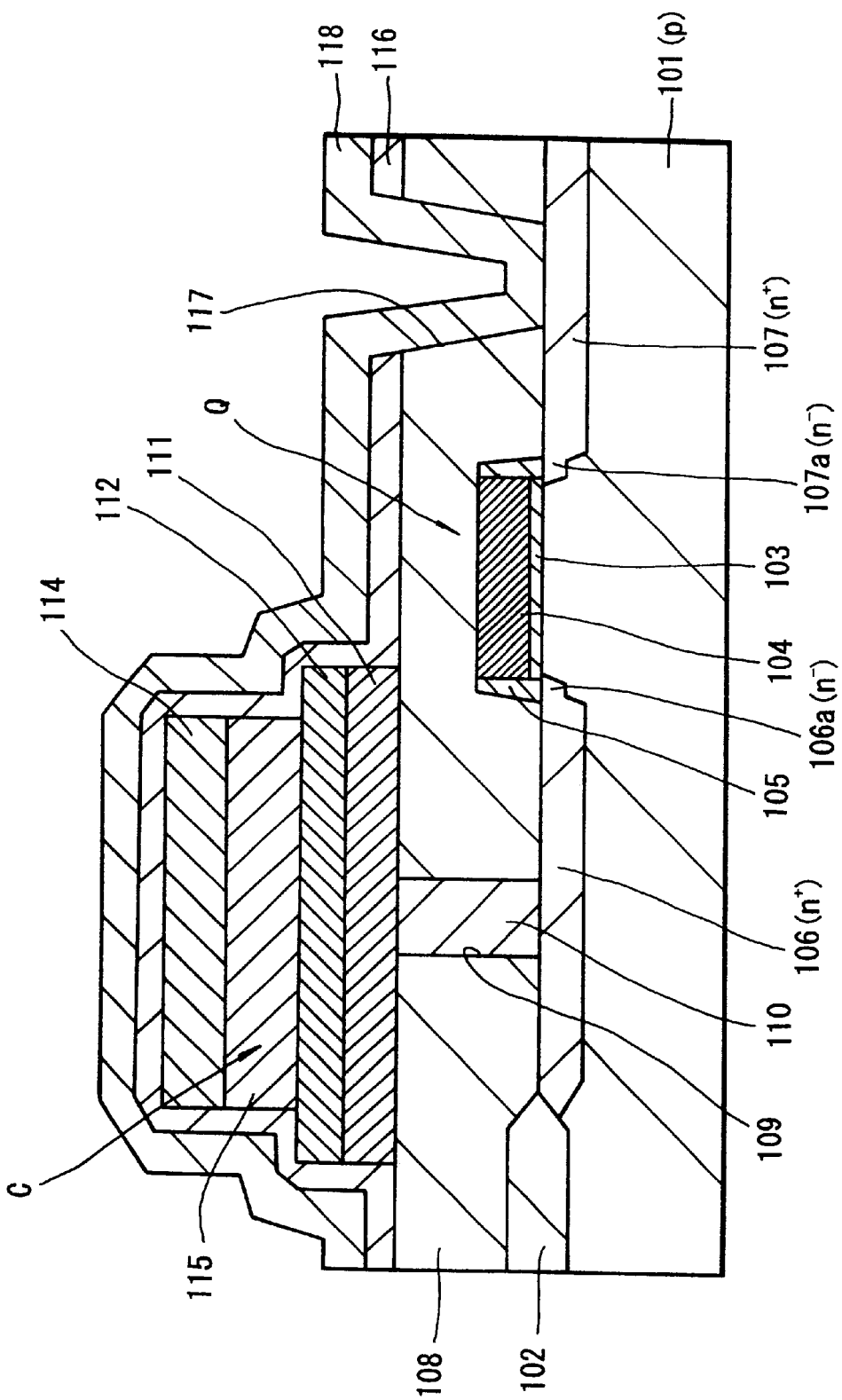
FIG. 25 is a cross-sectional view for explaining a manufacturing method of ferroelectric nonvolatile memory according to the eighteenth embodiment of the invention.

Next as shown in FIG. 25, an inter-layer insulating film 116 is made on the entire surface. Then, the inter-layer insulating films 116 and 108 are selectively removed by etching to make a contact hole 117 in a predetermined portion above the drain region 107. Subsequently, after an Al alloy film is made on the entire surface by sputtering, for example, it is patterned into a predetermined shape by etching to make a wiring electrode 118.

Through these steps, intended ferroelectric nonvolatile memory is completed.

According to the eighteenth embodiment, since the dielectric capacitor manufacturing method according to the first embodiment is used for making the dielectric capacitor using the SBT film as its dielectric film, the residual polarization value 2Pr of the dielectric capacitor C can be improved remarkably. Therefore, even when the area of the dielectric capacitor C is reduced as small as 10 $\mu m^2$ or less, a dielectric capacitor having good characteristics can be realized. Accordingly, high-integrated ferroelectric nonvolatile memory can be realized.

FIGS. 26 through 29 are cross-sectional views for explaining a manufacturing method of ferroelectric nonvolatile memory according to the nineteenth embodiment of the invention. The ferroelectric nonvolatile memory uses a stack type dielectric capacitor as the dielectric capacitor forming a memory cell.

Figure 26:
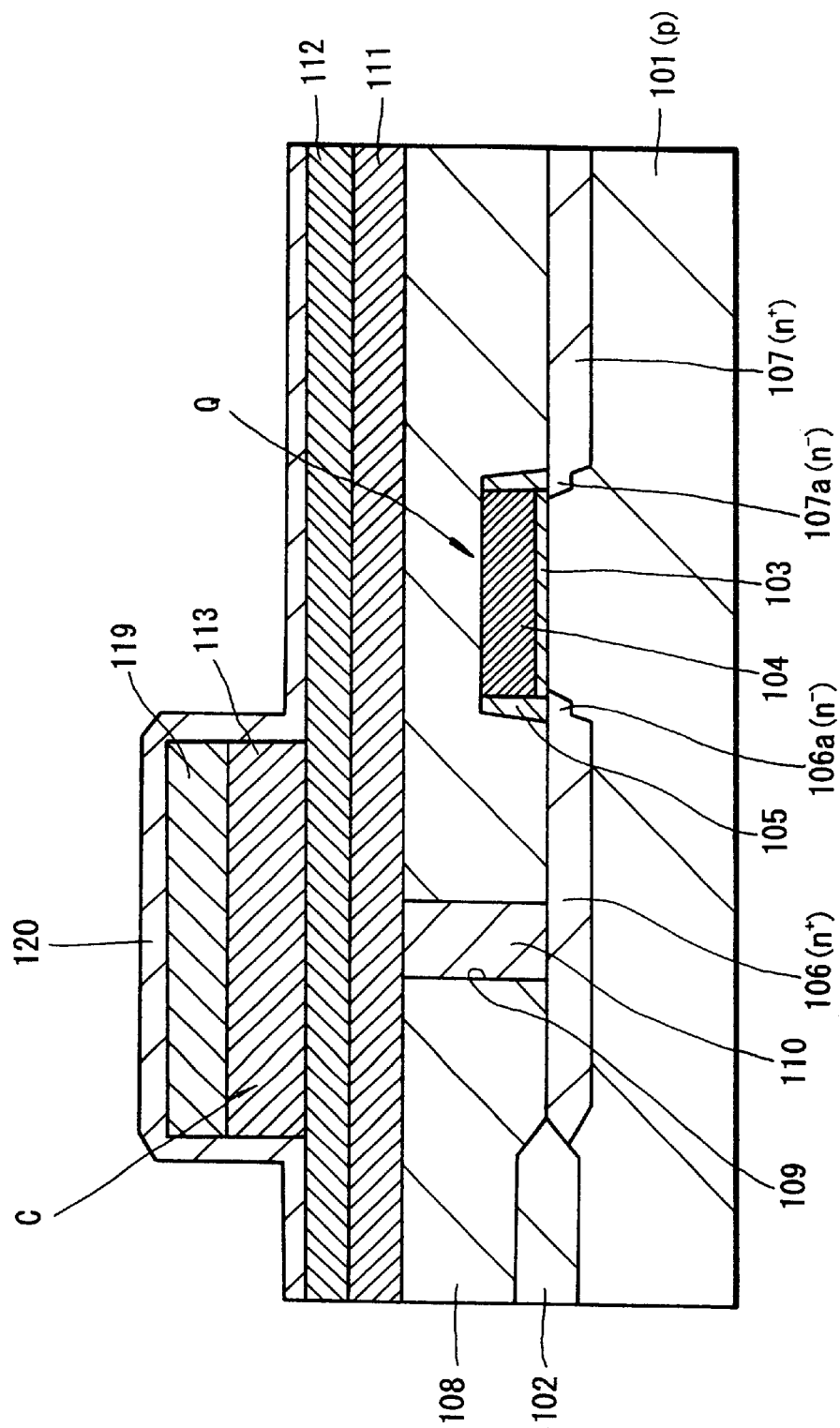
FIG. 26 is a cross-sectional view for explaining a manufacturing method of ferroelectric nonvolatile memory according to the nineteenth embodiment of the invention.

In the manufacturing method of ferroelectric nonvolatile memory according to the nineteenth embodiment, the structure is made up to the polycrystalline Si plug 110 through the same steps as those of the eighteenth embodiment. Thereafter, through the same steps as those of the third embodiment, sequentially made on the inter-layer insulating film 108 are the $IrO_2$ film 111 and the Ir film 112 both making up the lower electrode, the amorphous film 113 as the precursor film of SBT, and a Ru film 119 as the upper electrode as shown in FIG. 26. Then, the Ru film 119 and the amorphous film 113 are patterned into the form of a dielectric capacitor C as large as 2 $\mu m \times 2$ $\mu m$, for example, by RIE, for example. Then, a $Ta_2O_5$ film 120 as a protective coat is made on the entire surface by MOCVD, for example, so as to cover side walls of the Ru film 119 and the amorphous film 113. The thickness of the $Ta_2O_5$ film 120 is 30 nm, for example.

Figure 27:
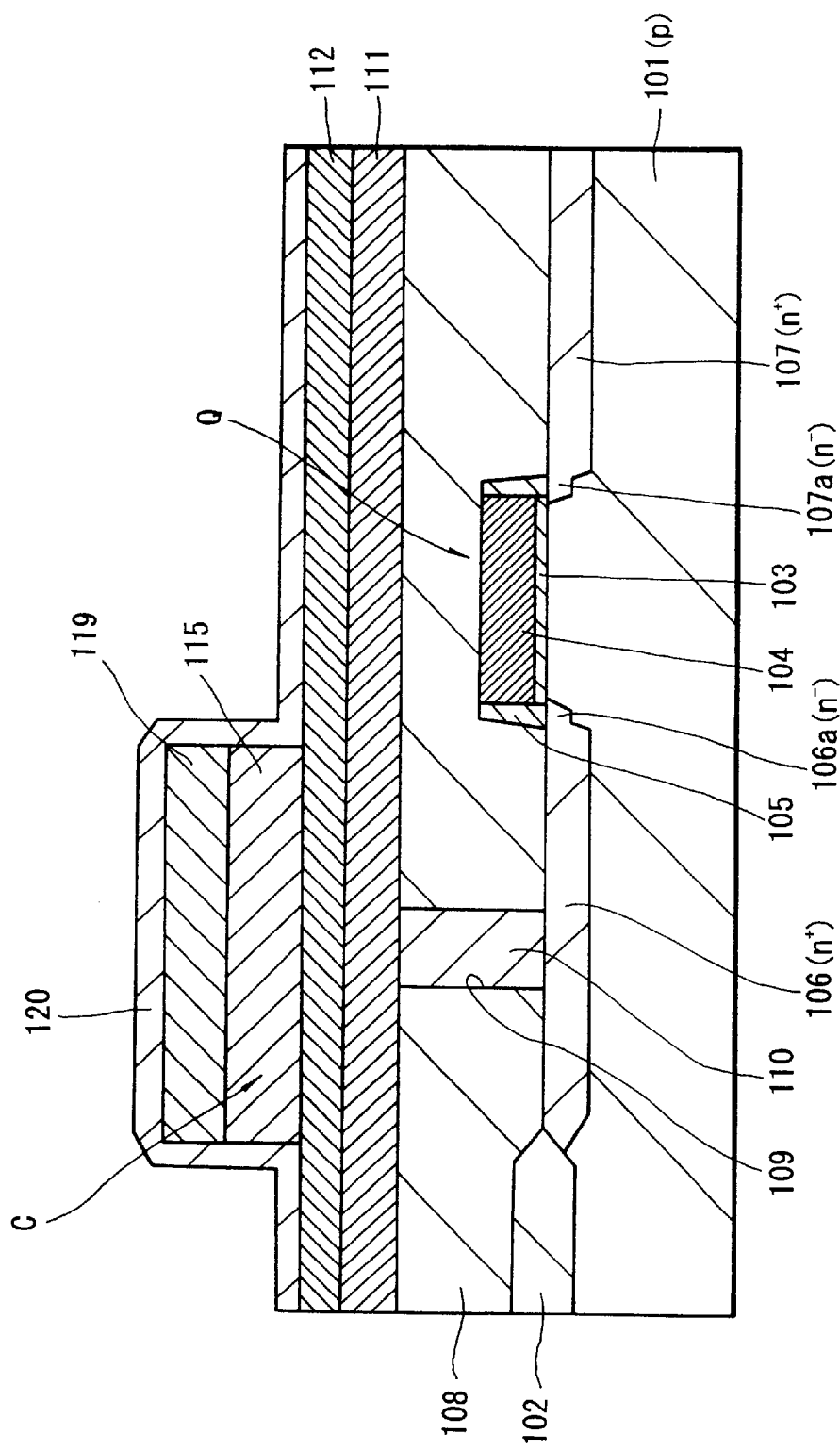
FIG. 27 is a cross-sectional view for explaining a manufacturing method of ferroelectric nonvolatile memory according to the nineteenth embodiment of the invention.

The amorphous film 113 patterned into the form of the dielectric capacitor C, with its side walls being covered by the $Ta_2O_5$ film 120, is next annealed in an oxygen atmosphere held in a normal pressure at 750° C., for example, for one hour to change amorphous phase in the amorphous film 113 into a crystal phase of a perovskite type crystalline structure and crystallize the amorphous film 113. As a result, as shown in FIG. 27, the SBT film 115 is obtained between the Ir film 112 and the Ru film 119. The SBT film 115 is made up of a Bi-layered structured perovskite type crystalline structure having the composition formula $Bi_xSr_y(Ta,Nb)_{2.0}O_z$ (where $2.0 \leq x \leq 2.6$, $0.6 \leq y \leq 1.2$, $z=9 \pm d$, $0 \leq d \leq 1.0$).

Figure 28:
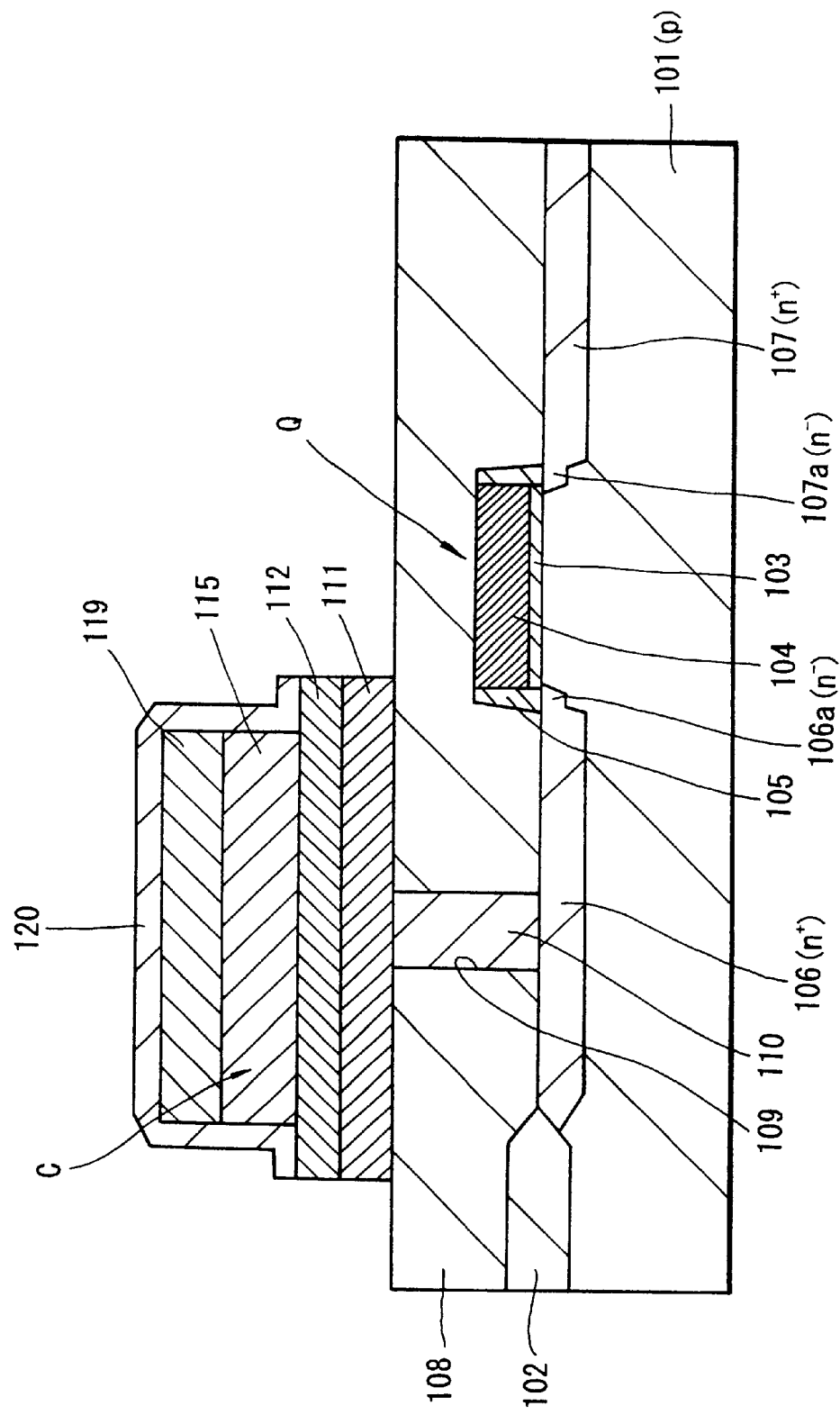
FIG. 28 is a cross-sectional view for explaining a manufacturing method of ferroelectric nonvolatile memory according to the nineteenth embodiment of the invention.

Next as shown in FIG. 28, the $Ta_2O_5$ film 120, Ir film 112 and $IrO_2$ film 111 are patterned into a predetermined shape by etching such that the $Ta_2O_5$ film 120 remain on side walls of the Ru film 119 and the SBT film 115, and the Ir film 112 and the $IrO_2$ film 111 extend over the polycrystalline Si plug 110 and its surrounding zone of the inter-layer insulating film 108.

After that, as shown in FIG. 29, the inter-layer insulating film 116 is made on the entire surface. Then, the inter-layer insulating films 116 and 108 are selectively removed by etching to make a contact hole 117 in a predetermined portion above the drain region 107. Subsequently, after an Al alloy film is made on the entire surface by sputtering, for example, it is patterned into a predetermined shape by etching to make a wiring electrode 118.

Through these steps, intended ferroelectric nonvolatile memory is completed.

According to the eighteenth embodiment, since the dielectric capacitor manufacturing method according to the third embodiment is used for making the dielectric capacitor using the SBT film as its dielectric film, the residual polarization value 2Pr and the lead current characteristics of the dielectric capacitor C can be improved remarkably. Therefore, even when the area of the dielectric capacitor C is reduced as small as 10 $\mu m^2$ or less, a dielectric capacitor with good characteristics can be realized, and he reliability is improved. Accordingly, high-integrated ferroelectric nonvolatile memory can be realized.

Although the invention has been explained by way of specific embodiments, the invention is not limited to these embodiments, but involves various changes and modifications based on the technical concept of the invention.

For example, materials, numerical values, structures, source materials and processes raised in the explanation of the first to nineteenth embodiments are not but examples, and other materials, numerical values, structures, source materials and processes may be used. For example, in the above-explained embodiments, any appropriate materials other than those suggested above may be used as the conductive film forming the lower electrode of the dielectric capacitor and the conductive film forming the upper electrode.

In the second and fourth embodiments, the fluorite film 9 as the protective coat may be made by annealing the amorphous film as the precursor film of SBT in an oxygen atmosphere held in a normal pressure, for example, at 600° C., for example, for 30 minutes.

In the third, fourth and nineteenth embodiments, the $Ta_2O_5$ film 12 or 120 may be replaced by a $HfO_2$ film, for example. In the sixth eighth and tenth embodiments, the $Y_2O_3$ film 29, 39 or 50 as the protective coat may be replaced by a $CeO_2$ film, for example. In the seventeenth embodiment, the $Y_2O_3$ film 69 as the protective coat may be replaced by a $CeO_2$ film, for example.

In the twelfth, fourteenth through sixteenth embodiments, the amorphous film 60 or 66 as the precursor film of SBTT is made by MOCVD. However, the amorphous layer 60 or 66 may be made by sol-gel spin coating, for example. When the amorphous film 60 is made by sol-gel spin coating, after a source material solution is spin-coated on the substrate, the solvent is dried and evaporated. Thereafter, it is baked at 350° C. through 600° C., and next annealed in an oxygen atmosphere, for example, at 600° C. through 700° C. for 3 to 30 minutes to change the phase of the amorphous film 60 and obtain the fluorite film 55. After that, the upper electrode is made on the fluorite film 55, and the upper electrode, fluorite film and lower electrode are patterned into a predetermined form of the capacitor. Thereafter, it is again annealed in an oxygen atmosphere, for example, at 650° C. through 800° C. to crystallize the fluorite film 55 and obtain the SBTT film 57.

In the seventeenth embodiment, the capacitor structure is made through the same steps as those of the eleventh embodiment. However, the capacitor structure may be made through the same steps as used in one of the twelfth to sixteenth embodiments.

In the eighteenth embodiment, the dielectric capacitor manufacturing method according to the first embodiment is used for making the dielectric capacitor C using the SBT film as its dielectric film. However, the dielectric capacitor manufacturing method according to the second embodiment may be used there. Also usable as the dielectric film of the dielectric capacitor C is a PZT film, PNZT film or SBTT film. When a PZT film is used as the dielectric film of the dielectric capacitor C, the dielectric capacitor manufacturing method according to the fifth embodiment may be used for making the dielectric capacitor C. When a PNZT film is used, the dielectric capacitor manufacturing method according to the seventh embodiment may be used to make the dielectric capacitor C. If a SBTT film is used, then any of the dielectric capacitor manufacturing methods according to the eleventh through sixteenth embodiments may be used to make the dielectric capacitor C. The manufacturing method of ferroelectric nonvolatile memory according to the eighteenth embodiment may be used for manufacturing DRAM by using a BST film as the dielectric film of the dielectric capacitor. In this case, the dielectric capacitor manufacturing method according to the ninth embodiment may be used to make the dielectric capacitor.

Similarly, in the nineteenth embodiment, the dielectric capacitor manufacturing method according to the third embodiment is used to make the dielectric capacitor using the SBT film as its dielectric film. Instead, however, the dielectric capacitor manufacturing method according to the fourth embodiment may be used. Additionally, a PZT film, PNZT film or SBTT film may be used as the dielectric film of the dielectric capacitor. When a PZT film is used as the dielectric film of the dielectric capacitor, the dielectric capacitor manufacturing method according to the sixth embodiment may be used to make the dielectric capacitor. When a PNZT film is used, the dielectric capacitor manufacturing method according to the eighth embodiment may be used to make the dielectric capacitor. When a SBTT film is used, the dielectric capacitor manufacturing method according to the seventeenth embodiment may be used to make the dielectric capacitor. The manufacturing method of ferroelectric nonvolatile memory according to the nineteenth embodiment is applicable to fabrication of DRAM by using a BST film as the dielectric film of the dielectric capacitor. In this case, the dielectric capacitor manufacturing method according to the tenth embodiment may be used to make the dielectric capacitor.

The invention is applicable to fabrication of a semiconductor device or an electronic device including a dielectric capacitor, in addition to fabrication of an independent dielectric capacitor and fabrication of a semiconductor storage device such as ferroelectric nonvolatile memory or DRAM including a dielectric capacitor.

As described above, according to the first and third aspects of the invention, since the dielectric film is obtained by sequentially making the lower electrode, precursor film containing as its major component an amorphous phase of a fluorite phase of component elements of a dielectric material, and the upper electrode, then patterning at least the upper electrode and the precursor film into the form of the dielectric capacitor, and next annealing the precursor film patterned into the form of the dielectric capacitor, characteristics of the dielectric capacitor can be improved remarkably. As a result, even when the area of the dielectric capacitor is reduced, a dielectric capacitor having good characteristics can be realized.

According to the second and fourth embodiment, by sequentially making the lower electrode, precursor film containing as its major component an amorphous phase or a fluorite phase of component elements of a dielectric material, and upper electrode, then patterning the upper electrode and the precursor electrode into the form of the dielectric capacitor by etching, and next making a protective film to cover side walls of the upper electrode and the precursor film, leak current characteristics of the dielectric capacitor can be improved remarkably. Further, similarly to the first and third embodiment, by annealing the precursor film patterned into the form of the dielectric capacitor to obtain the dielectric film, characteristics of the dielectric capacitor can be improved remarkably. As a result, even when the area of the dielectric capacitor is reduced, a dielectric capacitor with good characteristics can be realized, and the reliability can be improved.

What is claimed is:

1. A method for manufacturing a dielectric capacitor using a dielectric film made of a dielectric material with a perovskite type crystalline structure, comprising the steps of:

making a lower electrode;

making on the lower electrode a precursor film having as its major component an amorphous phase made up of Bi, Sr, Ta, Nb, Ti and O (where the atomic composition ratio thereof is in the range of $0.6 \leq 2Sr/(Ta+Nb) \leq 1.2$, $1.7 \leq 2Bi/(Ta+Nb) \leq 2.5$, $0 < 2Ti/(Ta+Nb) \leq 1.0$), where making the precursor film comprises depositing an amorphous film having the amorphous phase, and where depositing the amorphous film comprises heating the lower electrode to a temperature between 400° C. and 650° C., preparing a source material gas by mixing an organic metal source material gas first with an argon carrier gas and then with an oxygen gas, and introducing the source material gas to the lower electrode, where the organic metal source material gas contains predetermined ratios of at least one organic metal source material selected from a first group consisting of $Bi(C_6H_5)_3$, $Bi(o-C_7H_7)_3$, $Bi(O-C_2H_5)_3$, $Bi(O-iC_3H_7)_3$, $Bi(O-tC_4H_9)_3$ and $Bi(O-tC_5H_{11})_3$, at least one organic metal source material selected from a second group consisting of $Sr(THD)_2$, $Sr(THD)_2$ tetraglyme and $Sr(Me_5C_5)_2 \cdot 2THF$, at least one organic metal source material selected from a third group consisting of $Ti(i-OC_3H_7)_4$, $TiO(THD)_2$ and $Ti(THD)_2(i-OC_3H_7)_2$, and at least one organic metal source material selected from a fourth group consisting of $Ta(i-OC_3H_7)_5$, $Ta(i-OC_3H_7)_4THD$, $Nb(i-OC_3H_7)_5$ and $Nb(i-OC_3H_7)_4THD$;

annealing the amorphous film to change the amorphous phase to a fluorite phase so as to create a fluorite film as the precursor film;

making an upper electrode on the precursor film;

etching at least the upper electrode and the precursor film to form the dielectric capacitor; and after making the upper electrode and etching, annealing the precursor film to change the fluorite phase to a crystal phase of a perovskite type crystalline structure so as to obtain the dielectric film.

2. The method for manufacturing a dielectric capacitor according to claim 1 where making the lower electrode comprises depositing an $IrO_2$ film and then an Ir film on a substrate.

3. The method for manufacturing a dielectric capacitor according to claim 1 where making the upper electrode comprises depositing an Ir film onto the precursor film.

4. The method for manufacturing a dielectric capacitor according to claim 1 where the dielectric film is expressed by the composition formula $Bi_xSr_yTa_{2.0}O_z$ (where $2.0 \leq x \leq 2.6$, $0.6 \leq y \leq 1.2$, $z = 9 \pm d$, $0 \leq d \leq 1.0$).

5. The method for manufacturing a dielectric capacitor according to claim 1 where the film having the amorphous phase as its major component is formed at a temperature in the range from 400° C. to 500° C.

6. The method for manufacturing a dielectric capacitor according to claim 1 where the annealing after making the upper electrode and etching is executed at a temperature in the range from 600° C. to 850° C.

7. The method for manufacturing a dielectric capacitor according to claim 1 where the precursor film is a film further having as its major component an amorphous phase made up of at least one of Pb, Zr, Ti and O (where the atomic composition ratio thereof is within the range of $0.1 \leq Zr/Pb \leq 0.6$, $0.4 \leq Ti/Pb \leq 0.9$).

8. The method for manufacturing a dielectric capacitor according to claim 1 where the precursor film is a film further having as its major component an amorphous phase made up of at least one of Pb, Zr, Ti, Nb and O (where the atomic composition ratio thereof is within the range of $0.1 \leq Zr/Pb \leq 0.6$, $0.4 \leq Ti/Pb \leq 0.9$, $0.03 \leq Nb/Pb \leq 0.30$).

9. The method for manufacturing a dielectric capacitor according to claim 1 where the precursor film is a film further having as its major component an amorphous phase made up of at least one of Ba, Sr, Ti and O (where the atomic composition ratio thereof is within the range of $0 \leq Sr/Ti \leq 1.0$, $0 \leq Ba/Ti \leq 1.0$).

10. The method for manufacturing a dielectric capacitor according to claim 1 where the precursor film patterned into the form of the dielectric capacitor is annealed in an oxidizable gas atmosphere.

11. The method for manufacturing a dielectric capacitor according to claim 10 the annealing in the oxidizable gas atmosphere is executed at a temperature in the range from 500° C. to 900° C.

12. The method for manufacturing a dielectric capacitor according to claim 1 where the precursor film patterned into the form of the dielectric capacitor is annealed in a nitrogen gas atmosphere at a temperature in the range from 500° C. to 900° C., and thereafter annealed in an oxidizable gas atmosphere at a temperature in the range from 500° C. to 900° C.

13. The method for manufacturing a dielectric capacitor according to claim 1 where the precursor film patterned into the form of the dielectric capacitor is annealed in a nitrogen gas atmosphere at a temperature in the range from 500° C. to 900° C., and thereafter annealed in an oxidizable gas atmosphere containing 0.5% of ozone at a temperature in the range from 300° C. to 600° C.

14. The method for manufacturing a dielectric capacitor according to claim 1 where the precursor film patterned into the form of the dielectric capacitor is annealed in an atmosphere held in a pressure as low as 100 Torr or less at a temperature in the range from 500° C. to 800° C., and thereafter annealed in an oxidizable gas atmosphere containing 0.5% of ozone at a temperature in the range from 300° C. to 600° C.

15. The method for manufacturing a dielectric capacitor according to claim 1 where the dielectric film has a thickness in the range from 20 nm to 200 nm.

16. A method for manufacturing a dielectric capacitor using a dielectric film made of a dielectric material with a perovskite type crystalline structure, comprising the steps of:

making a lower electrode;

making on the lower electrode a precursor film having as its major component an amorphous phase made up of Bi, Sr, Ta, Nb, Ti and O (where the atomic composition ratio thereof is in the range of $0.6 \leq 2Sr/(Ta+Nb) \leq 1.2$, $1.7 \leq 2Bi/(Ta+Nb) \leq 2.5$, $0 < 2Ti/(Ta+Nb) \leq 1.0$), where making the precursor film comprises depositing an amorphous film having the amorphous phase, and where depositing the amorphous film comprises heating the lower electrode to a temperature between 400° C. and 650° C., preparing a source material gas by mixing an organic metal source material gas first with an argon carrier gas and then with an oxygen gas, and introducing the source material gas to the lower electrode, where the organic metal source material gas contains predetermined ratios of at least one organic metal source material selected from a first group consisting of $Bi(C_6H_5)_3$, $Bi(o-C_7H_7)_3$, $Bi(O-C_2H_5)_3$, $Bi(O-iC_3H_7)_3$, $Bi(O-tC_4H_9)_3$ and $Bi(O-tC_5H_{11})_3$, at least one organic metal source material selected from a second group consisting of $Sr(THD)_2$, $Sr(THD)_2$ tetraglyme and $Sr(Me_5C_5)_2 \cdot 2THF$, at least one organic metal source material selected from a third group consisting of $Ti(i-OC_3H_7)_4$, $TiO(THD)_2$ and $Ti(THD)_2(i-OC_3H_7)_2$, and at least one organic metal source material selected from a fourth group consisting of $Ta(i-OC_3H_7)_5$, $Ta(i-OC_3H_7)_4THD$, $Nb(i-OC_3H_7)_5$ and $Nb(i-OC_3H_7)_4THD$;

annealing the amorphous film to change the amorphous phase to a fluorite phase so as to create a fluorite film as the precursor film;

making an upper electrode on the precursor film;

etching at least the upper electrode and the precursor film to form the dielectric capacitor;

making a protective coat which covers side walls of the upper electrode and the precursor film patterned into the form of the dielectric capacitor; and after making the upper electrode and etching, annealing the precursor film and having said protective coat on the side walls to change the fluorite phase to a crystal phase of a perovskite type crystalline structure so as to obtain said dielectric film.

17. The method for manufacturing a dielectric capacitor according to claim 16 here making the lower electrode comprises depositing an $IrO_2$ film and then an Ir film on a substrate.

18. The method for manufacturing a dielectric capacitor according to claim 16 where making the upper electrode comprises depositing an Ir film onto the precursor film.

19. The method for manufacturing a dielectric capacitor according to claim 18 here the dielectric film is expressed by the composition formula $Bi_xSr_yTa_{2.0}O_z$ (where $2.0 \leq x \leq 2.6$. $0.6 \leq y \leq 1.2$, $z = 9 \pm d$, $0 \leq d \leq 1.0$).

20. The method for manufacturing a dielectric capacitor according to claim 9 where the film having the amorphous phase as its major component is formed at a temperature in the range from 400° C. to 500° C.

21. The method for manufacturing a dielectric capacitor according to claim 16 where the annealing after making the upper electrode and etching is executed at a temperature in the range from 600° C. to 850° C.

22. The method for manufacturing a dielectric capacitor according to claim 16 where the precursor film is a film further having as its major component an amorphous phase made up of at least one of Pb, Zr, Ti and O (where the atomic composition ratio thereof is within the range of $0.1 \leq Zr/Pb \leq 0.6$, $0.4 \leq Ti/Pb \leq 0.9$).

23. The method for manufacturing a dielectric capacitor according to claim 16 where the precursor film is a film further having as its major component an amorphous phase made up of at least one of Pb, Zr, Ti, Nb and O (where the atomic composition ratio thereof is within the range of $0.1 \leq Zr/Pb \leq 0.6$, $0.4 \leq Ti/Pb \leq 0.9$, $0.03 \leq Nb/Pb \leq 0.30$).

24. The method for manufacturing a dielectric capacitor according to claim 16 where the precursor film is a film further having as its major component an amorphous phase made up of $Bi_xSr_yTa_{2.0}O_z$ (where the atomic composition ratio thereof is within the range of $0 \leq Sr/Ti \leq 1.0$, $0 \leq Ba/Ti \leq 1.0$).

25. The method for manufacturing a dielectric capacitor according to claim 16 where the protective coat is made of $SrTa_2O_6$, $Ta_2O_5$, $Nb_2O_5$, $ZrO_2$, $CeO_2$, $Y_2O_3$ or $HfO_2$.

26. The method for manufacturing a dielectric capacitor according to claim 16 where the precursor film patterned into the form of the dielectric capacitor is annealed in an oxidizable gas atmosphere.

27. The method for manufacturing a dielectric capacitor according to claim 26 where the annealing in the oxidizable gas atmosphere is executed at a temperature in the range from 500° C. to 900° C.

28. The method for manufacturing a dielectric capacitor according to claim 16 where the precursor film patterned into the form of the dielectric capacitor is annealed in a nitrogen gas atmosphere at a temperature in the range from 500° C. to 900° C., and thereafter annealed in an oxidizable gas atmosphere at a temperature in the range from 500° C. to 900° C.

29. The method for manufacturing a dielectric capacitor according to claim 16 where the precursor film patterned into the form of the dielectric capacitor is annealed in a nitrogen gas atmosphere at a temperature in the range from 500° C. to 900° C., and thereafter annealed in an oxidizable gas atmosphere containing 0.5% of ozone at a temperature in the range from 300° C. to 600° C.

30. The method for manufacturing a dielectric capacitor according to claim 16 where the precursor film patterned into the form of the dielectric capacitor is annealed in an atmosphere held in a pressure as low as 100 Torr or less at a temperature in the range from 500° C. to 800° C., and thereafter annealed in an oxidizable gas atmosphere containing 0.5% of ozone at a temperature in the range from 300° C. to 600° C.

* * * * *